US012721033B2

(12) United States Patent
Choi et al.

(10) Patent No.: US 12,721,033 B2
(45) Date of Patent: Aug. 25, 2026

(54) ORGANIC LIGHT-EMITTING DEVICE

(71) Applicant: LG CHEM, LTD., Seoul (KR)

(72) Inventors: Ji Young Choi, Daejeon (KR); Sang Duk Suh, Daejeon (KR); Woochul Lee, Daejeon (KR); Joo Ho Kim, Daejeon (KR); Hoon Jun Kim, Daejeon (KR); Dong Hoon Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 1031 days.

(21) Appl. No.: 17/056,634

(22) PCT Filed: Oct. 11, 2019

(86) PCT No.: PCT/KR2019/013327
§ 371 (c)(1),
(2) Date: Nov. 18, 2020

(87) PCT Pub. No.: WO2020/076108
PCT Pub. Date: Apr. 16, 2020

(65) Prior Publication Data

US 2021/0217963 A1 Jul. 15, 2021

(30) Foreign Application Priority Data

Oct. 12, 2018 (KR) ........................ 10-2018-0121874

(51) Int. Cl.
*H10K 85/60* (2023.01)
*H10K 50/11* (2023.01)

(52) U.S. Cl.
CPC ......... *H10K 85/615* (2023.02); *H10K 85/626* (2023.02); *H10K 85/631* (2023.02);
(Continued)

(58) Field of Classification Search
CPC ............... H10K 85/322; H10K 85/631; H10K 85/6574; H10K 85/615; H10K 85/626;
(Continued)

(56) References Cited

U.S. PATENT DOCUMENTS

| | | | | |
|---|---|---|---|---|
| 2002/0076576 A1* | 6/2002 | Li | ........................ | H10K 85/115 428/917 |
| 2015/0236274 A1* | 8/2015 | Hatakeyama | ........ | H10K 85/631 548/405 |

(Continued)

FOREIGN PATENT DOCUMENTS

| | | |
|---|---|---|
| CN | 103066215 A | 4/2013 |
| CN | 105612237 A | 5/2016 |

(Continued)

OTHER PUBLICATIONS

Beak et al., machine translation of WO-2015099406-A1 (2015) pp. 1-10. (Year: 2015).*

(Continued)

*Primary Examiner* — Braelyn R Watson

(74) *Attorney, Agent, or Firm* — Bryan Cave Leighton Paisner LLP

(57) ABSTRACT

The present specification provides an organic light emitting device including a first electrode, a second electrode provided to face the first electrode, and an organic material layer including a light emitting layer provided between the first electrode and the second electrode, the light emitting layer including a compound represented by Formula 1 and a compound represented by Formula 2.

(Continued)

[Formula 1]

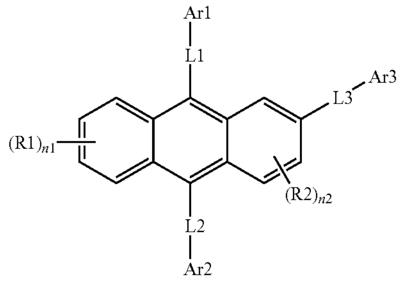

[Formula 2]

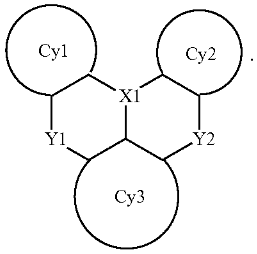

7 Claims, 2 Drawing Sheets

(52) U.S. Cl.
CPC ....... *H10K 85/6574* (2023.02); *H10K 85/658* (2023.02); *H10K 50/11* (2023.02)

(58) Field of Classification Search
CPC ...... H10K 50/11; H10K 85/658; H10K 50/12; H10K 85/657-6576; H01L 51/0052; H01L 51/0058; H01L 51/008; H01L 51/0071; H01L 51/0072; H01L 51/0073; H01L 51/0074; C07F 5/02
See application file for complete search history.

(56) References Cited

U.S. PATENT DOCUMENTS

| | | | |
|---|---|---|---|
| 2016/0218288 | A1 | 7/2016 | Huh et al. |
| 2017/0162801 | A1 | 6/2017 | Cho et al. |
| 2018/0094000 | A1 | 4/2018 | Hatakeyama et al. |
| 2018/0287068 | A1 | 10/2018 | Ha et al. |
| 2018/0301629 | A1 | 10/2018 | Hatakeyama et al. |
| 2019/0207112 | A1 | 7/2019 | Hatakeyama et al. |
| 2019/0312207 | A1 | 10/2019 | Hatakeyama et al. |
| 2020/0052212 | A1 | 2/2020 | Tasaki et al. |
| 2020/0220083 | A1 | 7/2020 | Hatakeyama et al. |

FOREIGN PATENT DOCUMENTS

| | | | | | |
|---|---|---|---|---|---|
| CN | 108137527 | A | | 6/2018 | |
| EP | 3109253 | A1 | | 12/2016 | |
| JP | 2018-043984 | A | | 3/2018 | |
| KR | 2013124775 | A | * | 11/2013 | ....... H01L 21/31058 |
| KR | 10-2017-0130434 | A | | 11/2017 | |
| WO | WO-2010071362 | A2 | * | 6/2010 | ............. H10K 50/00 |
| WO | 2015-102118 | A1 | | 7/2015 | |
| WO | WO-2015099406 | A1 | * | 7/2015 | ............. C07C 15/27 |
| WO | 2015-194839 | A1 | | 12/2015 | |
| WO | 2016-152418 | A1 | | 9/2016 | |
| WO | 2018/150832 | A1 | | 8/2018 | |
| WO | 2018-186374 | A1 | | 10/2018 | |
| WO | 2018-186404 | A1 | | 10/2018 | |
| WO | 2017188111 | A1 | | 2/2019 | |

OTHER PUBLICATIONS

Hong et al., machine translation of WO-2010071362-A2 (2010) pp. 1-14. (Year: 2010).*
English translation of KR 20130124775 A obtained from Espacenet (Year: 2013).*
English translation of WO 2010071362 A2 obtained from Global Dossier (Year: 2010).*

* cited by examiner

[Figure 1]
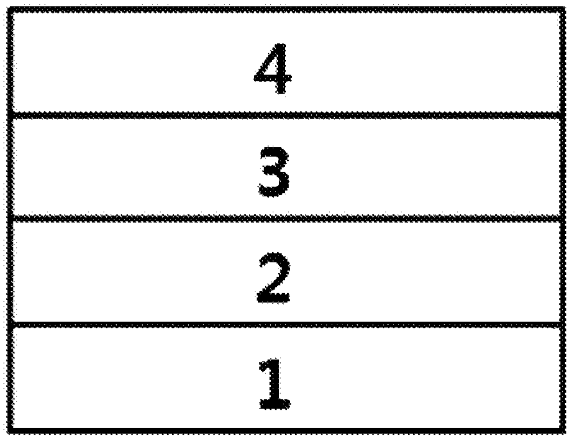

[Figure 2]
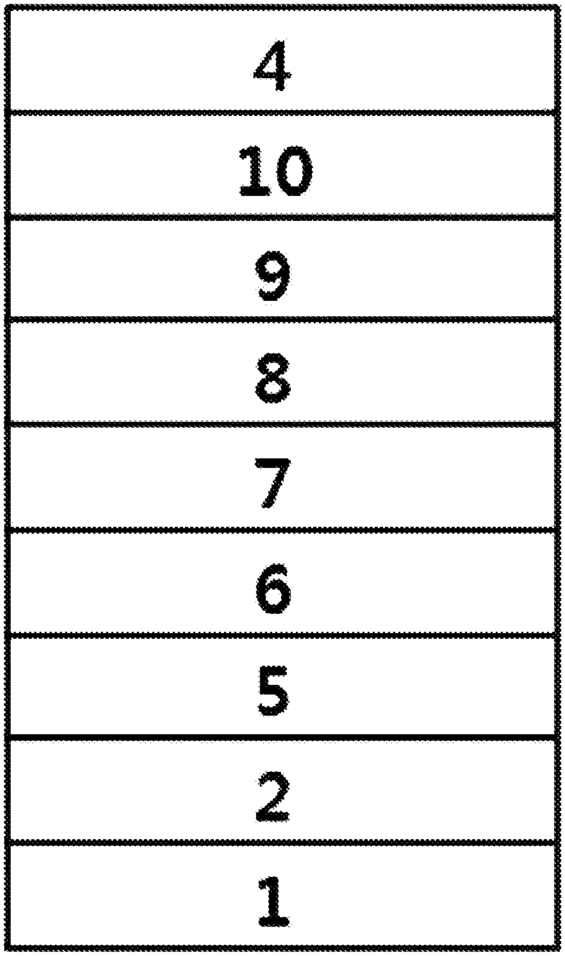

ORGANIC LIGHT-EMITTING DEVICE

TECHNICAL FIELD

The present specification relates to an organic light emitting device.

This application is a National Stage Application of International Application No. PCT/KR2019/013327 filed on Oct. 11, 2019, which claims priority to and the benefit of Korean Patent Application No. 10-2018-0121874 filed in the Korean Intellectual Property Office on Oct. 12, 2018, the entire contents of which are incorporated herein by reference.

BACKGROUND ART

An organic light emitting device has a structure in which an organic thin film is disposed between two electrodes. When a voltage is applied to an organic light emitting device having such a structure, electrons and holes injected from the two electrodes are combined with each other in the organic thin film to make a pair, and then the paired electrons and holes emit light while being annihilated. The organic thin film may be composed of a single layer or multi layers, if necessary.

The materials used in the organic light emitting device are mostly pure organic materials or complex compounds in which organic materials and metals form a complex, and may be classified into a hole injection material, a hole transport material, a light emitting material, an electron transport material, an electron injection material, and the like according to the use thereof. Here, an organic material having a p-type property, that is, an organic material, which is easily oxidized and electrochemically stable when the material is oxidized, is usually used as the hole injection material or the hole transport material. Meanwhile, an organic material having an n-type property, that is, an organic material, which is easily reduced and electrochemically stable when the material is reduced, is usually used as the electron injection material or the electron transport material. As the light emitting layer material, a material having both p-type and n-type properties, that is, a material, which is stable in both the oxidation and reduction states, is preferred, and when an exciton is produced by recombining holes and electrons in a light emitting layer, a material having high light emitting efficiency for converting the exciton into light is preferred.

In order to improve the performance, service life, or efficiency of the organic light emitting device, there is a continuous need for developing a material for an organic thin film.

DETAILED DESCRIPTION OF THE INVENTION

Technical Problem

The present specification describes an organic light emitting device having high light emitting efficiency and long service life characteristics.

Technical Solution

An exemplary embodiment of the present specification provides: an organic light emitting device including: a first electrode; a second electrode provided to face the first electrode; and an organic material layer including a light emitting layer provided between the first electrode and the second electrode, in which the light emitting layer includes a compound represented by the following Formula 1 and a compound represented by the following Formula 2.

[Formula 1]

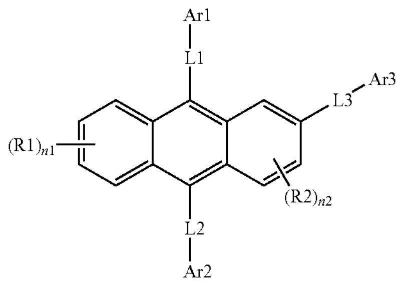

In Formula 1,

Ar1 and Ar2 are the same as or different from each other, and are each independently a substituted or unsubstituted phenyl group; or a substituted or unsubstituted biphenyl group, Ar3 is a substituted or unsubstituted aryl group; a substituted or unsubstituted dibenzofuranyl group; or a substituted or unsubstituted dibenzothiophenyl group, L1 to L3 are the same as or different from each other, and are each independently a direct bond; or a substituted or unsubstituted arylene group, R1 and R2 are the same as or different from each other, and are each independently hydrogen; deuterium; a nitrile group; a halogen group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted amine group; a substituted or unsubstituted aryl group; or a substituted or unsubstituted heterocyclic group, n1 is an integer from 0 to 4, and when n1 is 2 or higher, two or more R1's are the same as or different from each other, n2 is an integer from 0 to 3, and when n2 is 2 or higher, two or more R2's are the same as or different from each other,

[Formula 2]

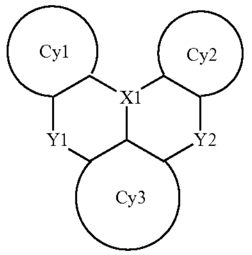

in Formula 2,

X1 is B or P (=O),

Y1 is O, S, or NRa, and Y2 is O, S, or NRb,

Cy1 to Cy3 are the same as or different from each other, and are each independently a substituted or unsubstituted aromatic hydrocarbon ring; or a substituted or unsubstituted aromatic hetero ring, and Cy1 and Cy2 may be bonded to each other to form a substituted or unsubstituted ring, Ra is a substituted or unsubstituted alkyl group; a substituted or unsubstituted aryl group; or a substituted or unsubstituted heterocyclic group, or is bonded to Cy1 or Cy3 to form a substituted or unsubstituted ring, and Rb is a substituted or unsubstituted alkyl group; a substituted or unsubstituted aryl group; or a substituted or unsubstituted heterocyclic group, or is bonded to Cy2 or Cy3 to form a substituted or unsubstituted ring.

Advantageous Effects

According to the organic light emitting device of the present invention, it is possible to obtain an organic light emitting device having a low driving voltage, high light emitting efficiency, and a long service life by simultaneously including a compound represented by Formula 1 and a compound represented by Formula 2 in a light emitting layer.

BRIEF DESCRIPTION OF DRAWINGS

FIG. 1 illustrates an example of an organic light emitting device composed of a substrate 1, a positive electrode 2, a light emitting layer 3, and a negative electrode 4.

FIG. 2 illustrates an example of an organic light emitting device composed of a substrate 1, a positive electrode 2, a hole injection layer 5, a first hole transport layer 6, a second hole transport layer 7, a light emitting layer 8, an electron transport layer 9, an electron injection layer 10, and a negative electrode 4.

EXPLANATION OF REFERENCE NUMERALS AND SYMBOLS

1: Substrate
2: Positive electrode
3: Light emitting layer
4: Negative electrode
5: Hole injection layer
6: First hole transport layer
7: Second hole transport layer
8: Light emitting layer
9: Electron transport layer
10: Electron injection layer

BEST MODE

Hereinafter, the present specification will be described in more detail.

An organic light emitting device of the present invention includes; a first electrode; a second electrode provided to face the first electrode; and an organic material layer including a light emitting layer provided between the first electrode and the second electrode, in which the light emitting layer includes a compound represented by the following Formula 1 and a compound represented by the following Formula 2.

By including the compound represented by the following Formula 1 and the compound represented by the following Formula 2 in the light emitting layer of the organic light emitting device as described above, the organic light emitting device has a low driving voltage and high light emitting efficiency, and has an effect in that the service life of the device is improved.

[Formula 1]

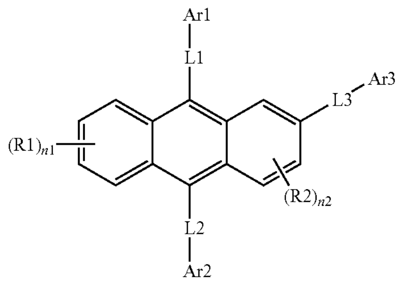

In Formula 1,

Ar1 and Ar2 are the same as or different from each other, and are each independently a substituted or unsubstituted phenyl group; or a substituted or unsubstituted biphenyl group, Ar3 is a substituted or unsubstituted aryl group; a substituted or unsubstituted dibenzofuranyl group; or a substituted or unsubstituted dibenzothiophenyl group, L1 to L3 are the same as or different from each other, and are each independently a direct bond; or a substituted or unsubstituted arylene group, R1 and R2 are the same as or different from each other, and are each independently hydrogen; deuterium; a nitrile group; a halogen group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted amine group; a substituted or unsubstituted aryl group; or a substituted or unsubstituted heterocyclic group, and n1 is an integer form 0 to 4, and when n1 is 2 or higher, two or more R1's are the same as or different from each other, n2 is an integer from 0 to 3, and when n2 is 2 or higher, two or more R2's are the same as or different from each other,

[Formula 2]

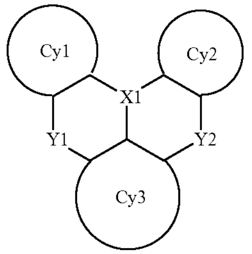

in Formula 2,

X1 is B or P (=O),

Y1 is O, S, or NRa, and Y2 is O, S, or NRb,

Cy1 to Cy3 are the same as or different from each other, and are each independently a substituted or unsubstituted aromatic hydrocarbon ring; or a substituted or unsubstituted aromatic hetero ring, and Cy1 and Cy2 may be bonded to each other to form a substituted or unsubstituted ring, Ra is a substituted or unsubstituted alkyl group; a substituted or unsubstituted aryl group; or a substituted or unsubstituted heterocyclic group, or is bonded to Cy1 or Cy3 to form a substituted or unsubstituted ring, and Rb is a substituted or unsubstituted alkyl group; a substituted or unsubstituted aryl group; or a substituted or unsubstituted heterocyclic group, or is bonded to Cy2 or Cy3 to form a substituted or unsubstituted ring.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

In the present specification, means a position bonded to a formula or a compound.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; a hydroxyl group; a silyl group; a boron group; an alkoxy group; an aryloxy group; an alkyl group; an alkenyl group; an alkynyl group; a cycloalkyl group; an aryl group; an amine group; and a heterocyclic group, being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

Examples of the substituents will be described below, but are not limited thereto.

In the present specification, examples of a halogen group include fluorine (—F), chlorine (—Cl), bromine (—Br) or iodine (—I).

In the present specification, a silyl group may be represented by a formula of $—SiY_aY_bY_e$, and $Y_a$, $Y_b$, and $Y_e$ may be each hydrogen; a substituted or unsubstituted alkyl group; or a substituted or unsubstituted aryl group. Specific examples of the silyl group include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be represented by a formula of $-BY_aY_e$, and Yd and $Y_e$ may be each hydrogen; a substituted or unsubstituted alkyl group; or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group may be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group, and the like, but are not limited thereto.

In the present specification, the alkoxy group may be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

Substituents including an alkyl group, an alkoxy group, and other alkyl group moieties described in the present specification include both a straight-chained form and a branched form.

In the present specification, the alkenyl group may be straight-chained or branched, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. According to still another exemplary embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of the monocyclic aryl group may be a phenyl group, a biphenyl group, a terphenyl group, a quarterphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, a triphenylenyl group, and the like, but are not limited thereto.

In the present specification, a fluorenyl group may be substituted, and two substituents may be bonded to each other to form a spiro structure.

When the fluorenyl group is substituted, the substituent may be a spirofluorenyl group such as

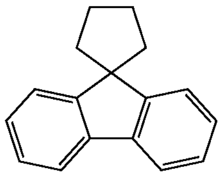 [SMILES: c1ccc2c(c1)-c1ccccc1C21CCCC1]

and

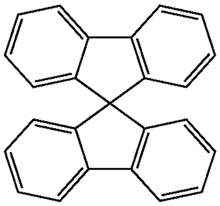

, and a substituted fluorenyl group such as

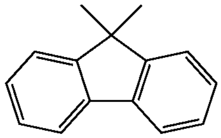

(a 9,9-dimethylfluorenyl group) and

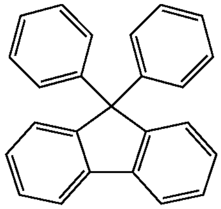 [SMILES: c1ccc(C2(c3ccccc3)c3ccccc3-c3ccccc32)cc1]

(a 9,9-diphenylfluorenyl group). However, the substituent is not limited thereto.

In the present specification, the above-described description on the aryl group may be applied to an aryl group in an aryloxy group.

In the present specification, a heterocyclic group is a cyclic group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 30. Examples of the heterocyclic group include a pyridine group, a pyrrole group, a pyrimidinyl group, a quinolinyl group, a pyridazinyl group, a furanyl group, a thiophenyl group, an imidazole group, a pyrazole group, a dibenzofuranyl group, a dibenzothiophenyl group, a carbazole group, a benzocarbazole group, a naphthobenzofuranyl group, a benzonaphthothiophenyl group, an indenocarbazole group, and the like, but are not limited thereto.

In the present specification, the above-described description on the heterocyclic group may be applied to a heteroaryl group except for an aromatic heteroaryl group.

In the present specification, the above-described description on the aryl group may be applied to an arylene group except for a divalent arylene group.

In the present specification, in a substituted or unsubstituted ring formed by being bonded to an adjacent group, the "ring" means a hydrocarbon ring; or a hetero ring.

The hydrocarbon ring may be an aromatic ring, an aliphatic ring, or a fused ring of the aromatic ring and the aliphatic ring, and may be selected from the examples of the cycloalkyl group or the aryl group, except for the divalent hydrocarbon ring.

In the present specification, the description on the aryl group may be applied to an aromatic hydrocarbon ring except for a divalent aromatic hydrocarbon ring.

The description on the heterocyclic group may be applied to the hetero ring except for a divalent hetero ring.

According to an exemplary embodiment of the present specification, R1 and R2 are the same as or different from each other, and are hydrogen; deuterium; a substituted or unsubstituted alkyl group having 1 to 60 carbon atoms; or a substituted or unsubstituted aryl group having 6 to 60 carbon atoms.

According to another exemplary embodiment, R1 and R2 are the same as or different from each other, and are each independently hydrogen; deuterium; an alkyl group having 1 to 60 carbon atoms; or an aryl group having 6 to 60 carbon atoms.

According to another exemplary embodiment, R1 and R2 are each hydrogen.

According to another exemplary embodiment, n1 is 0 or 1.

According to another exemplary embodiment, n2 is 0 or 1.

According to an exemplary embodiment of the present specification, L1 and L2 are the same as or different from each other, and are each independently a direct bond; or a substituted or unsubstituted arylene group having 6 to 60 carbon atoms.

According to another exemplary embodiment, L1 and L2 are the same as or different from each other, and are each independently a direct bond; or a substituted or unsubstituted arylene group having 6 to 30 carbon atoms.

According to another exemplary embodiment, L1 and L2 are the same as or different from each other, and are each independently a direct bond; or an arylene group having 6 to 30 carbon atoms.

According to another exemplary embodiment, L1 and L2 are the same as or different from each other, and are each independently a direct bond; a substituted or unsubstituted phenylene group; or a substituted or unsubstituted naphthylene group.

According to another exemplary embodiment, L1 and L2 are the same as or different from each other, and are each independently a direct bond; a phenylene group; or a naphthylene group.

According to an exemplary embodiment of the present specification, Ar1 and Ar2 are the same as or different from each other, and are each independently a phenyl group which is unsubstituted or substituted with deuterium or an aryl group; or a biphenyl group which is unsubstituted or substituted with deuterium or an aryl group.

According to an exemplary embodiment of the present specification, Ar1 and Ar2 are the same as or different from each other, and are each independently a phenyl group which is unsubstituted or substituted with deuterium or an aryl group having 6 to 60 carbon atoms; or a biphenyl group which is unsubstituted or substituted with deuterium or an aryl group having 6 to 60 carbon atoms.

According to an exemplary embodiment of the present specification, Ar1 and Ar2 are the same as or different from each other, and are each independently a phenyl group which is unsubstituted or substituted with deuterium or an aryl group having 6 to 30 carbon atoms; or a biphenyl group which is unsubstituted or substituted with deuterium or an aryl group having 6 to 30 carbon atoms.

According to an exemplary embodiment of the present specification, Ar1 and Ar2 are the same as or different from each other, and are each independently a phenyl group which is unsubstituted or substituted with deuterium, a phenyl group, a biphenyl group, a terphenyl group, a naphthyl group, or an anthracenyl group; or a biphenyl group which is unsubstituted or substituted with deuterium, a phenyl group, a biphenyl group, a terphenyl group, a naphthyl group, or an anthracenyl group.

According to an exemplary embodiment of the present specification, Ar1 and Ar2 are the same as or different from each other, and are each independently a phenyl group which is unsubstituted or substituted with deuterium, a phenyl group, a biphenyl group, a terphenyl group, or a naphthyl group; or a biphenyl group which is unsubstituted or substituted with deuterium, a phenyl group, or a naphthyl group.

According to an exemplary embodiment of the present specification, L3 is a direct bond; or a substituted or unsubstituted arylene group having 6 to 60 carbon atoms.

According to another exemplary embodiment, L3 is a direct bond; or a substituted or unsubstituted arylene group having 6 to 30 carbon atoms.

According to another exemplary embodiment, L3 is a direct bond; or an arylene group having 6 to 30 carbon atoms.

According to another exemplary embodiment, L3 is a direct bond; a substituted or unsubstituted phenylene group; or a substituted or unsubstituted naphthylene group. According to another exemplary embodiment, L3 is a direct bond; a phenylene group; or a naphthylene group.

According to an exemplary embodiment of the present specification, Ar3 is a substituted or unsubstituted aryl group having 6 to 60 carbon atoms; a substituted or unsubstituted dibenzofuranyl group; or a substituted or unsubstituted dibenzothiophenyl group.

According to an exemplary embodiment of the present specification, Ar3 is a substituted or unsubstituted aryl group having 6 to 30 carbon atoms; a substituted or unsubstituted dibenzofuranyl group; or a substituted or unsubstituted dibenzothiophenyl group.

According to another exemplary embodiment, Ar3 is an aryl group having 6 to 30 carbon atoms, which is unsubstituted or substituted with deuterium or an aryl group; a substituted or unsubstituted dibenzofuranyl group; or a substituted or unsubstituted dibenzothiophenyl group.

According to another exemplary embodiment, Ar3 is an aryl group having 6 to 30 carbon atoms, which is unsubstituted or substituted with deuterium, a phenyl group, a naphthyl group, a phenanthrenyl group, or a triphenylenyl group; a dibenzofuranyl group; or a dibenzothiophenyl group.

According to an exemplary embodiment of the present specification, Formula 1 is represented by the following Formula 1-1 or 1-2.

[Formula 1-1]

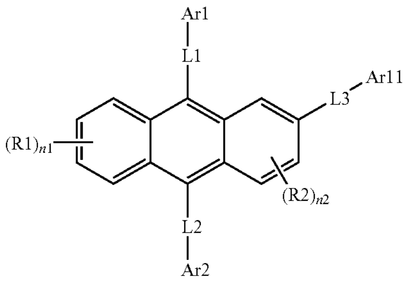

[Formula 1-2]

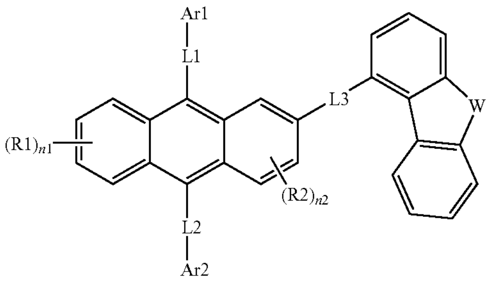

In Formulae 1-1 and 1-2, definitions of L1 to L3, Ar1, Ar2, R1, R2, n1, and n2 are the same as those defined in Formula 1, Ar11 is a substituted or unsubstituted aryl group, and W is O or S.

According to an exemplary embodiment of the present specification, Ar11 is a substituted or unsubstituted aryl group having 6 to 60 carbon atoms.

According to another exemplary embodiment, Ar11 is a substituted or unsubstituted aryl group having 6 to 30 carbon atoms.

According to another exemplary embodiment, Ar11 is an aryl group having 6 to 30 carbon groups, which is unsubstituted or substituted with deuterium or an aryl group.

According to another exemplary embodiment, Ar11 is an aryl group having 6 to 30 carbon atoms, which is unsubstituted or substituted with deuterium, a phenyl group, a naphthyl group, a phenanthrenyl group, or a triphenylenyl group.

According to an exemplary embodiment of the present specification, the compound represented by Formula 1 may be any one of the following compounds, but is not limited thereto.

-continued
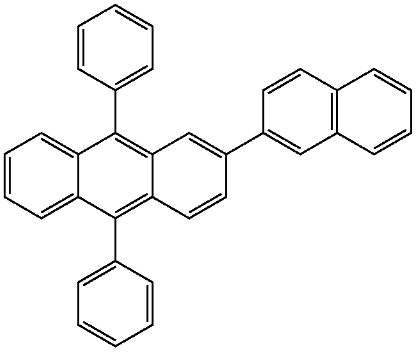
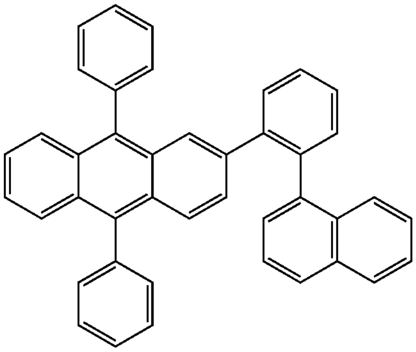
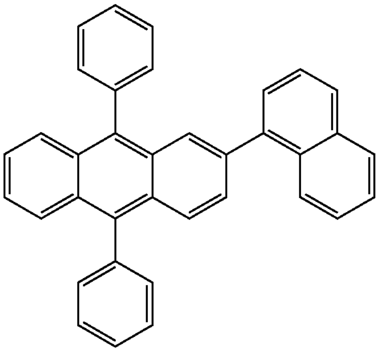
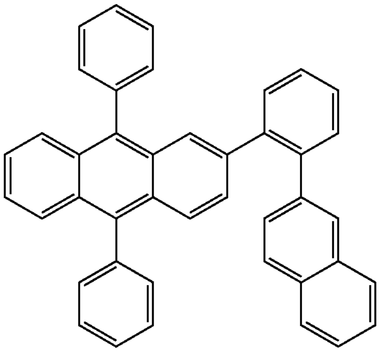
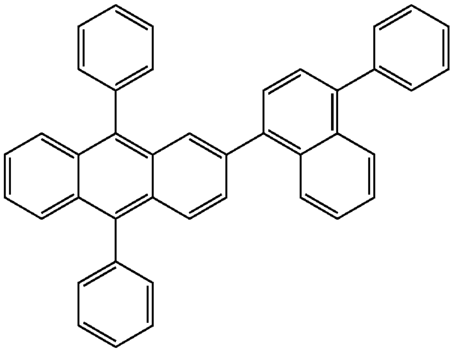
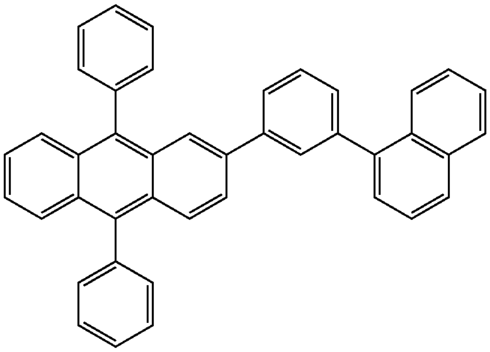
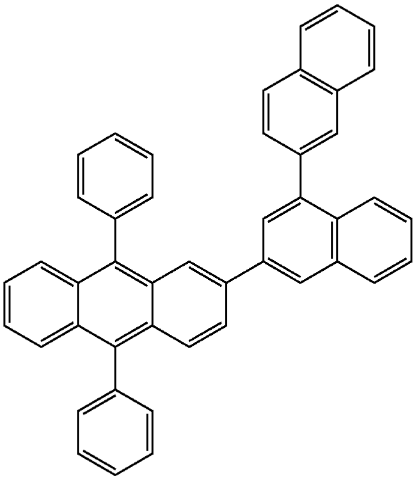
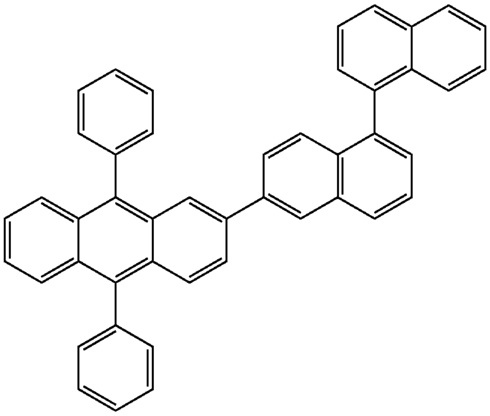

-continued
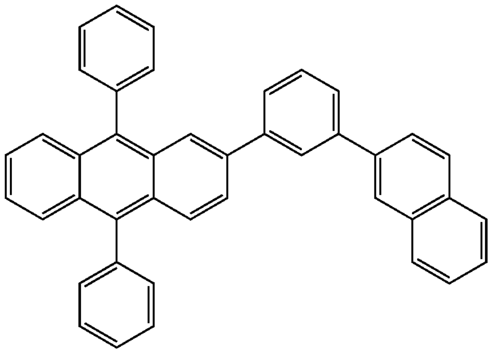
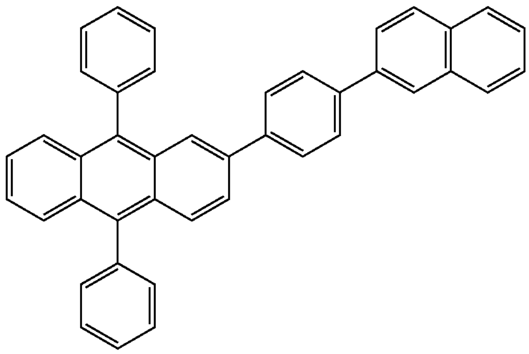
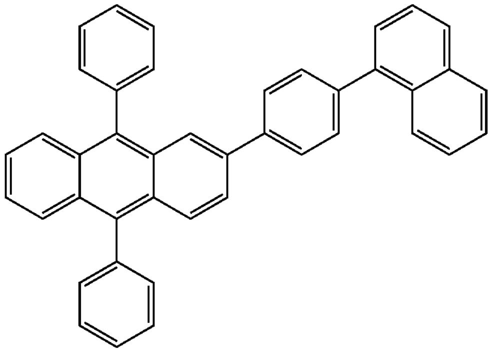
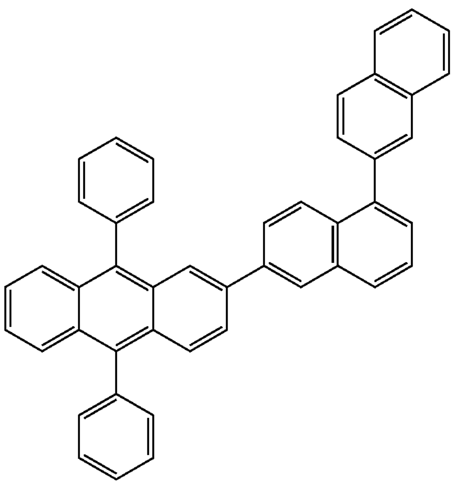
-continued
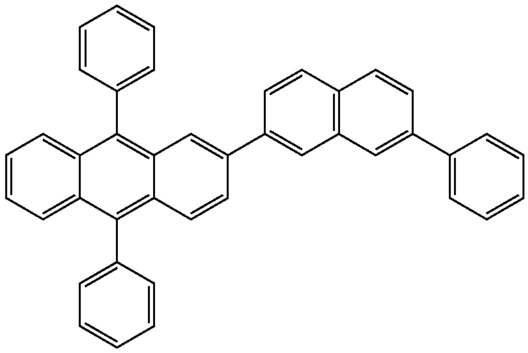
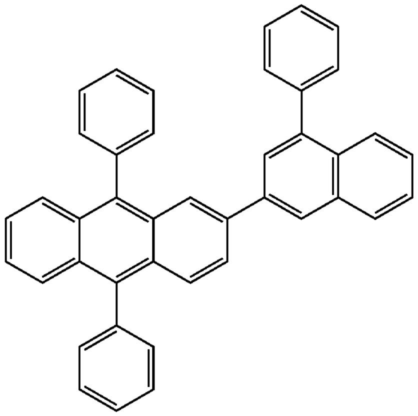
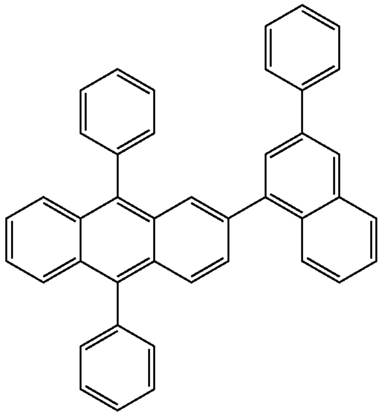
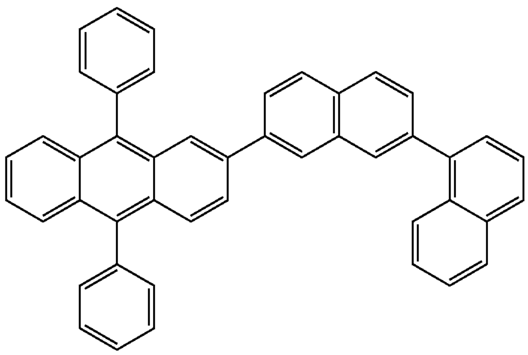

-continued
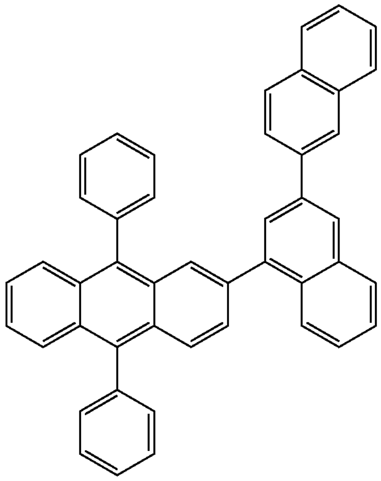
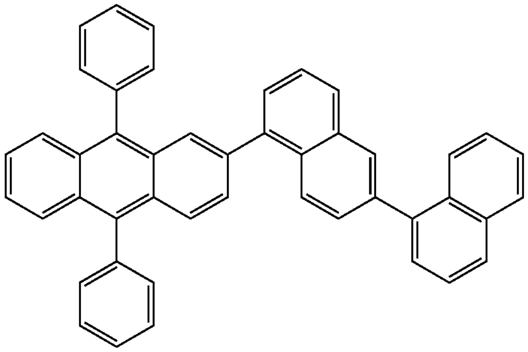
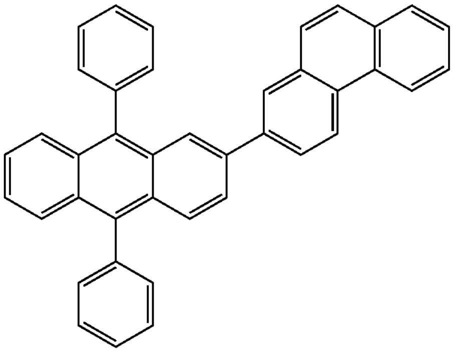
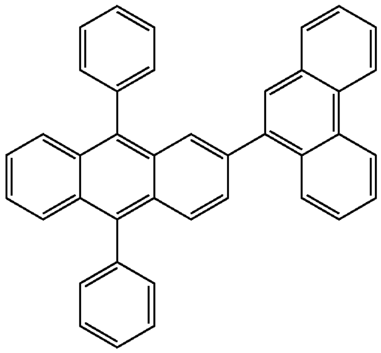
-continued
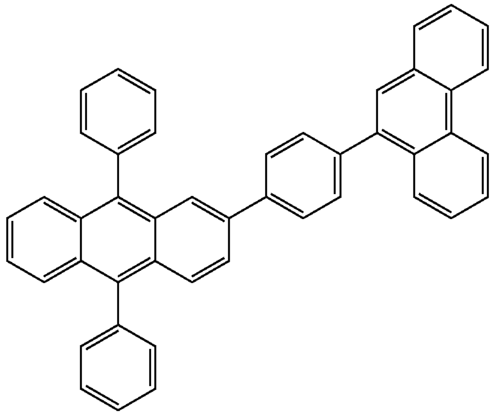
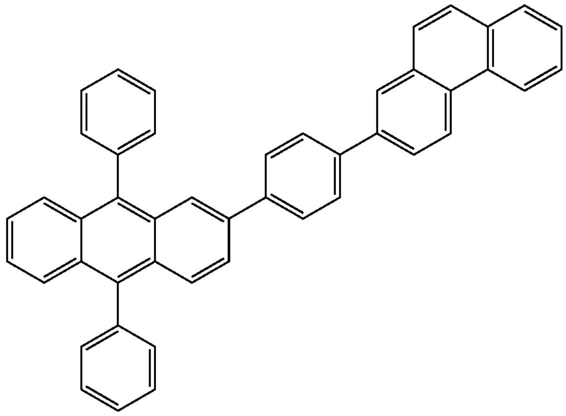
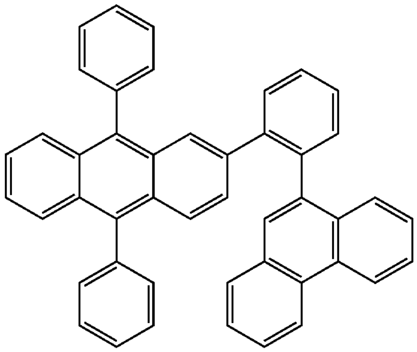
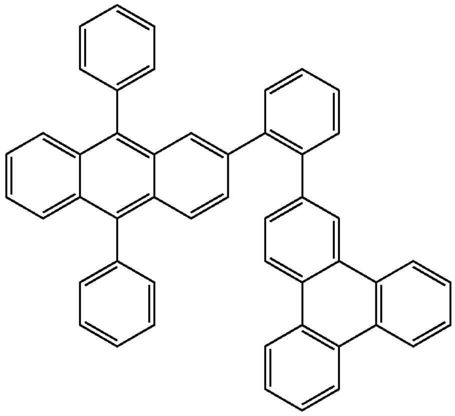

-continued
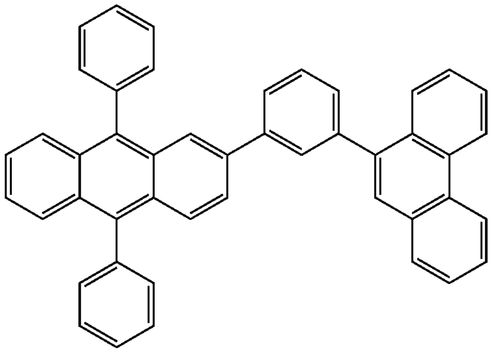
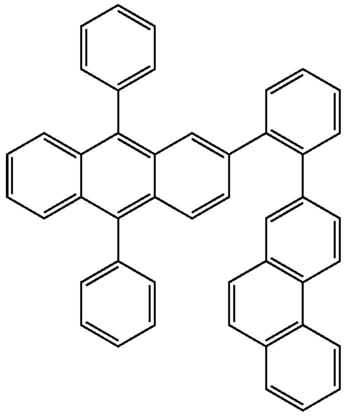
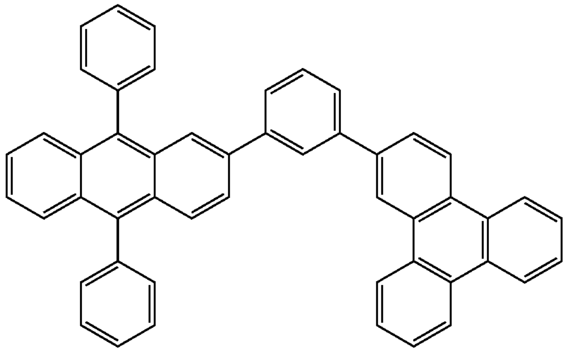
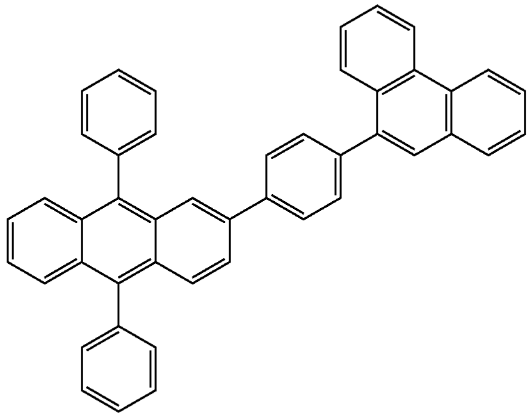
-continued
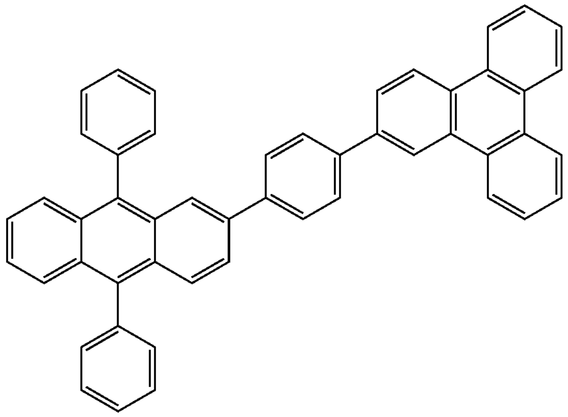
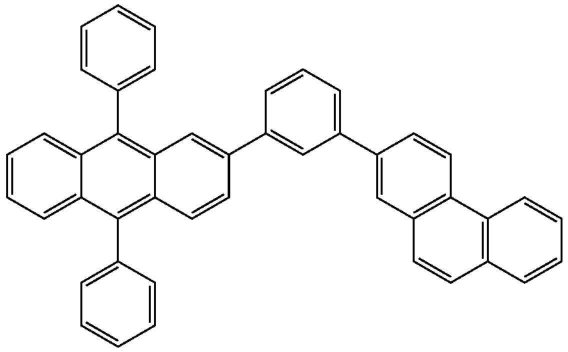
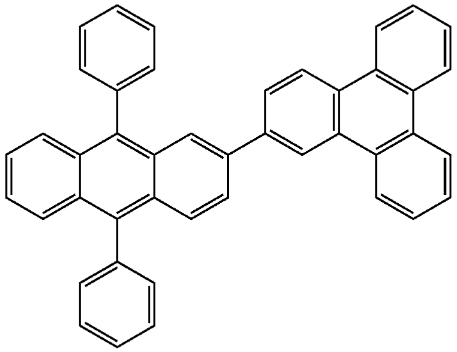
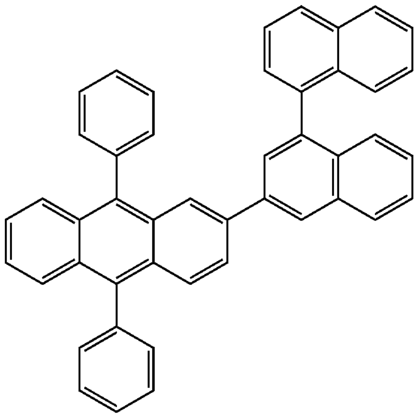

-continued
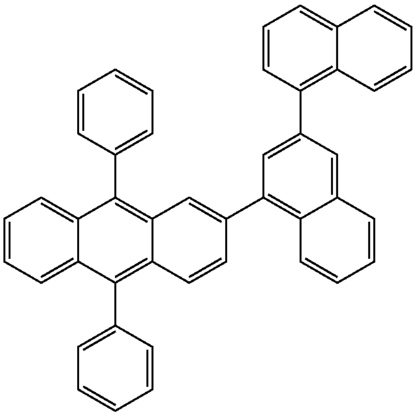
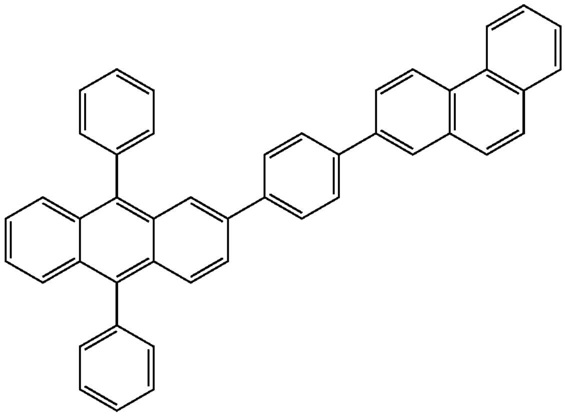
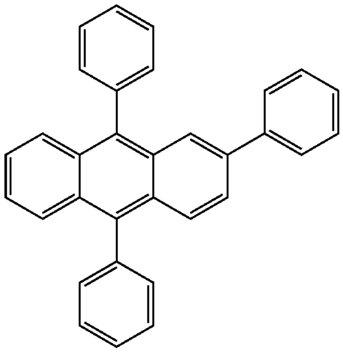
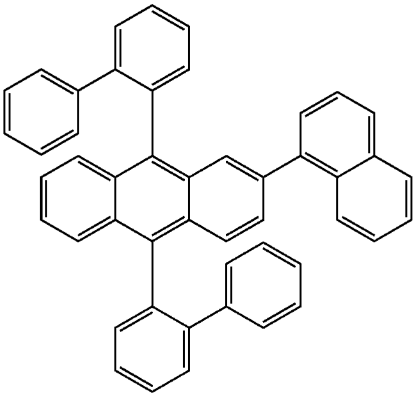
-continued
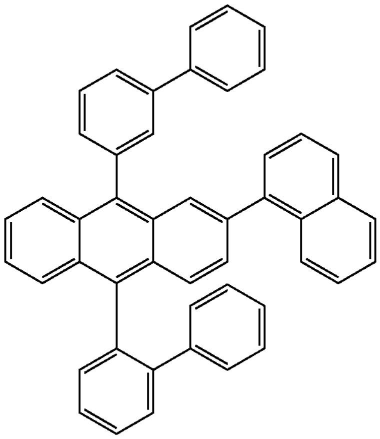
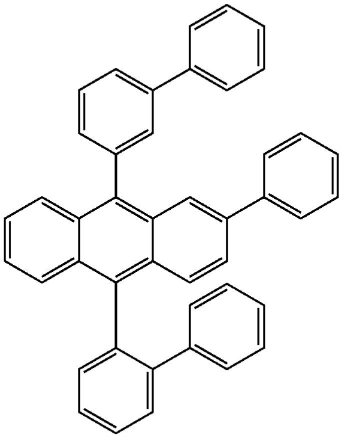
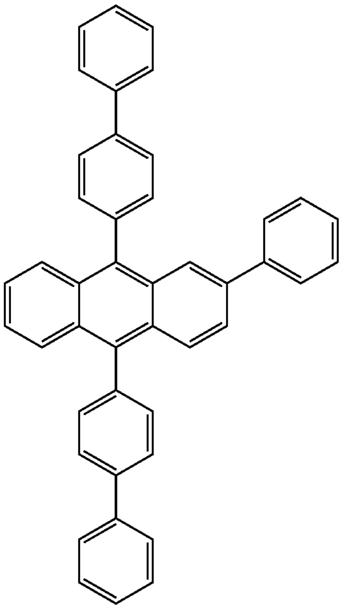

-continued
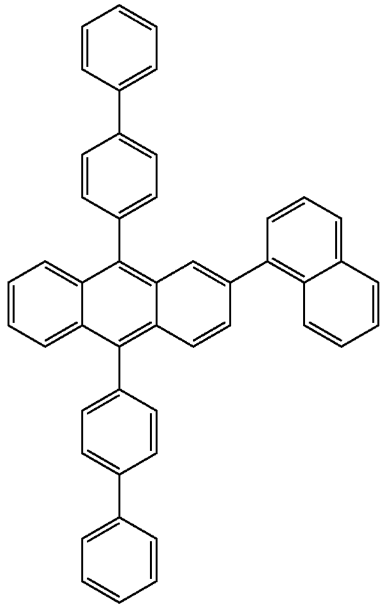
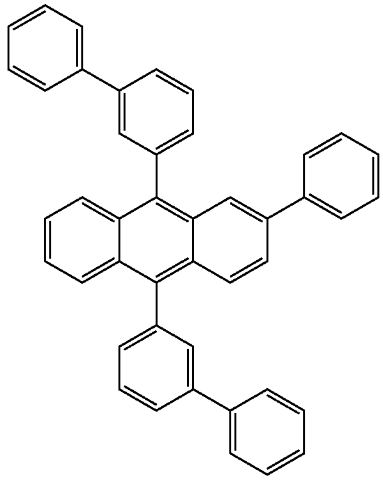
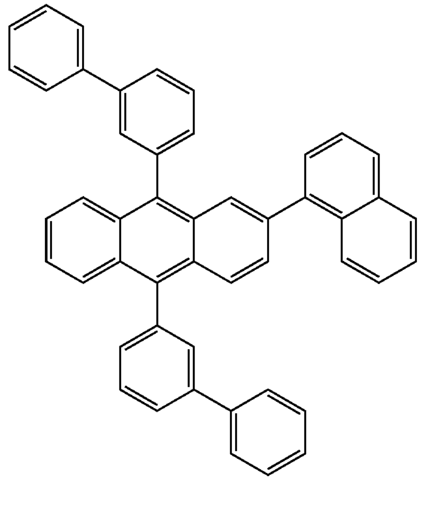
-continued
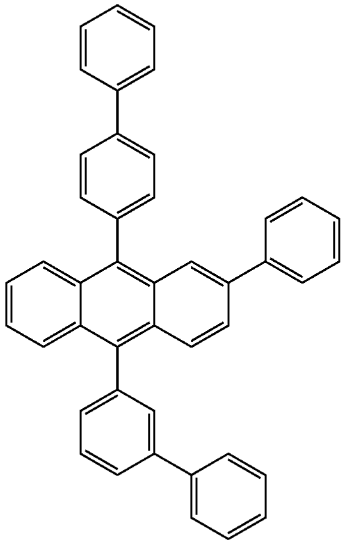
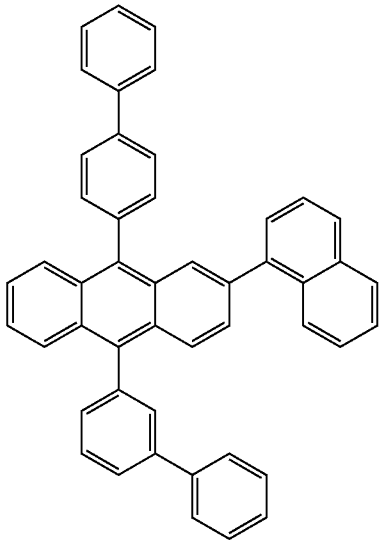
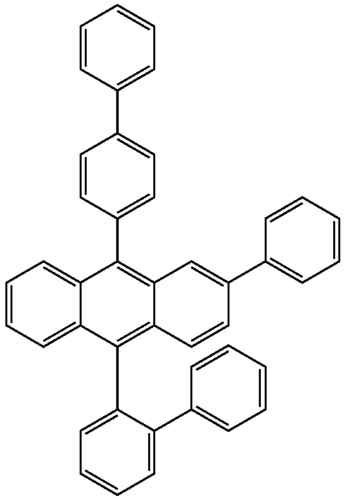

-continued
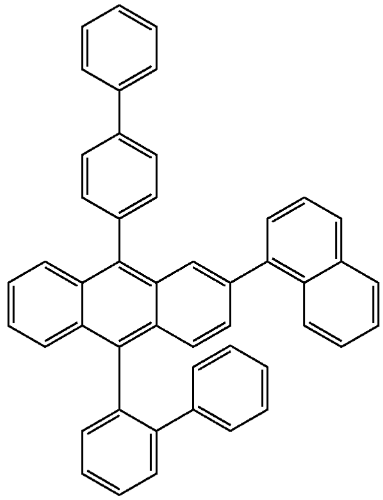
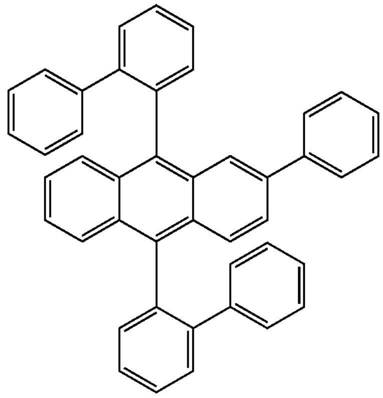
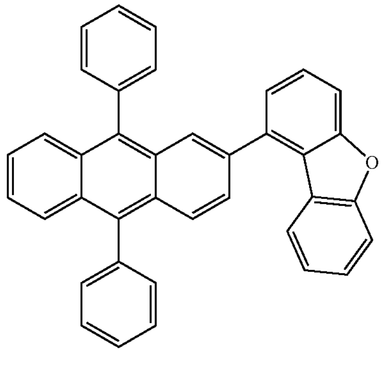
-continued
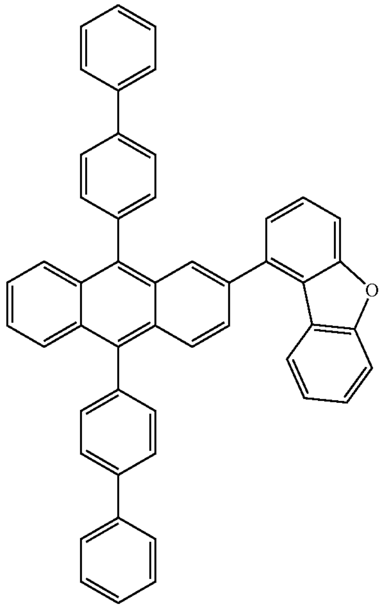
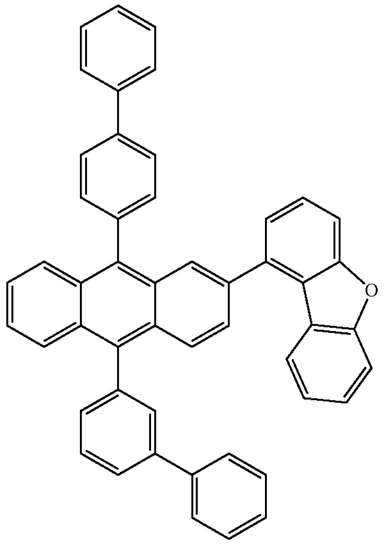
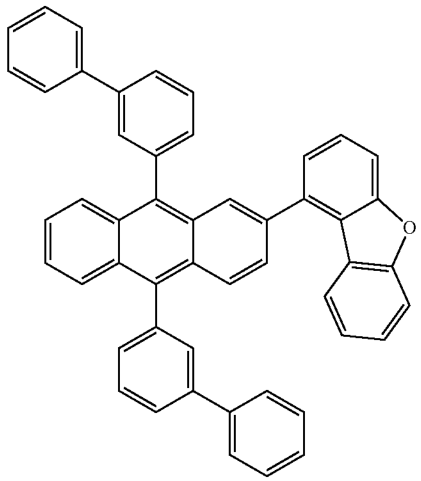

-continued
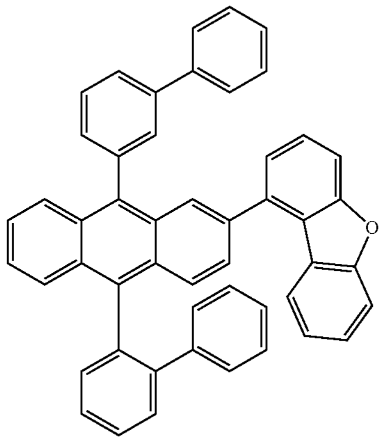
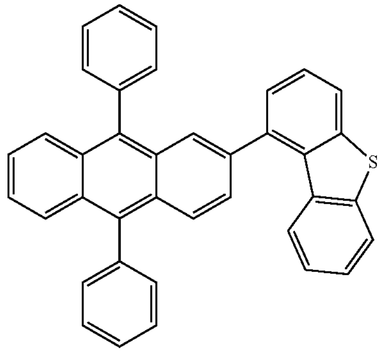
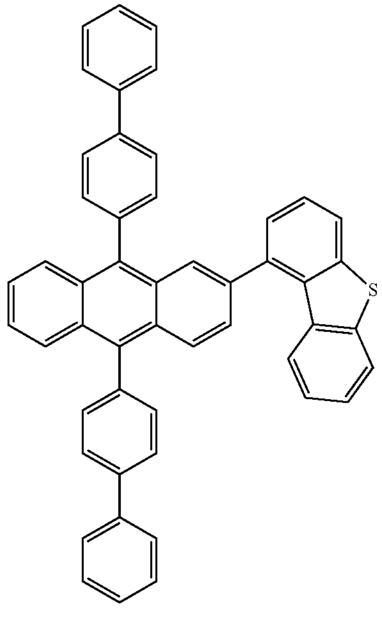
-continued
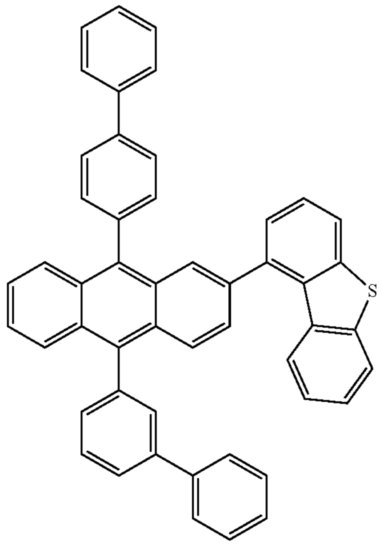
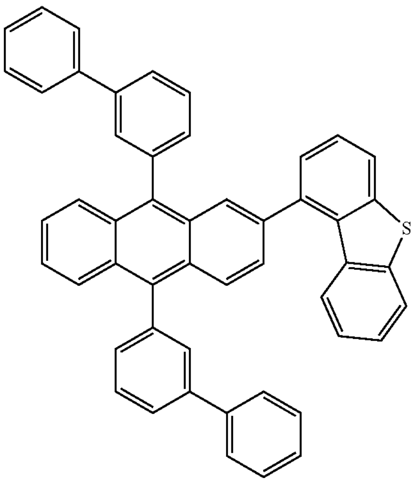
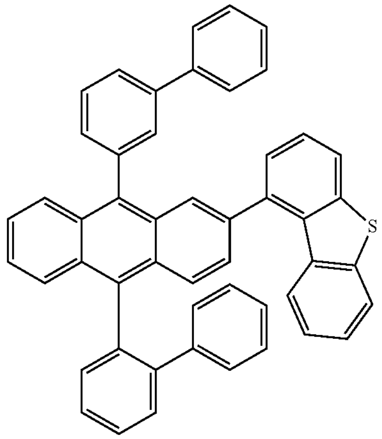

-continued
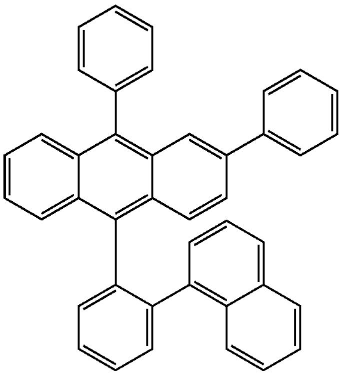
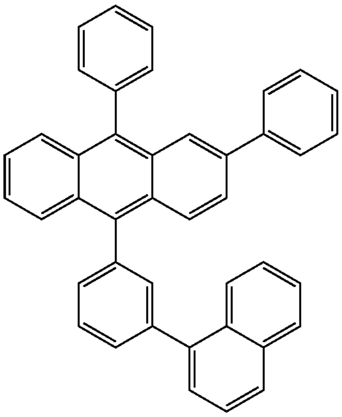
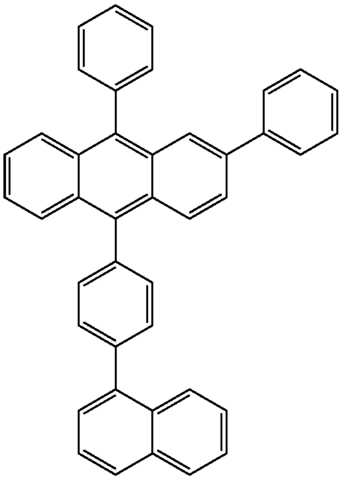
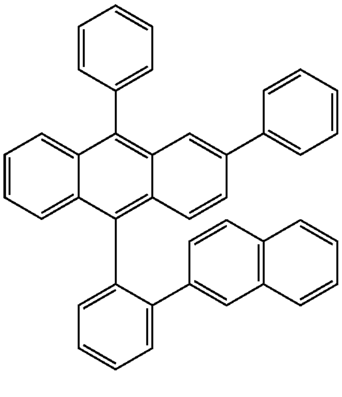
-continued
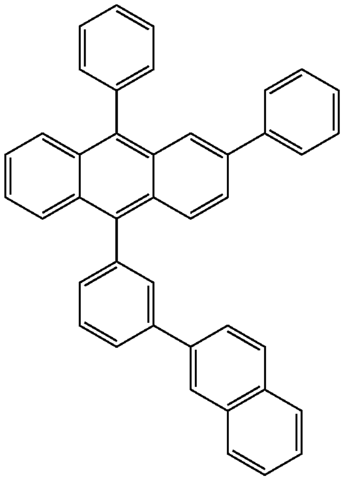
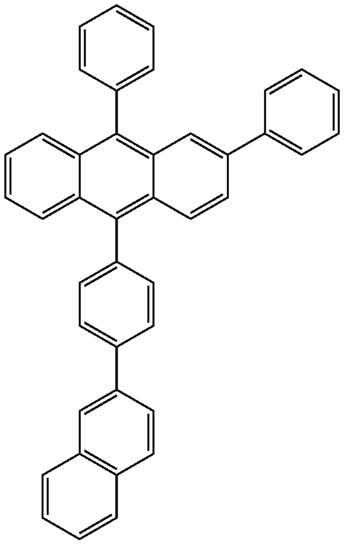
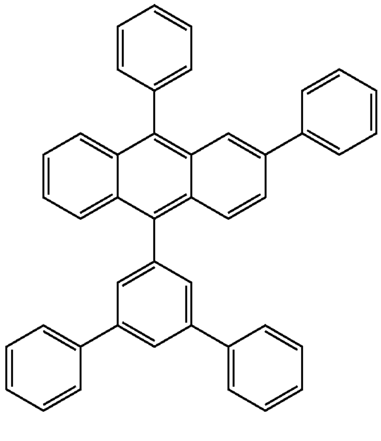

-continued
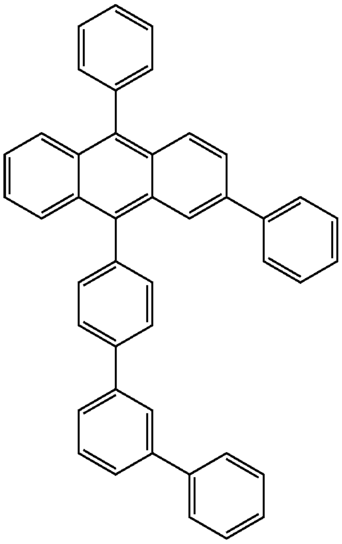
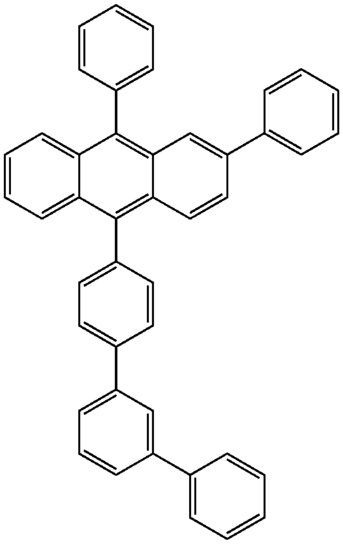
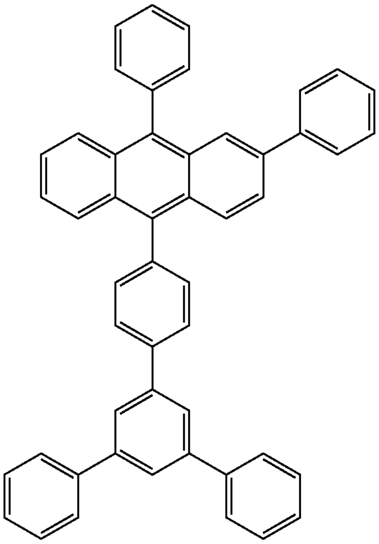
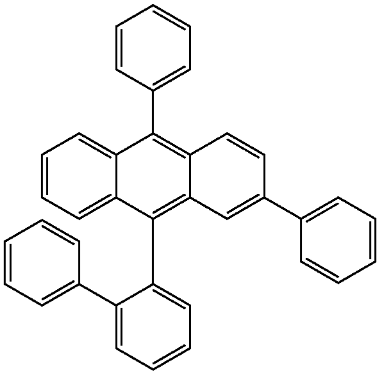
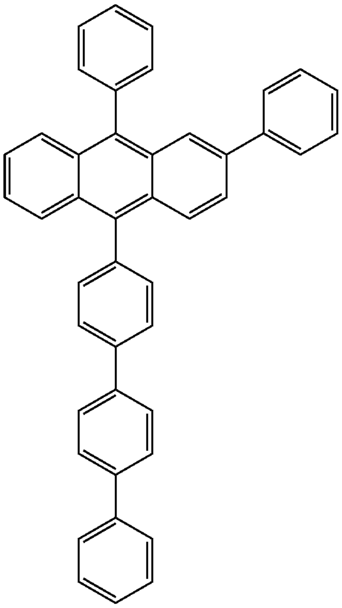
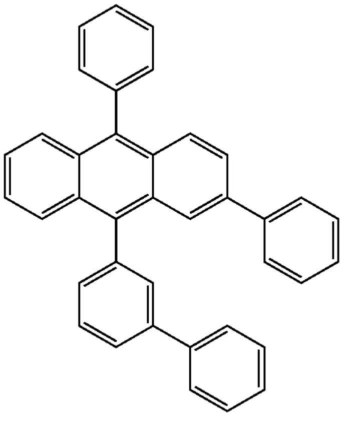
-continued -continued
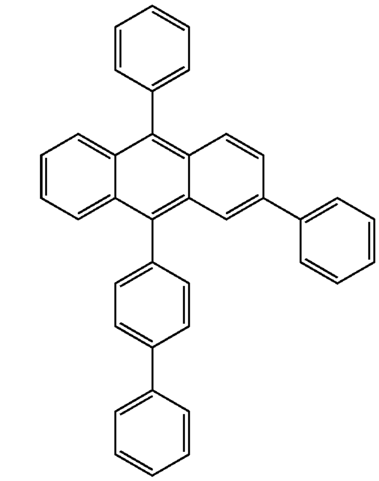
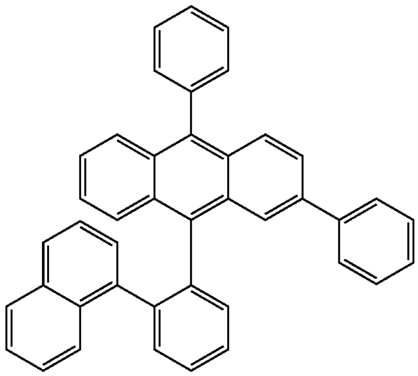
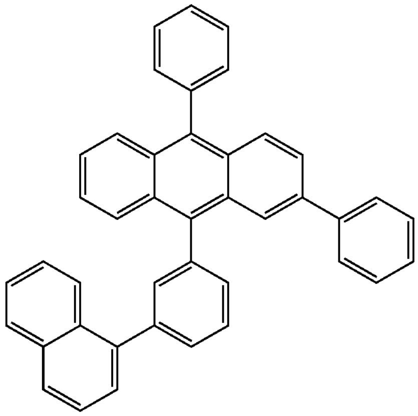
-continued
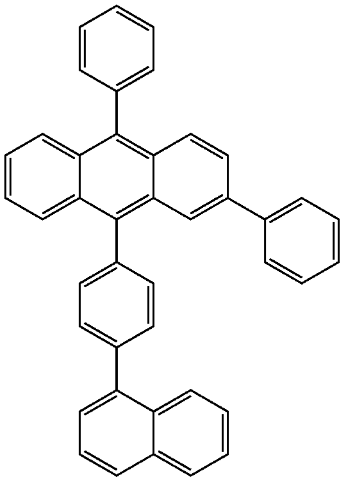
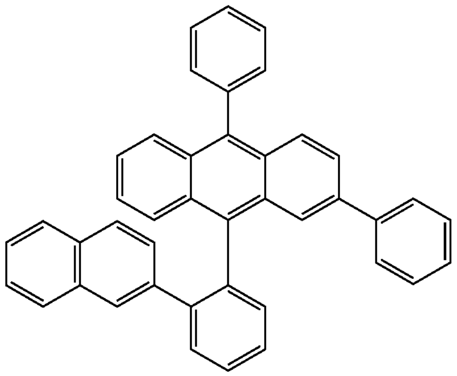
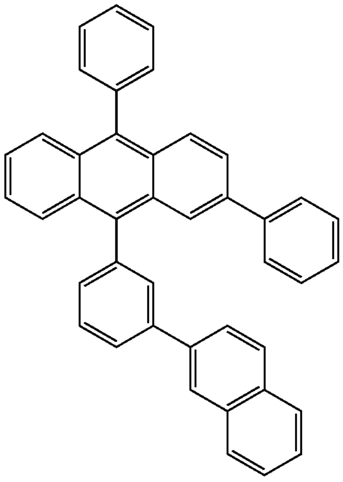

-continued
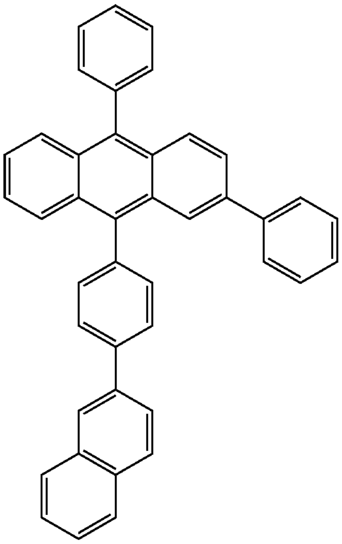
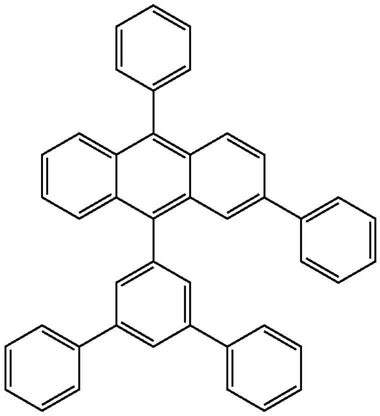
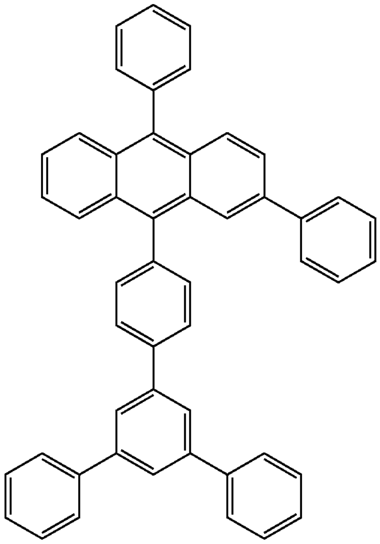
-continued
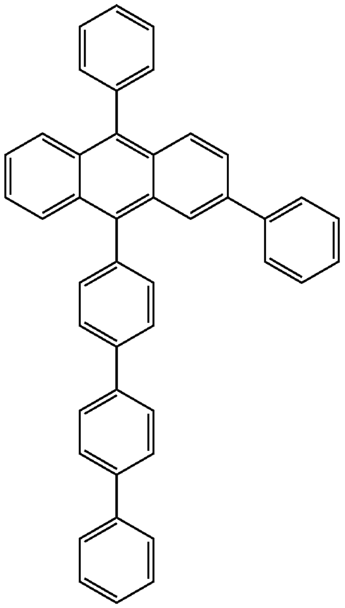
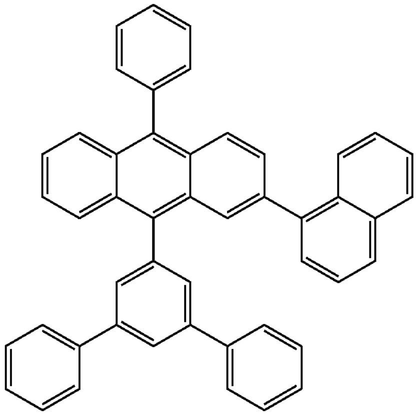
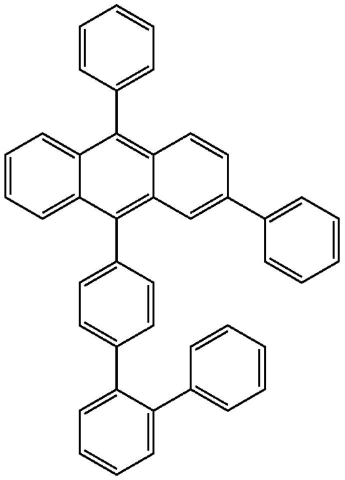

-continued
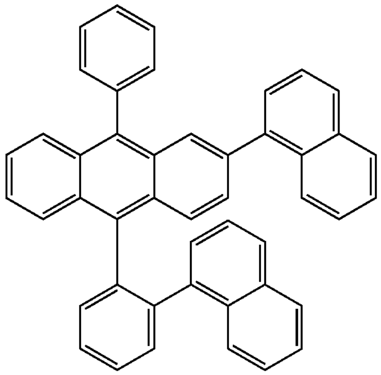
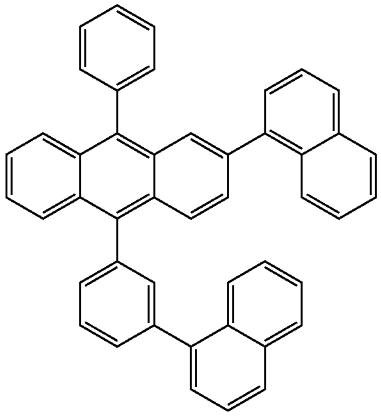
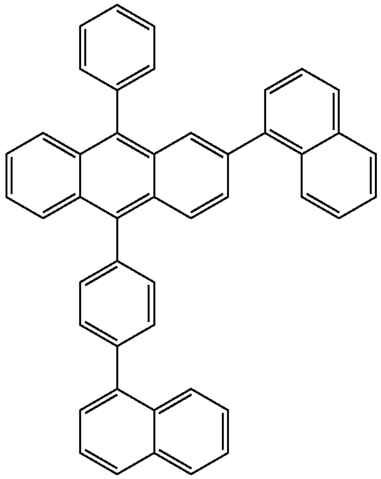
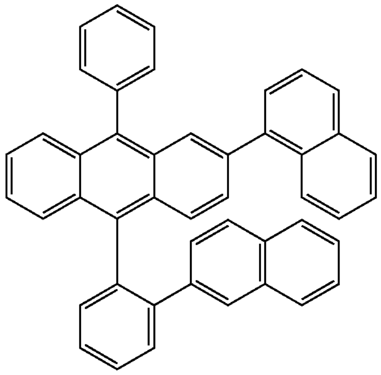
-continued
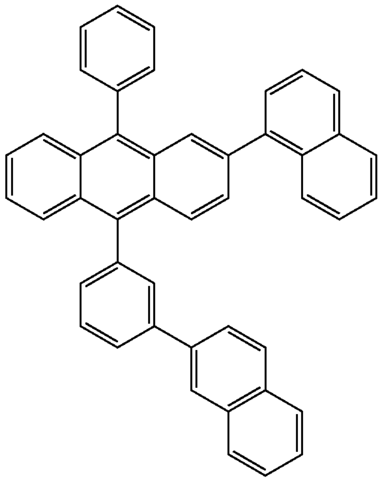
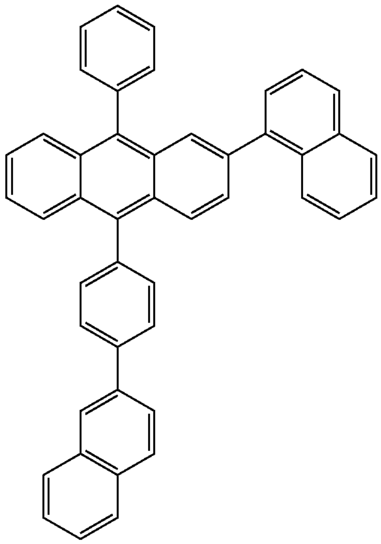
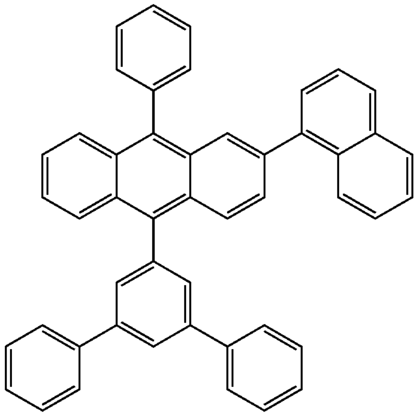

-continued
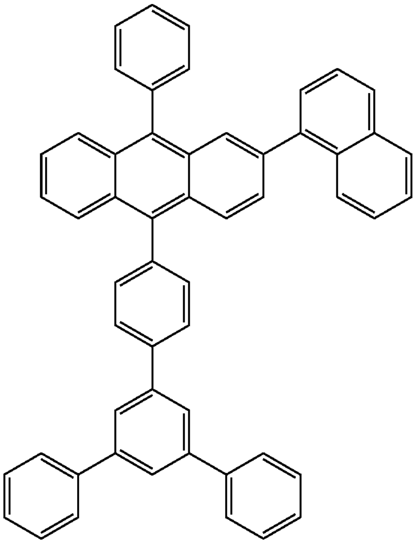
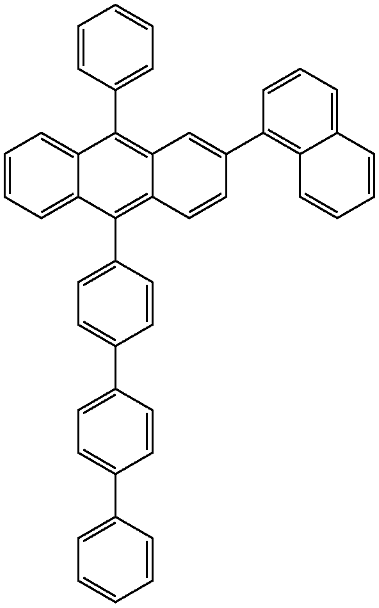
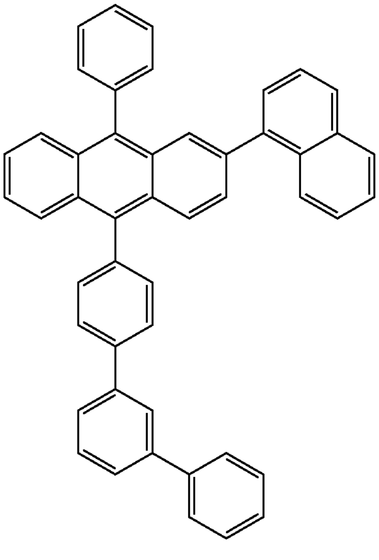
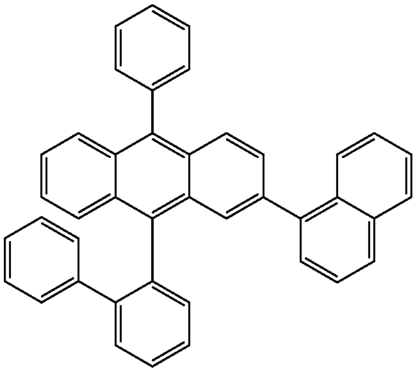
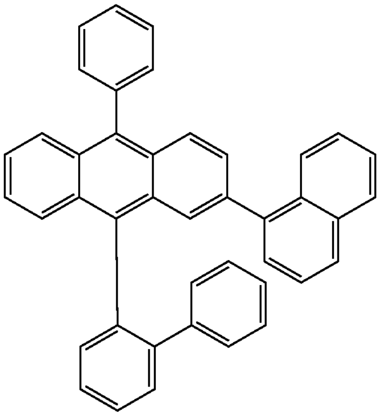
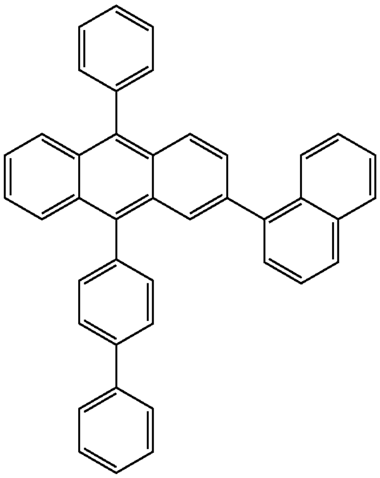
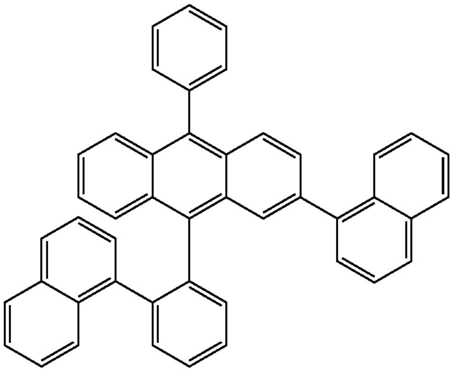

-continued
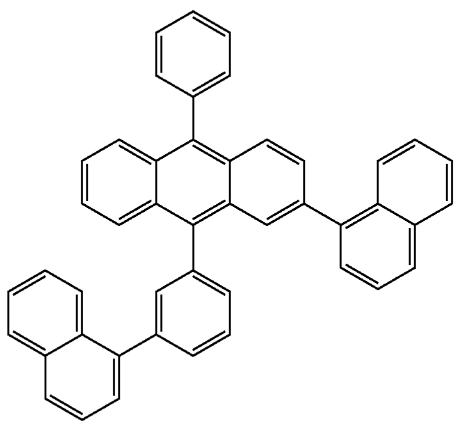
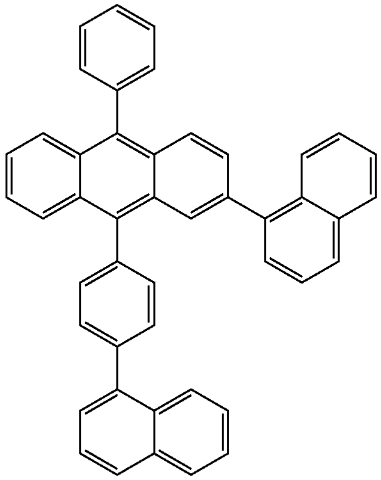
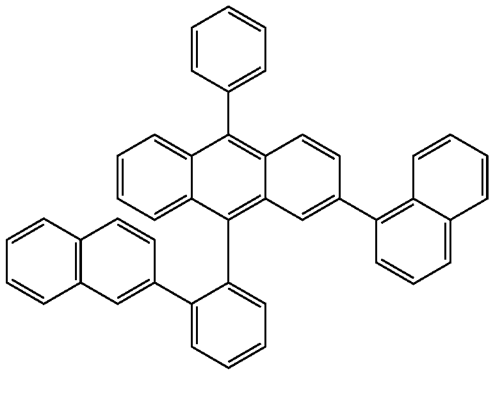
-continued
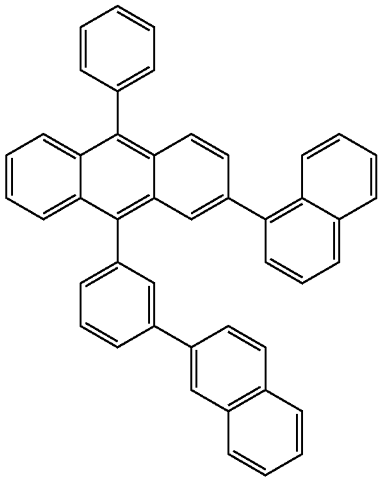
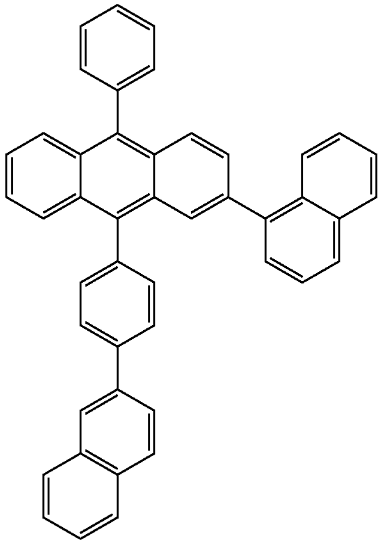
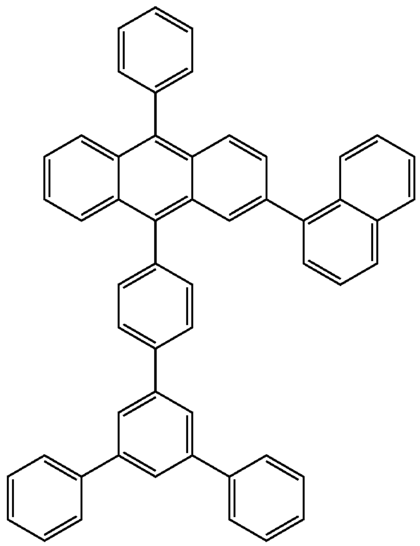

-continued
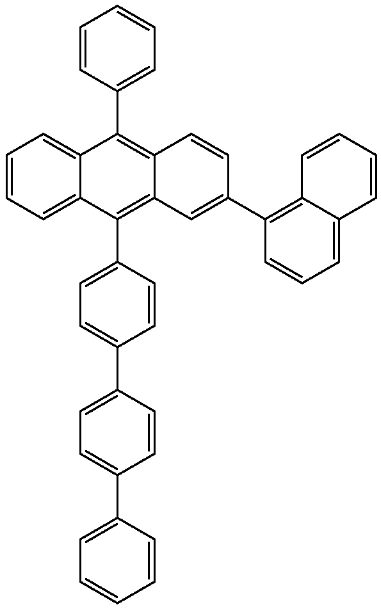
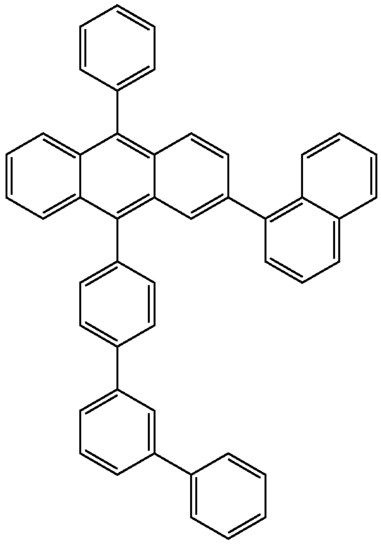
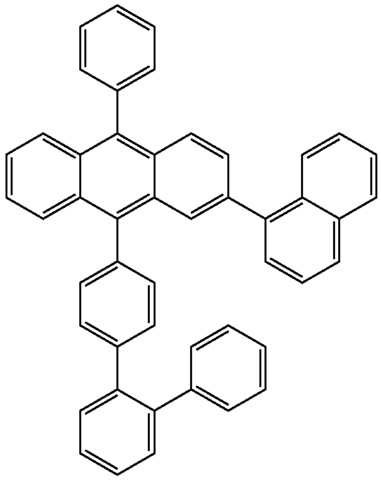
-continued
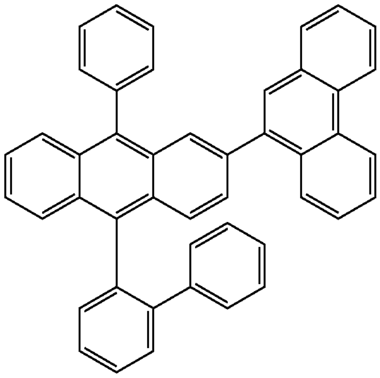
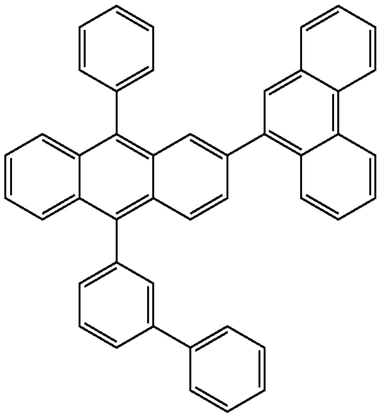
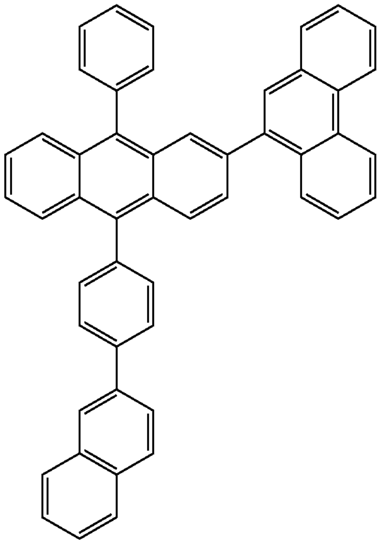

-continued
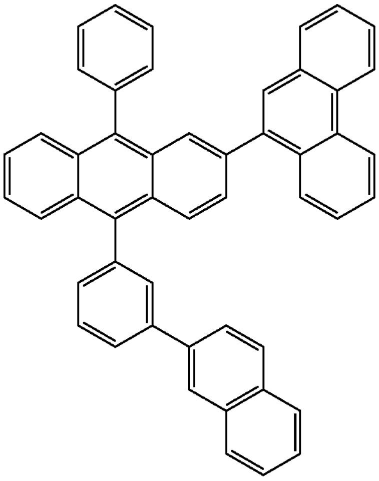
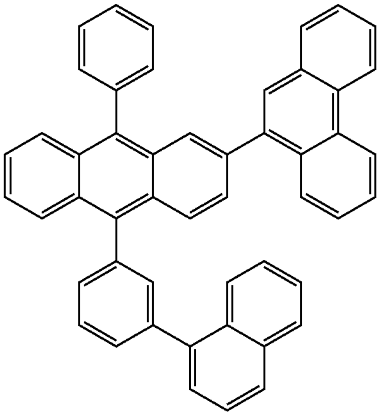
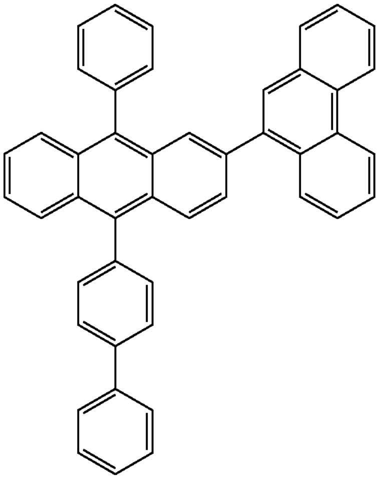
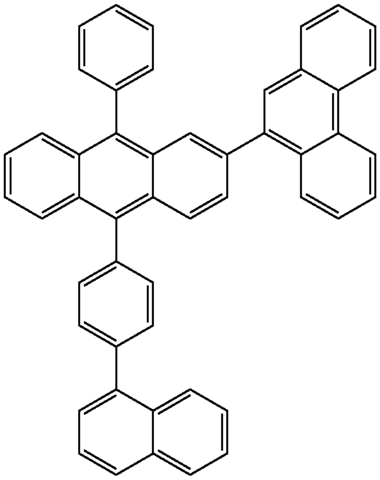
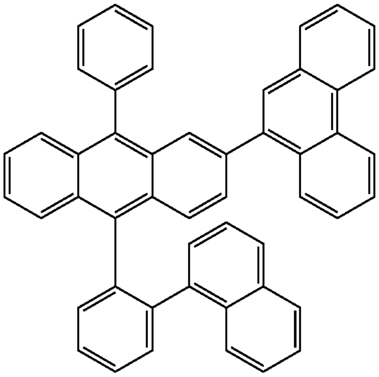
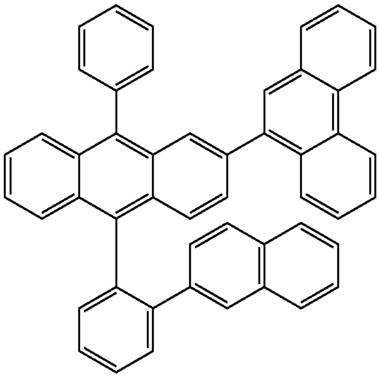
-continued -continued
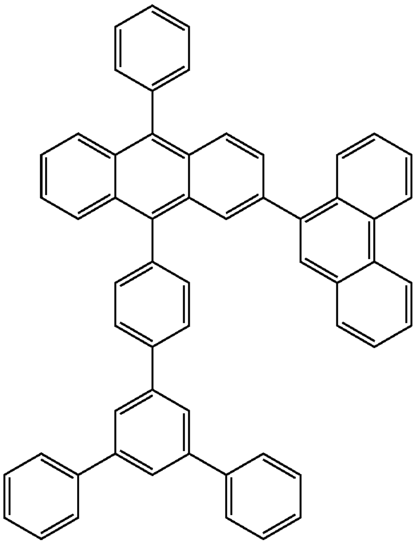
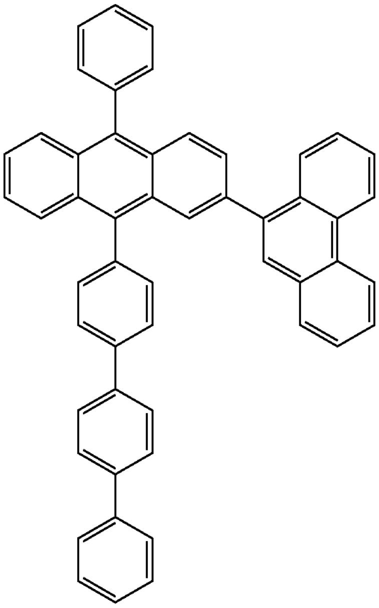
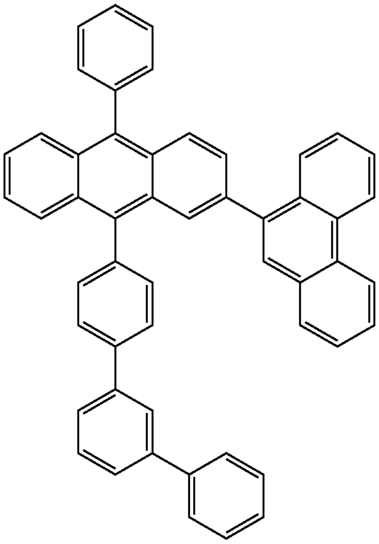
-continued
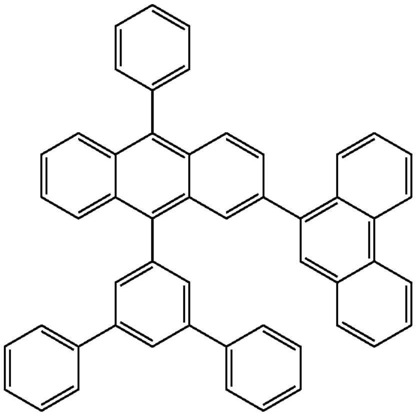
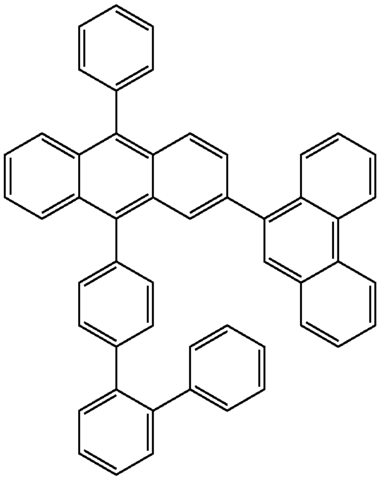
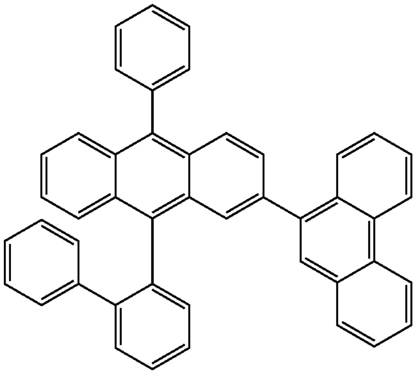
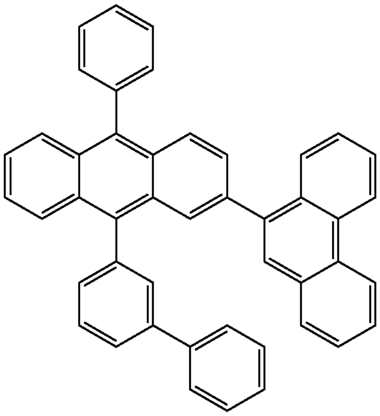

-continued
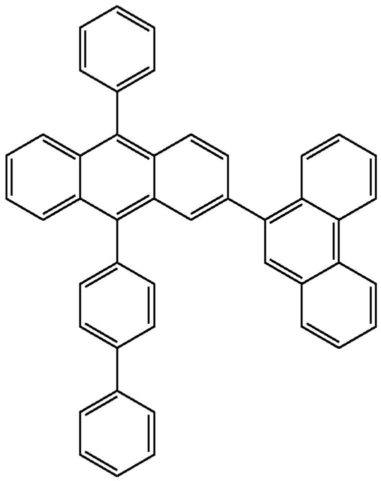
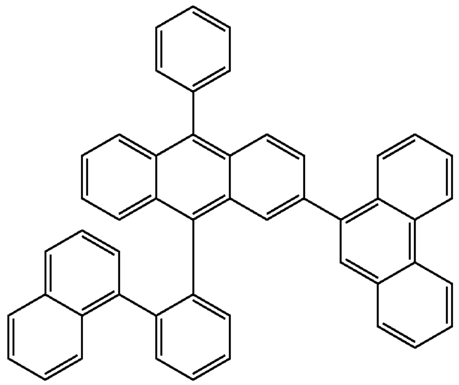
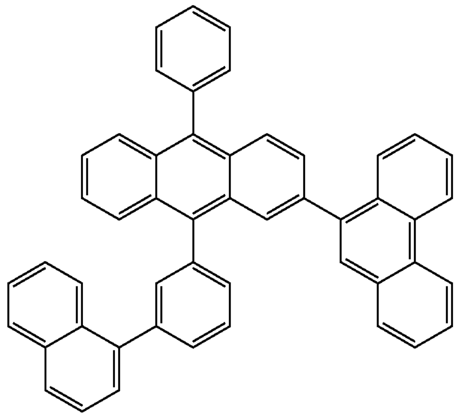
-continued
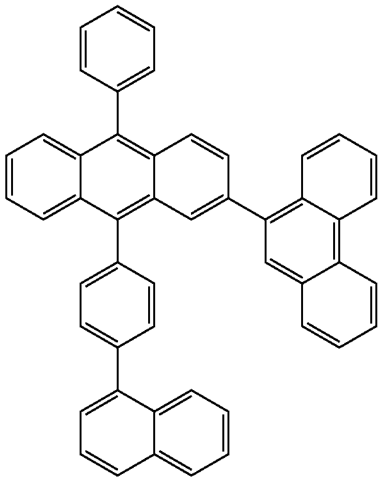
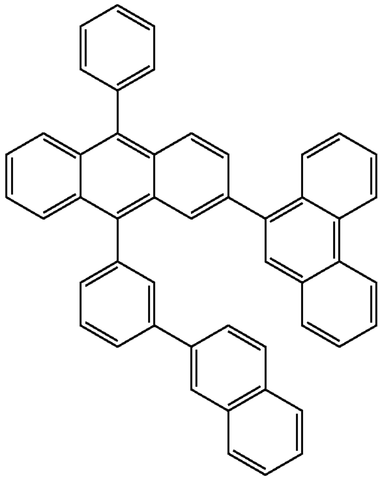
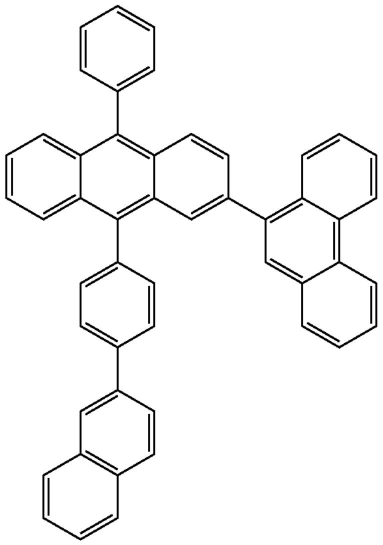

-continued
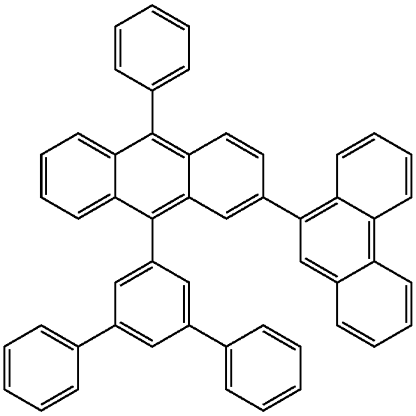
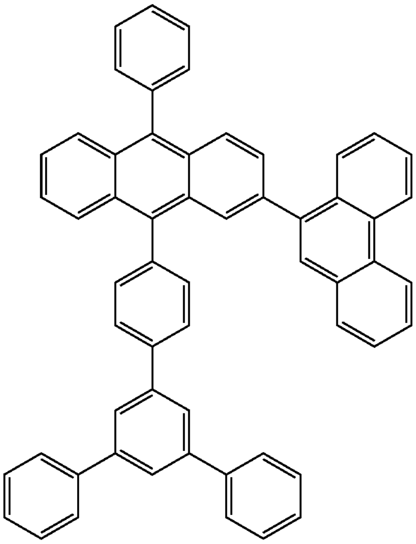
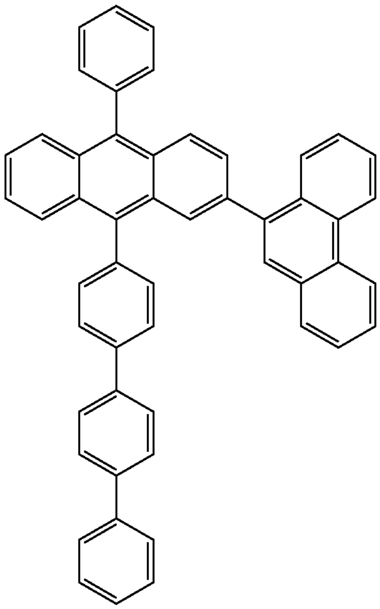
-continued
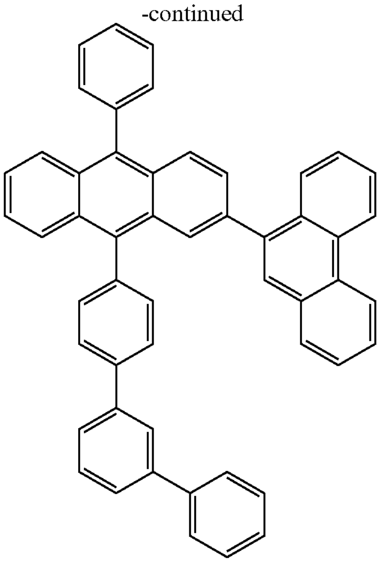
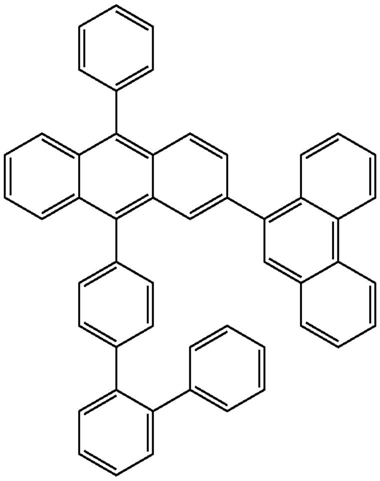
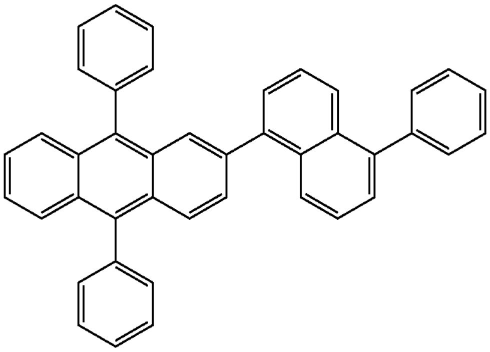
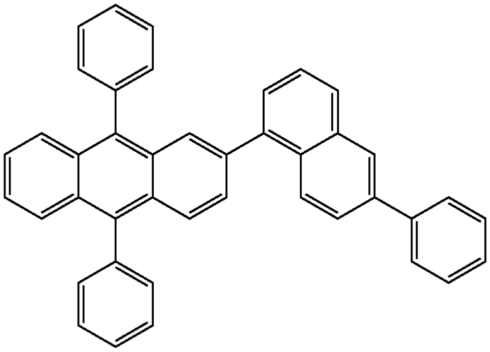

-continued
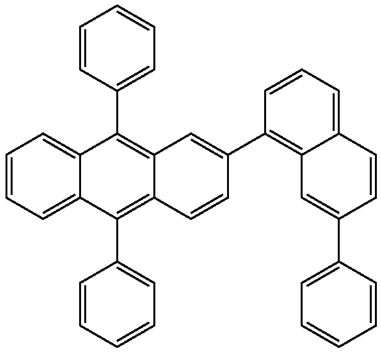
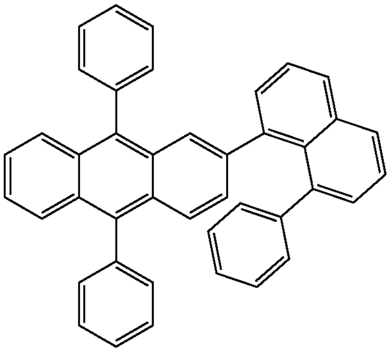
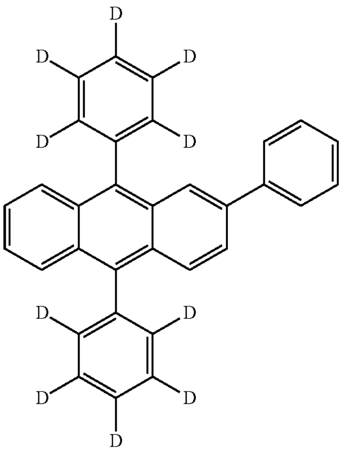
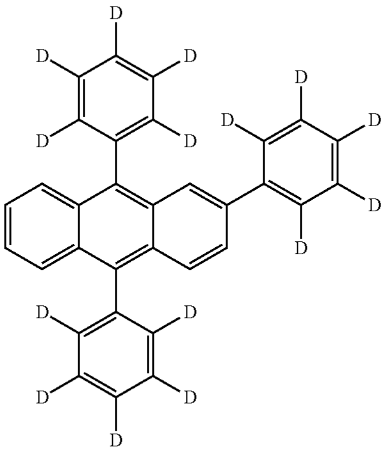
-continued
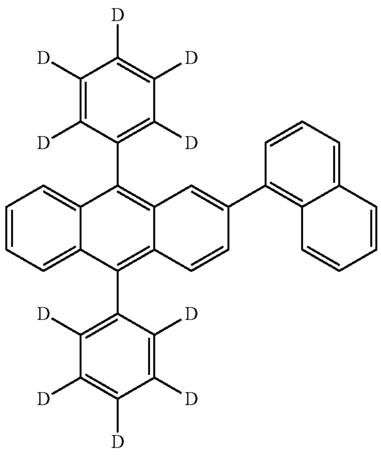
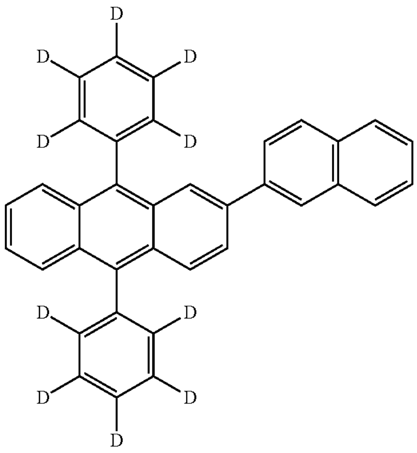
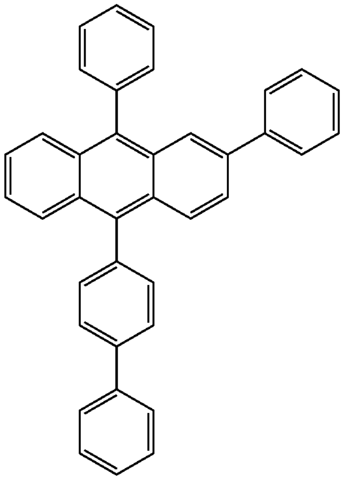

-continued
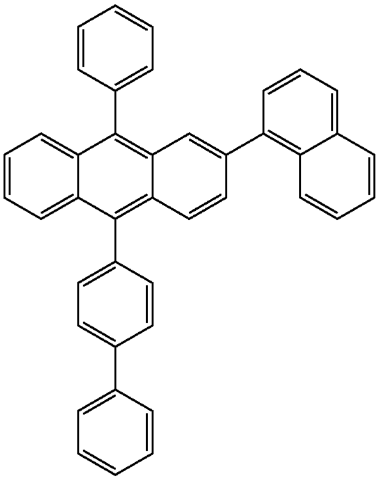
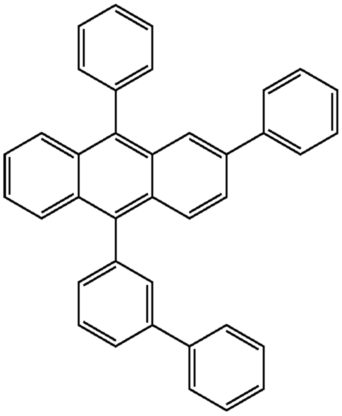
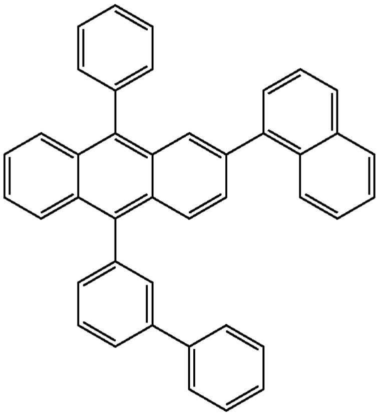
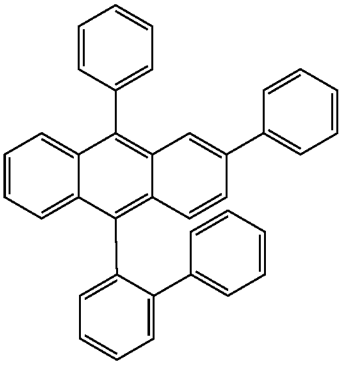
-continued
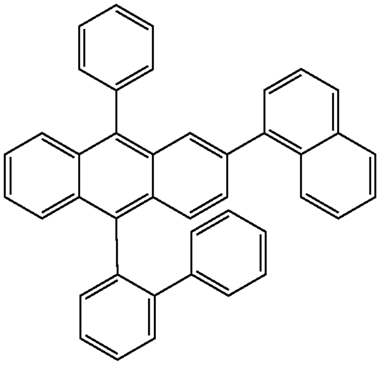
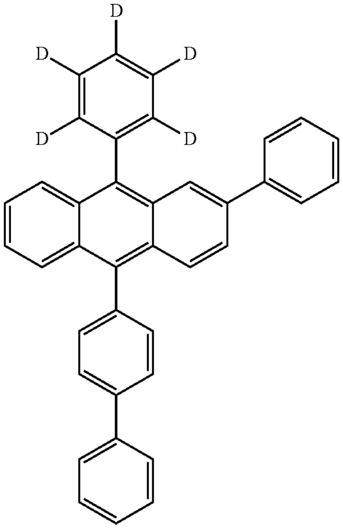
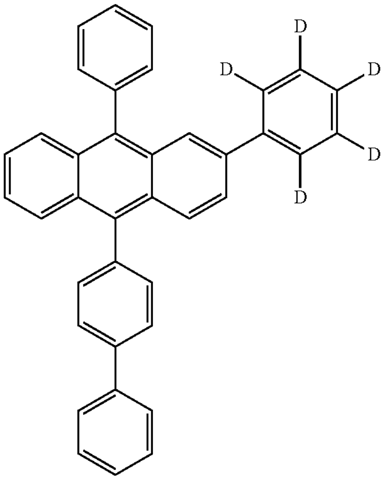

-continued
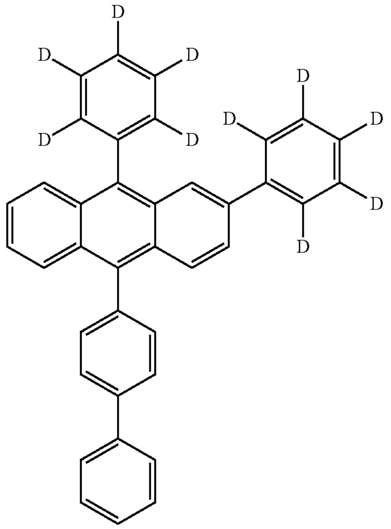
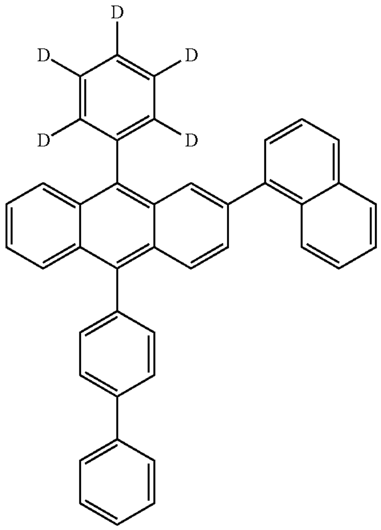
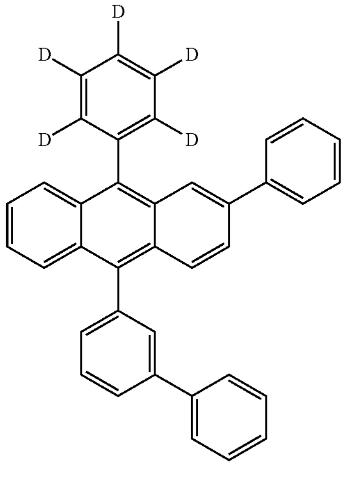
-continued
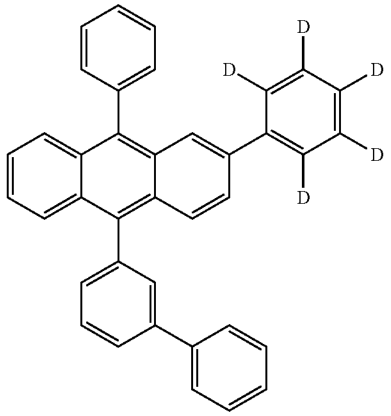
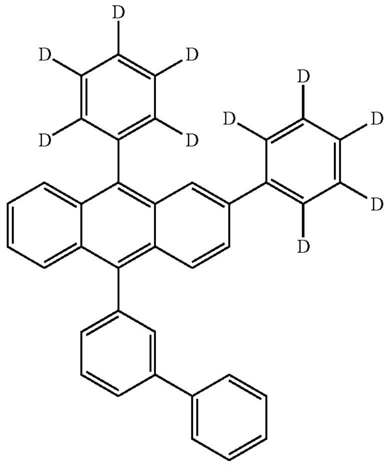
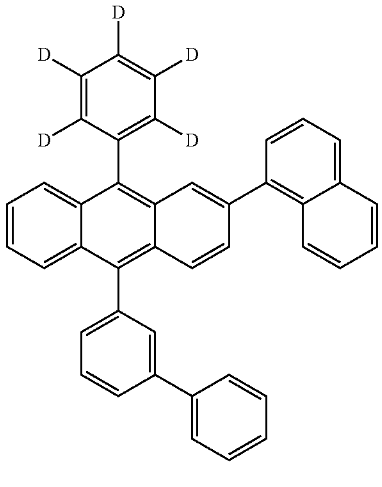

-continued
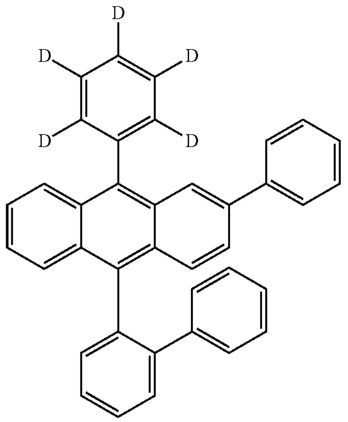
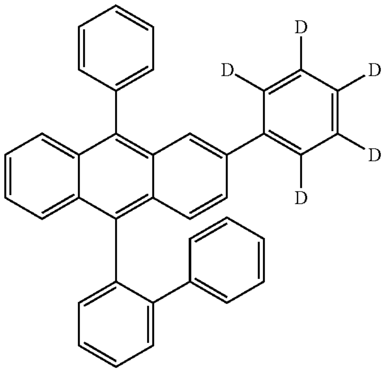
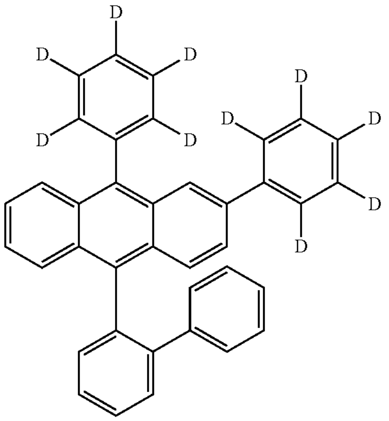
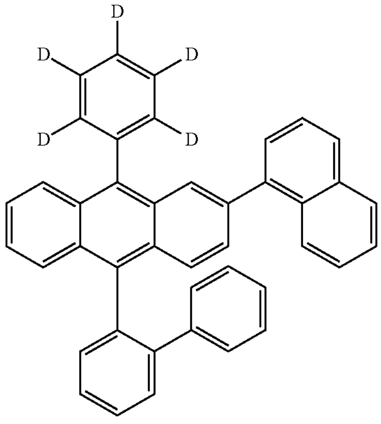
-continued
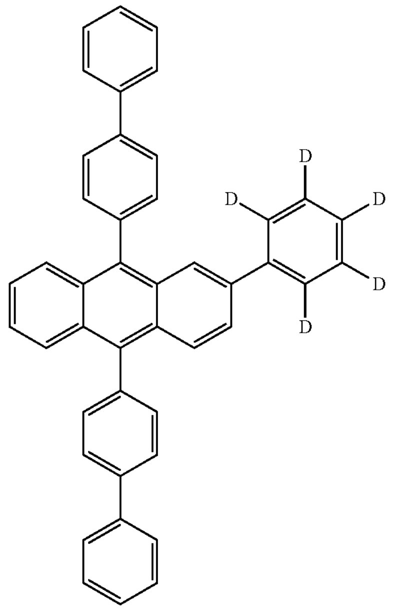
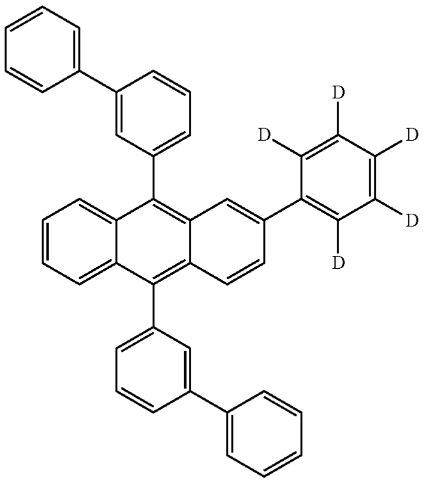
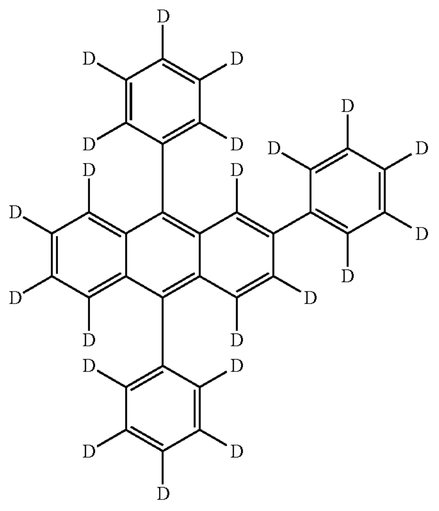

-continued

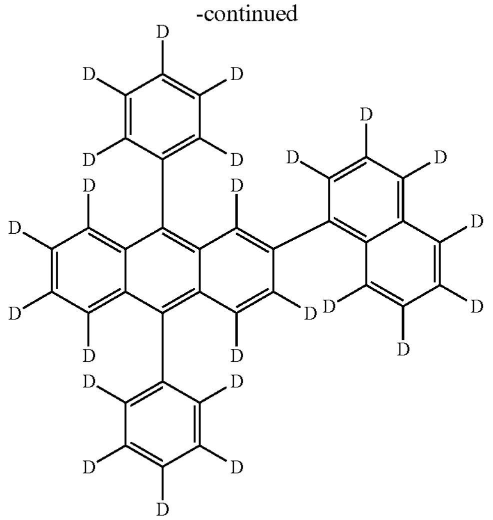

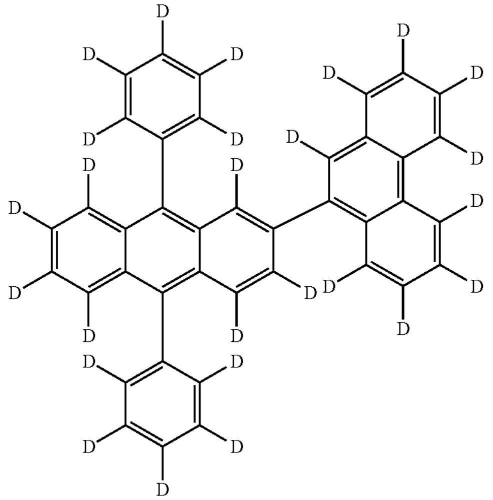

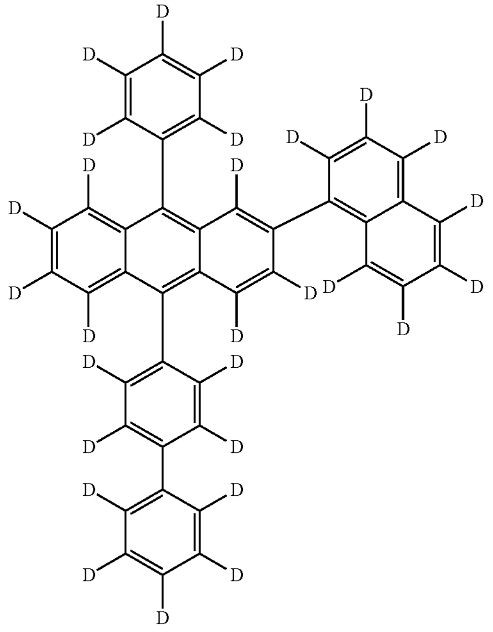

In an exemplary embodiment of the present specification, Formula 2 may be represented by the following Formula 2-1.

[Formula 2-1]

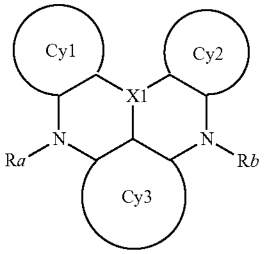

In Formula 2-1, definitions of Cy1 to Cy3, X1, Ra, and Rb are the same as those defined in Formula 2.

According to an exemplary embodiment of the present specification, Cy1 to Cy3 are the same as or different from each other, and are each independently a substituted or unsubstituted aromatic hydrocarbon ring having 6 to 60 carbon atoms; or a substituted or unsubstituted aromatic hetero ring having 2 to 60 carbon atoms, and Cy1 and Cy2 may be bonded to each other to form a substituted or unsubstituted ring.

According to another exemplary embodiment, Cy1 to Cy3 are the same as or different from each other, and are each independently a substituted or unsubstituted aromatic hydrocarbon ring having 6 to 30 carbon atoms; or a substituted or unsubstituted aromatic hetero ring having 2 to 30 carbon atoms, and Cy1 and Cy2 may be bonded to each other to form a substituted or unsubstituted ring.

According to an exemplary embodiment of the present specification, Ra is a substituted or unsubstituted alkyl group; a substituted or unsubstituted aryl group; or a substituted or unsubstituted heterocyclic group, or is bonded to Cy1 or Cy3 to form a substituted or unsubstituted ring.

According to an exemplary embodiment of the present specification, Ra is a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or is bonded to Cy1 or Cy3 to form a substituted or unsubstituted ring.

According to an exemplary embodiment of the present specification, Ra is a substituted or unsubstituted alkyl group having 1 to 20 carbon atoms; a substituted or unsubstituted aryl group having 6 to 30 carbon atoms; or a substituted or unsubstituted heterocyclic group having 2 to 30 carbon atoms, or is bonded to Cy1 or Cy3 to form a substituted or unsubstituted ring.

According to an exemplary embodiment of the present specification, Rb is a substituted or unsubstituted alkyl group; a substituted or unsubstituted aryl group; or a substituted or unsubstituted heterocyclic group, or is bonded to Cy1 or Cy3 to form a substituted or unsubstituted ring.

According to an exemplary embodiment of the present specification, Rb is a substituted or unsubstituted alkyl group having 1 to 60 carbon atoms; a substituted or unsubstituted aryl group having 6 to 60 carbon atoms; or a substituted or unsubstituted heterocyclic group having 2 to 60 carbon atoms, or is bonded to Cy1 or Cy3 to form a substituted or unsubstituted ring.

According to an exemplary embodiment of the present specification, Rb is a substituted or unsubstituted alkyl group having 1 to 20 carbon atoms; a substituted or unsubstituted aryl group having 6 to 30 carbon atoms; or a substituted or unsubstituted heterocyclic group having 2 to 30 carbon atoms, or is bonded to Cy1 or Cy3 to form a substituted or unsubstituted ring.
According to an exemplary embodiment of the present specification, the compound represented by Formula 2 may be any one of the following compounds, but is not limited thereto.
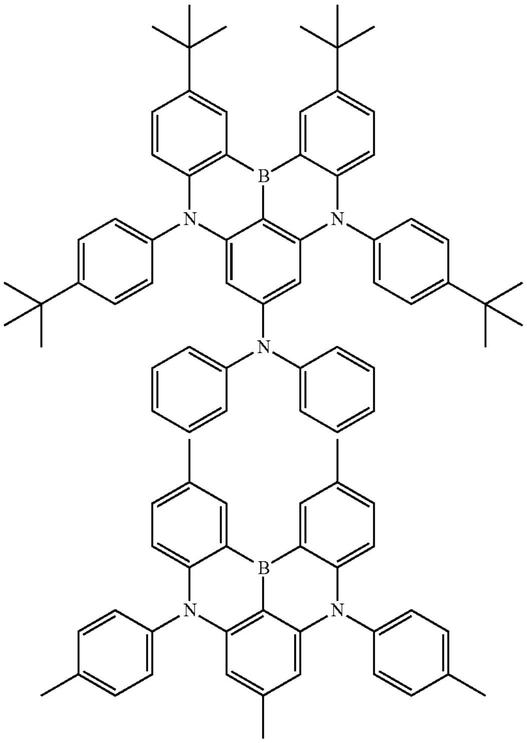
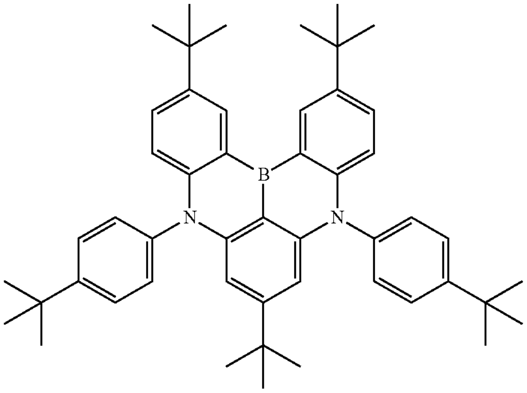
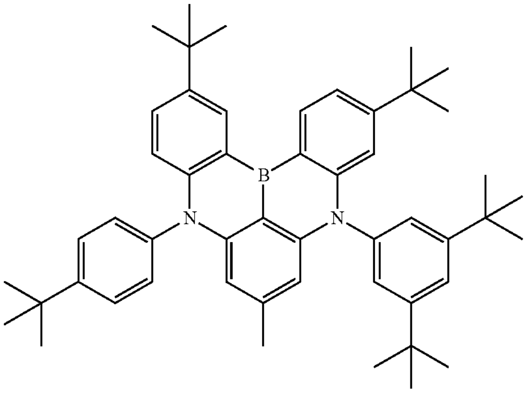
-continued
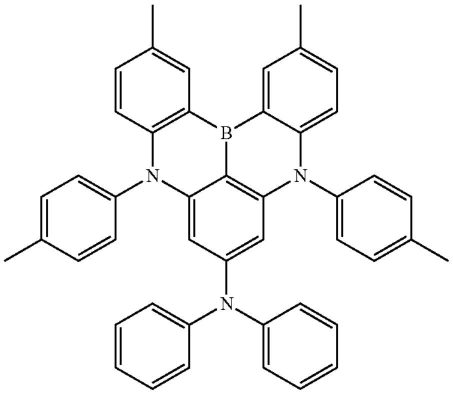
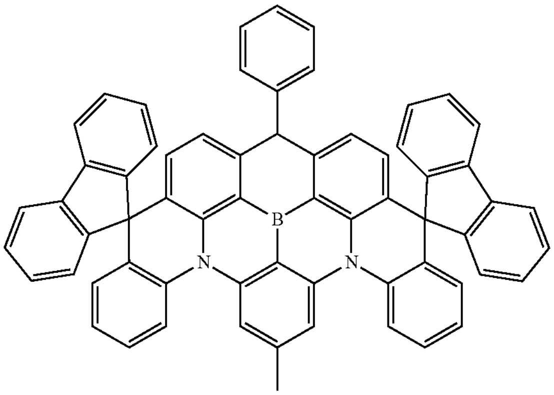
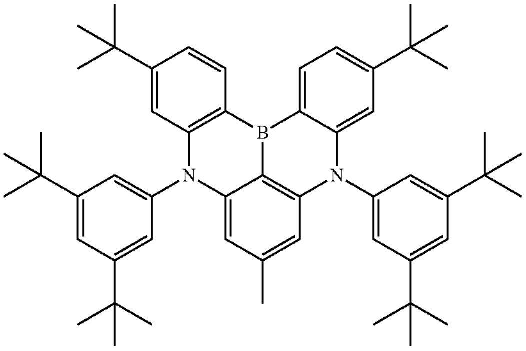
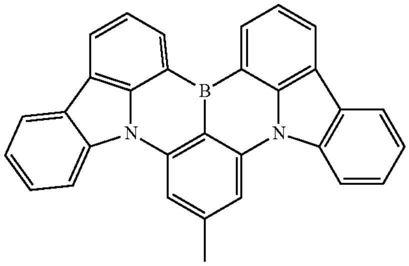

-continued
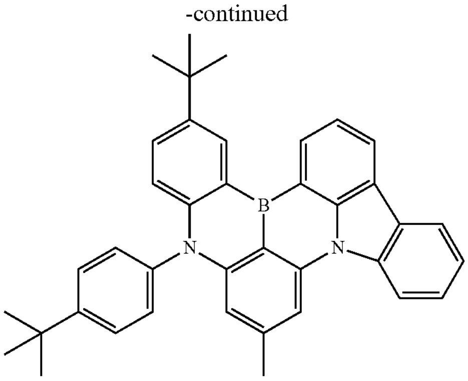
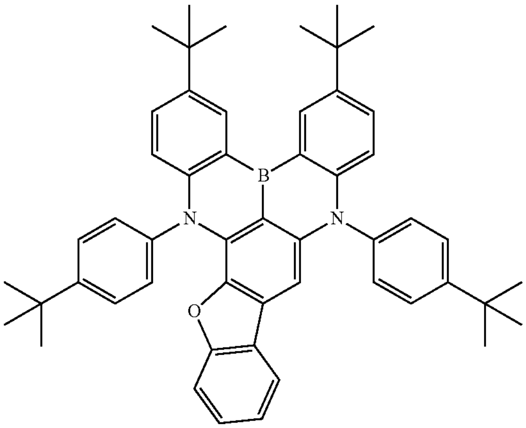
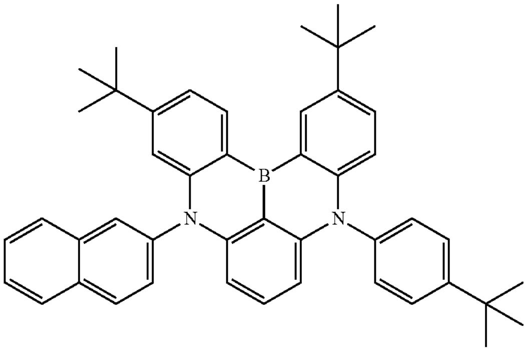
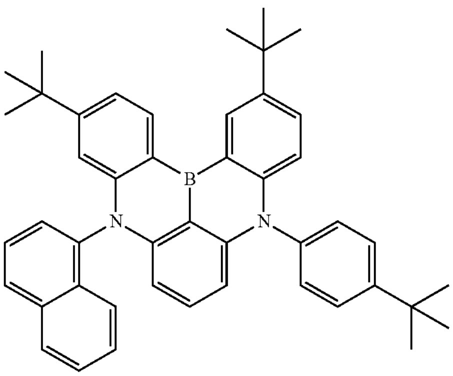
-continued
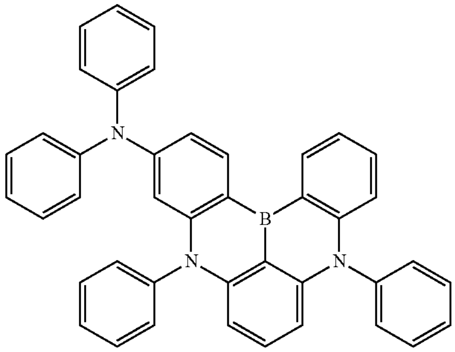
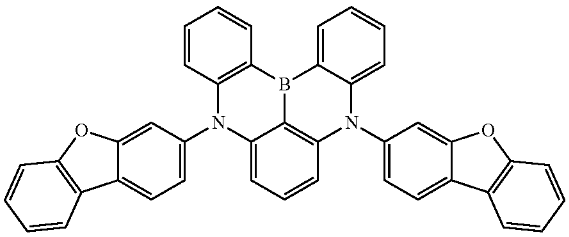
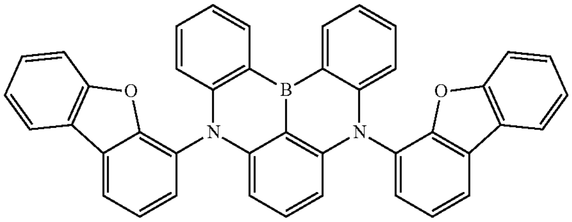
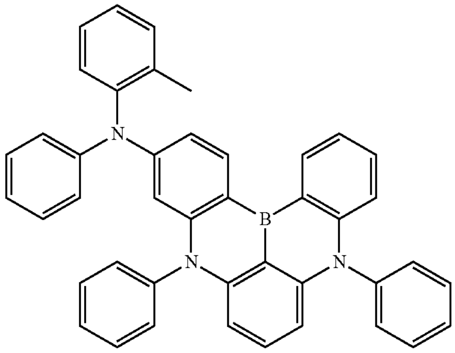
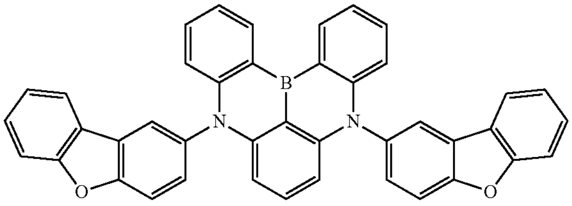
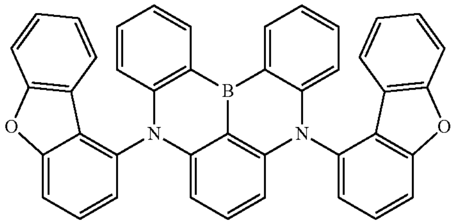

-continued
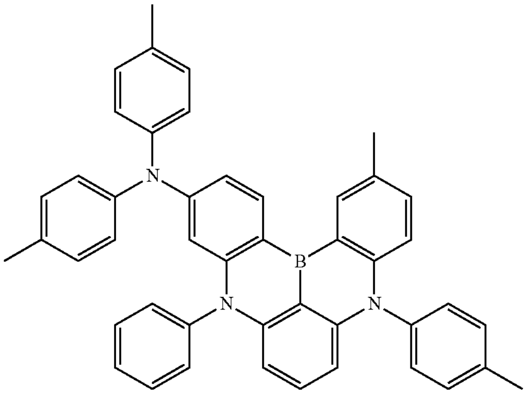
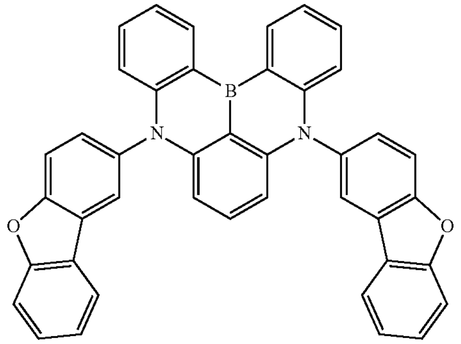
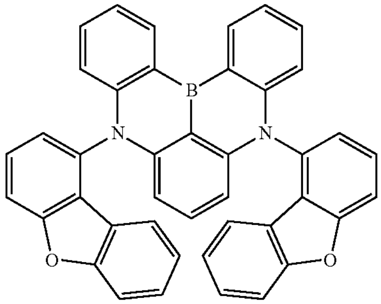
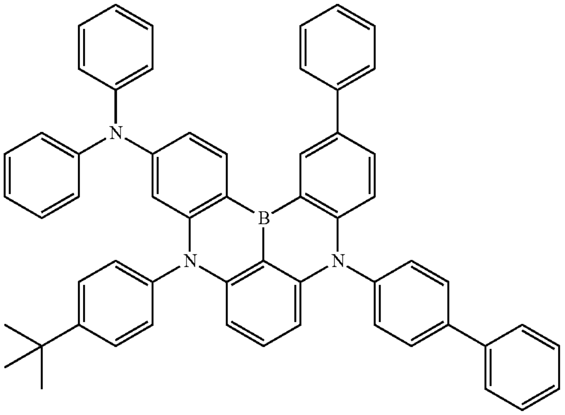
-continued
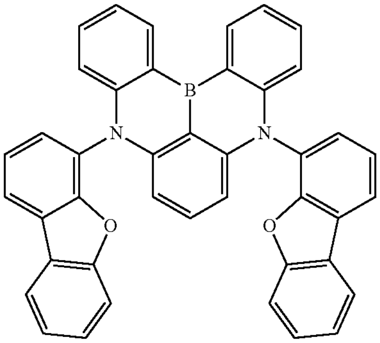
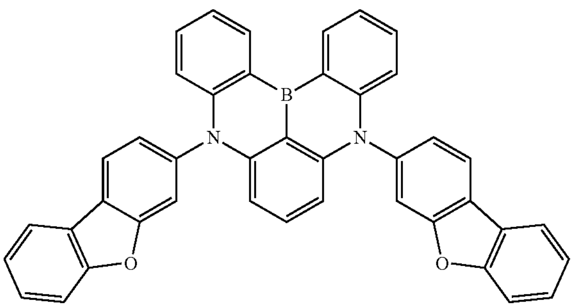
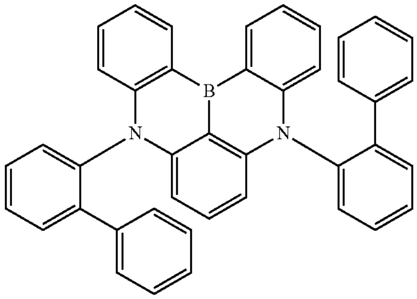
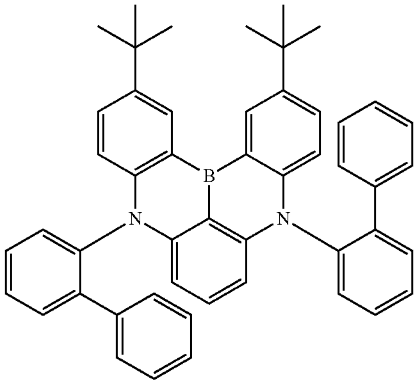
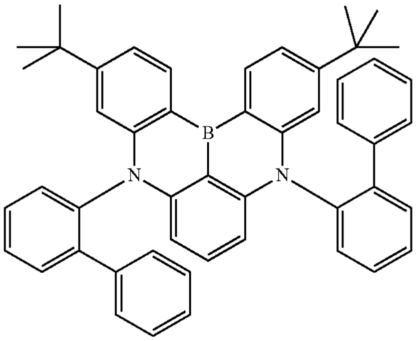

-continued
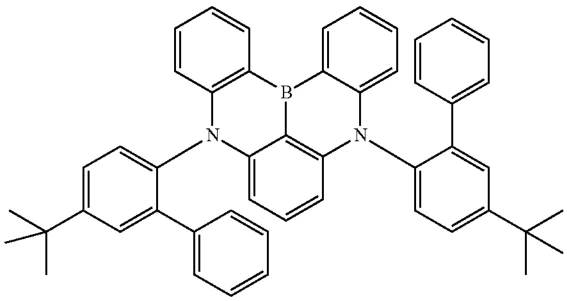
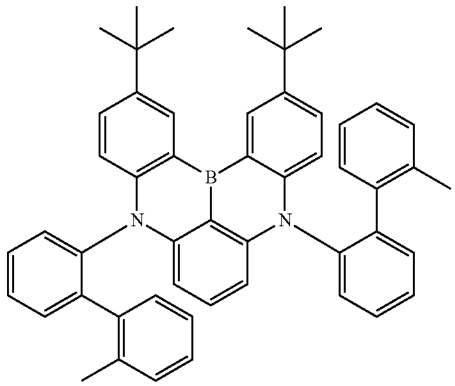
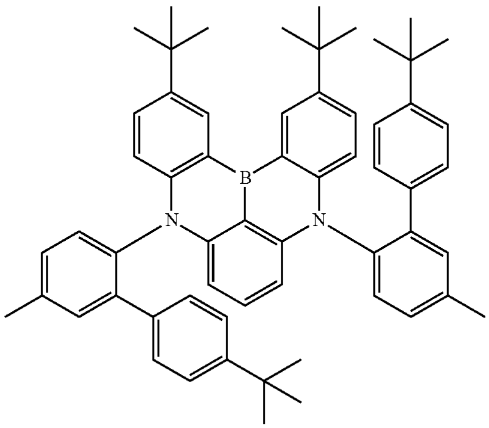
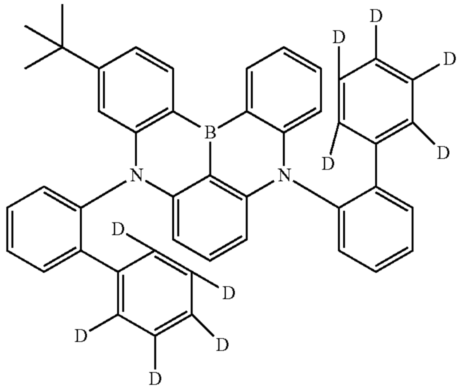
-continued
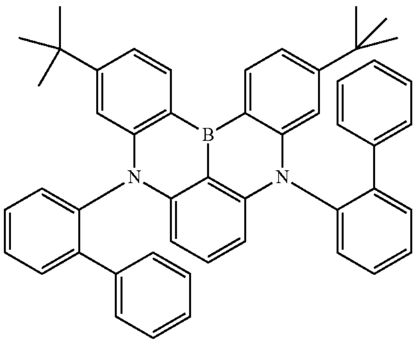
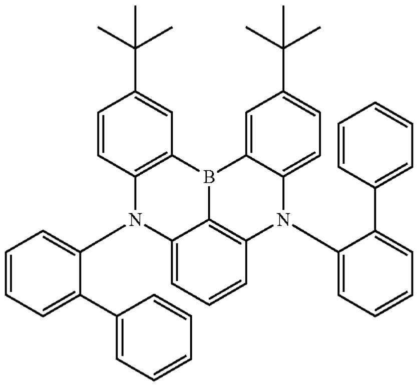
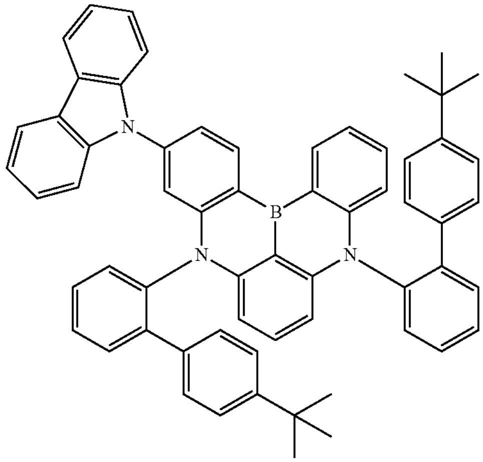
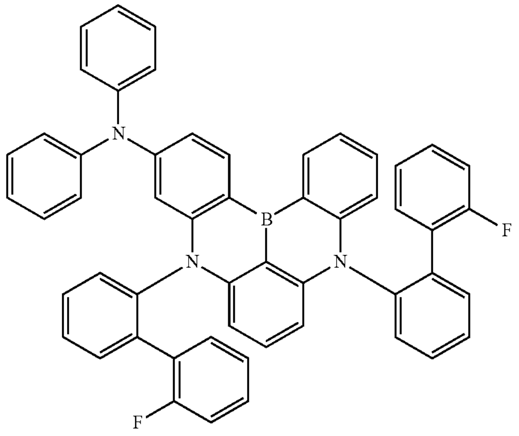

-continued
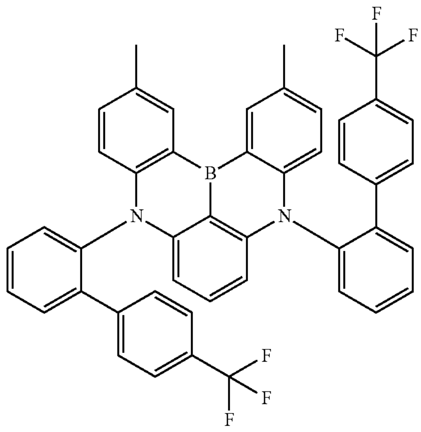
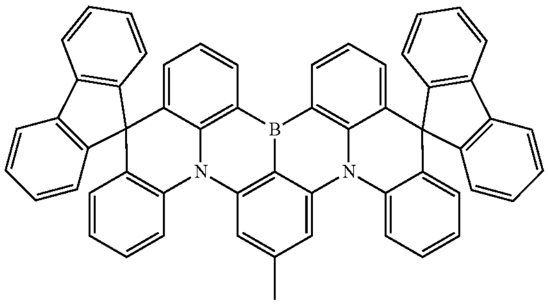
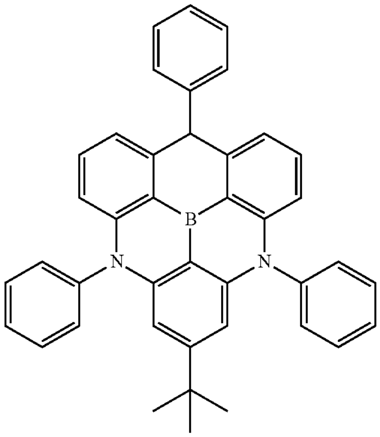
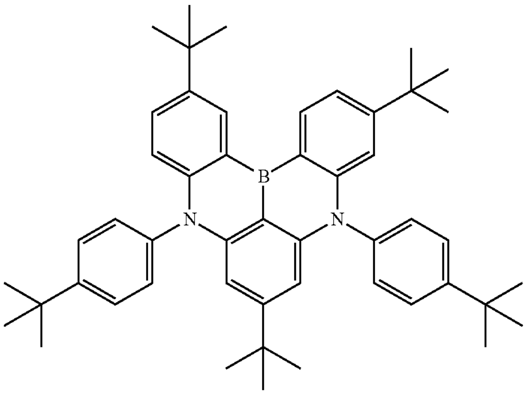
-continued
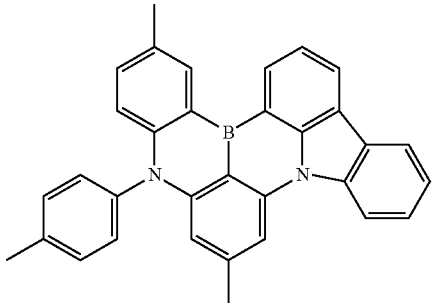
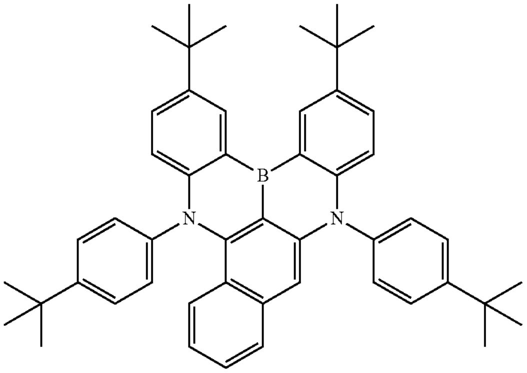
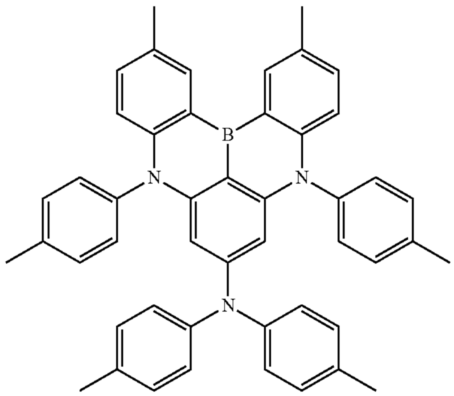
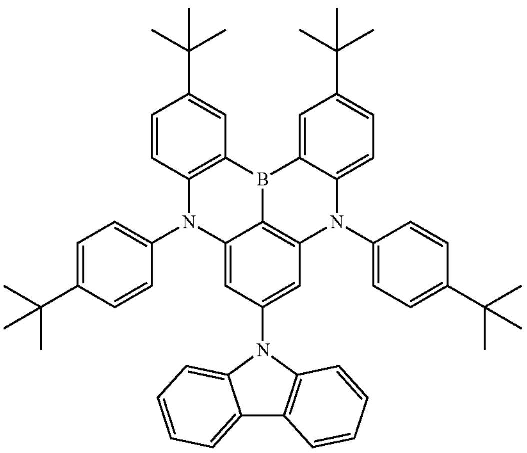

-continued
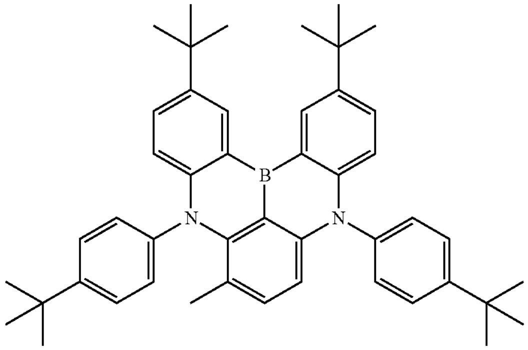
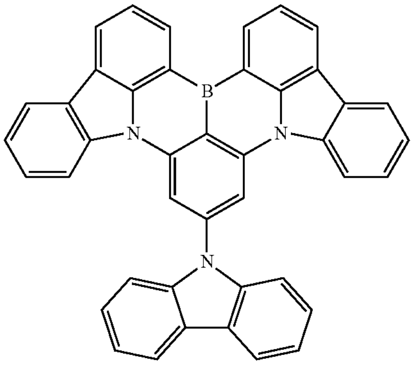
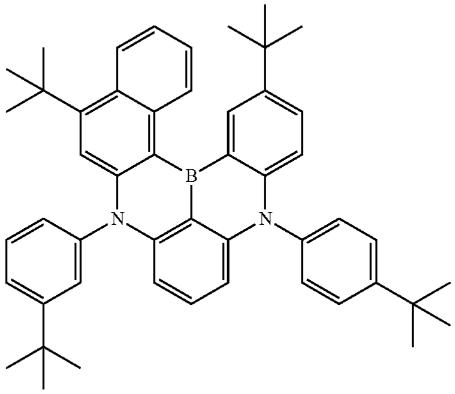
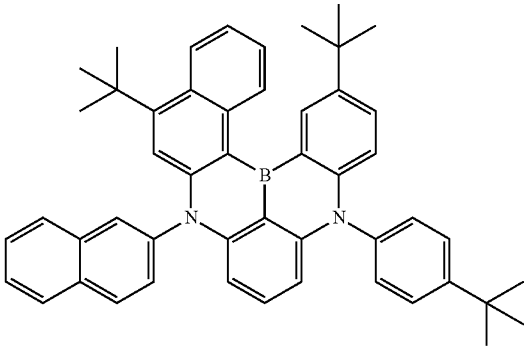
-continued
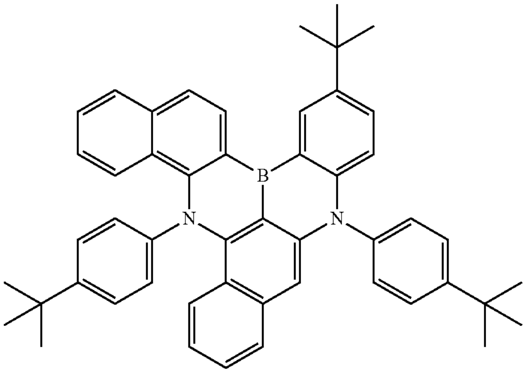
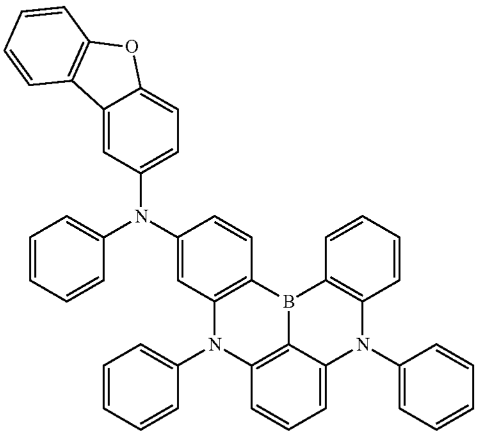
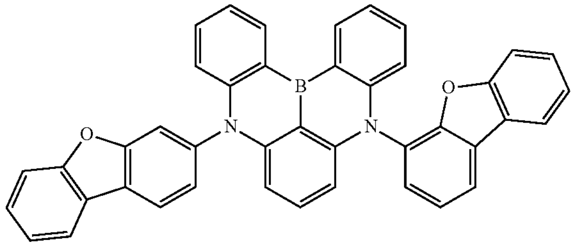
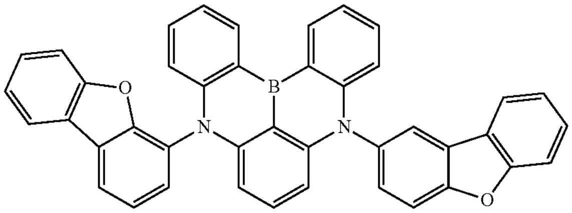
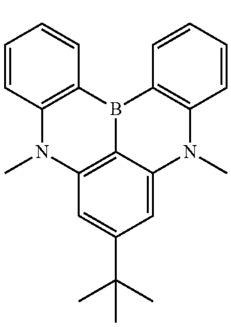

-continued
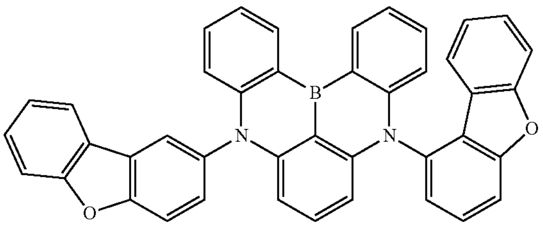
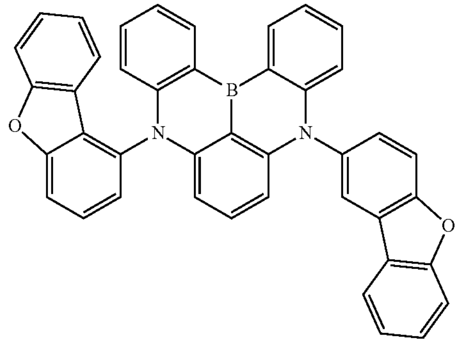
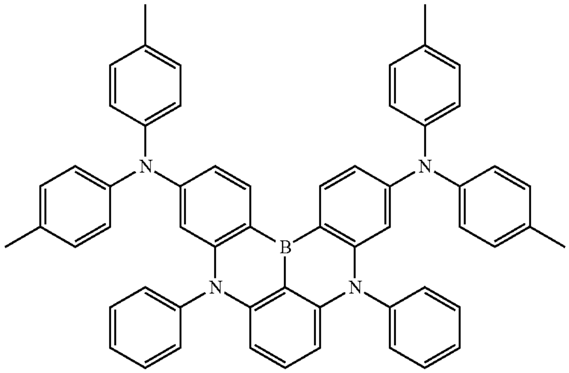
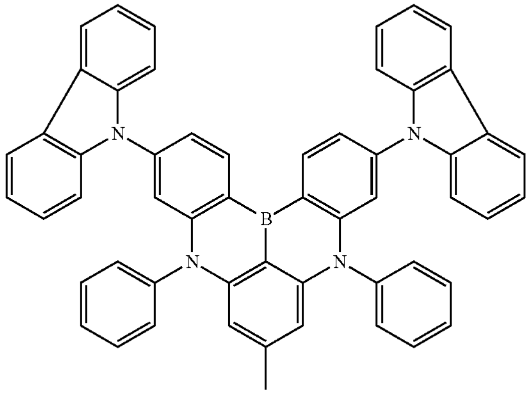
-continued
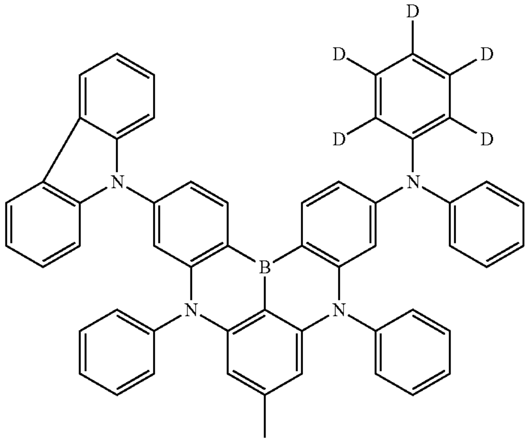
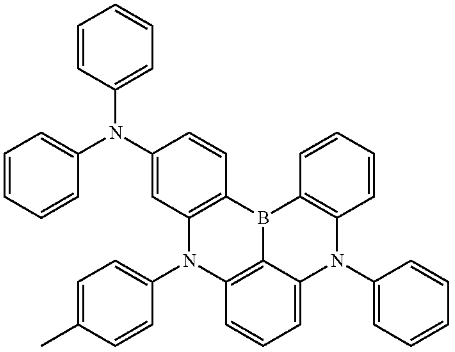
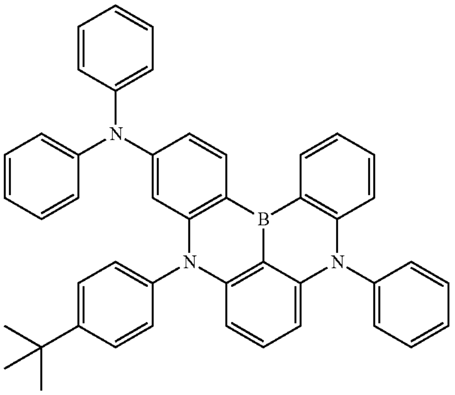
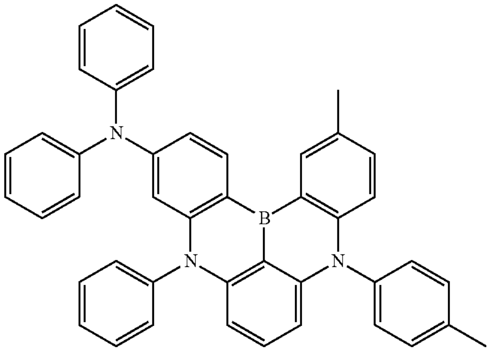

-continued
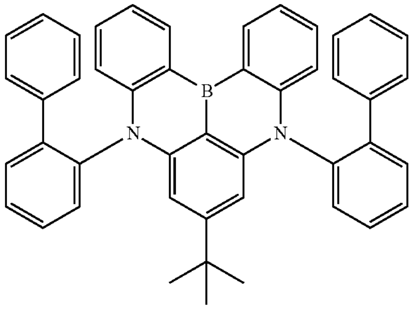
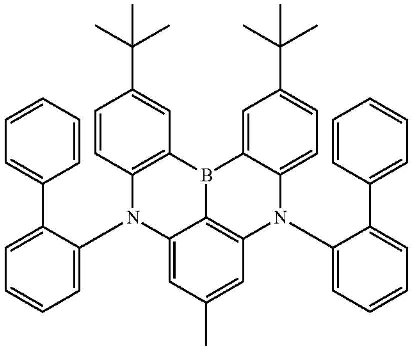
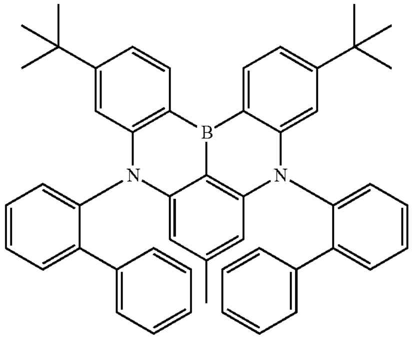
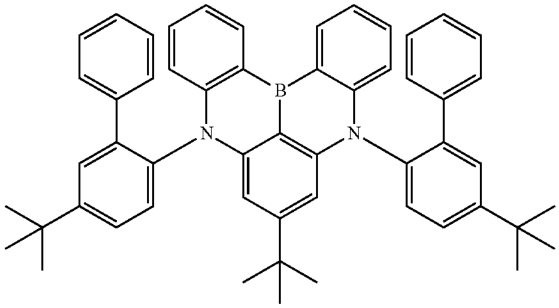
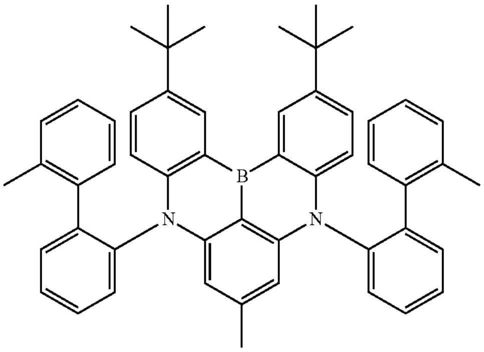
-continued
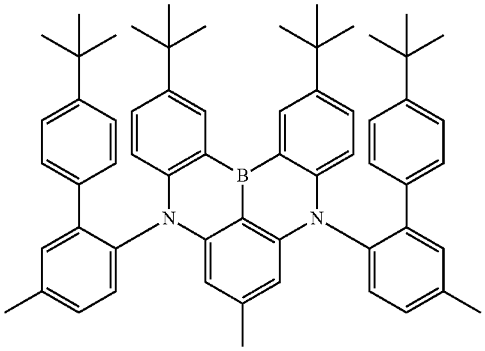
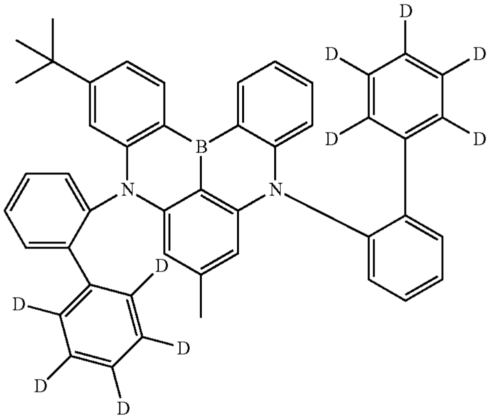
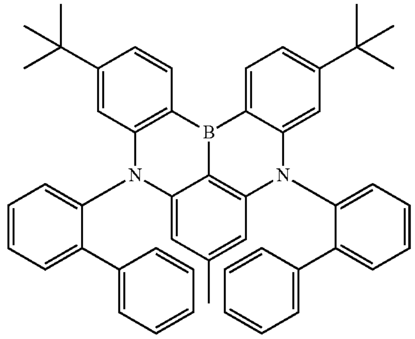
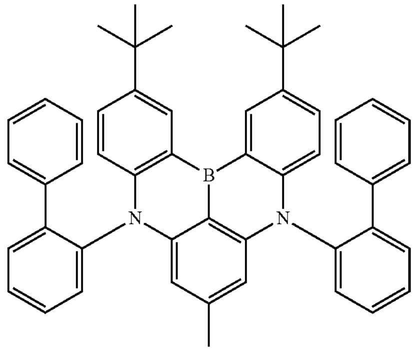

-continued
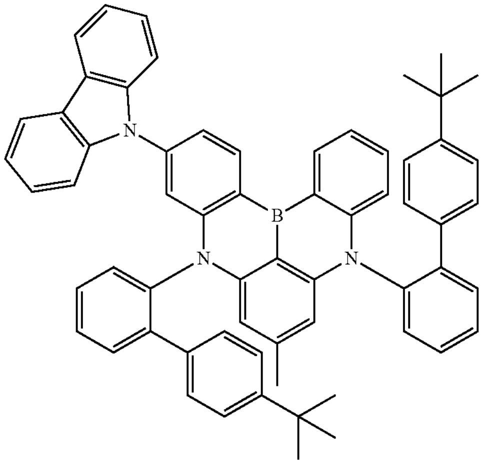
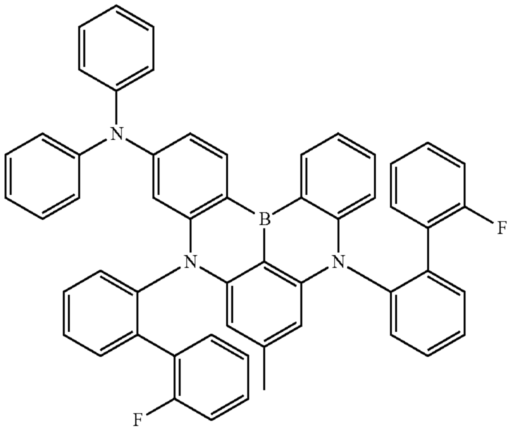
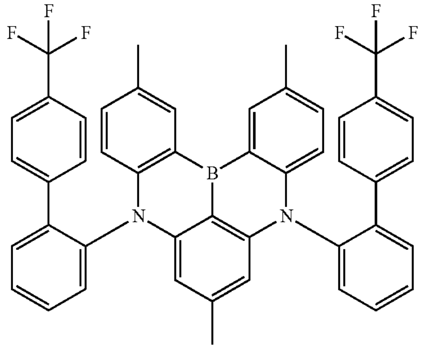
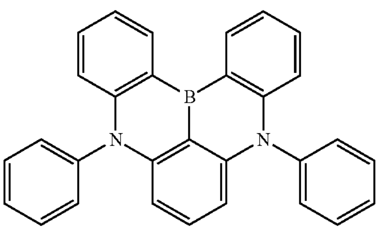
-continued
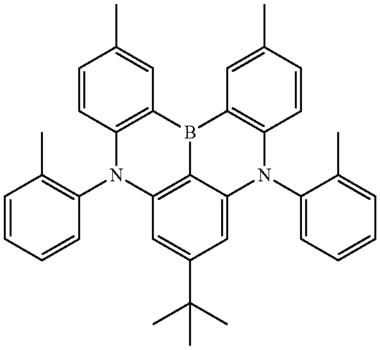
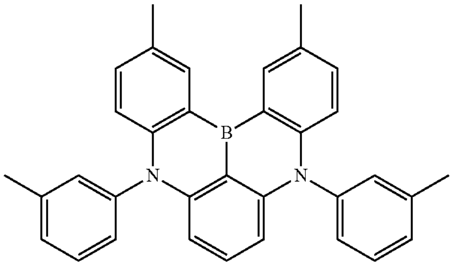
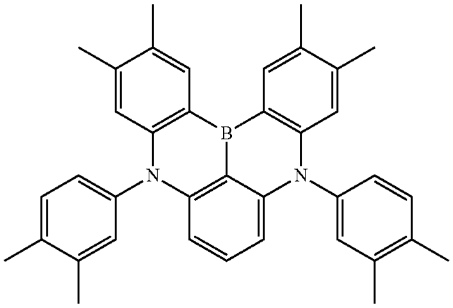
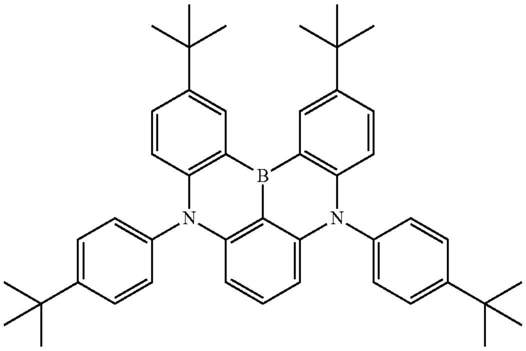
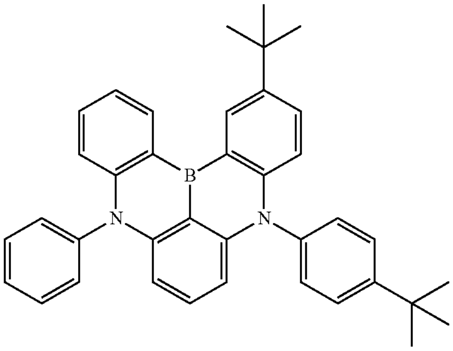

-continued
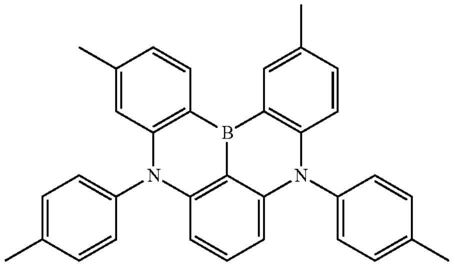
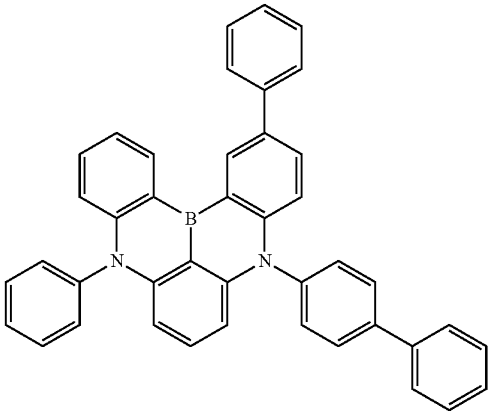
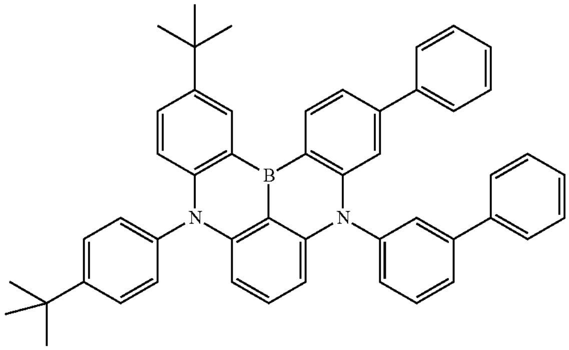
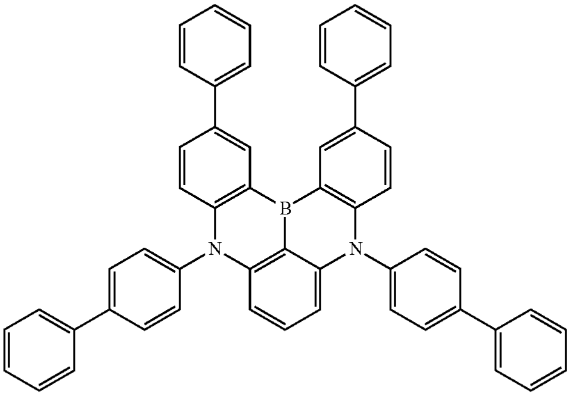
-continued
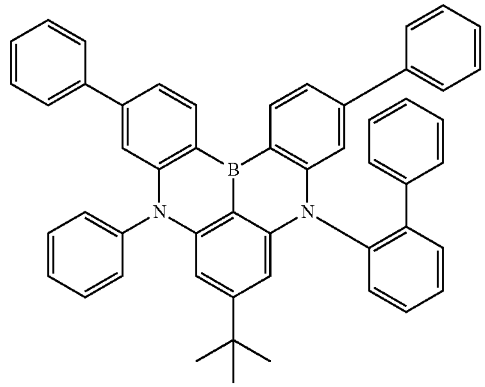
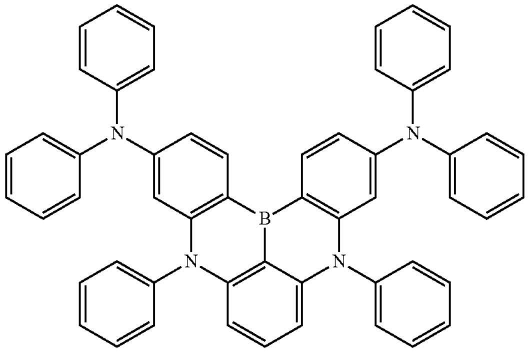
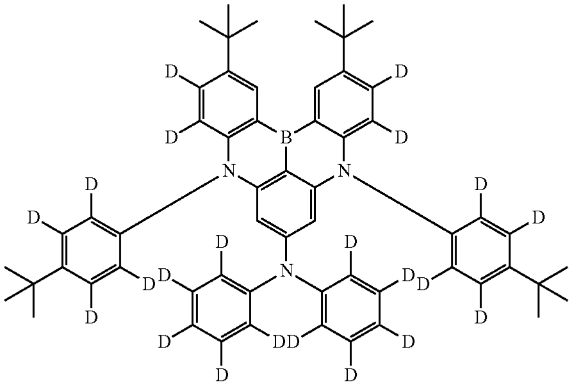
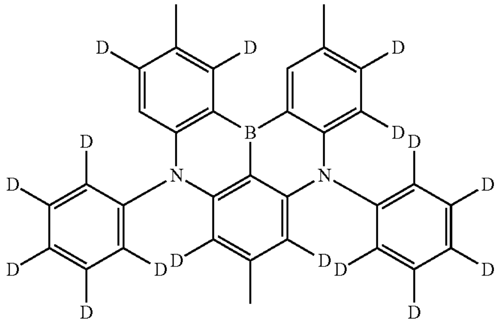

-continued
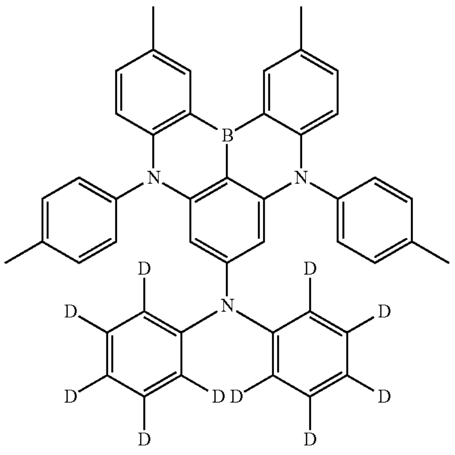
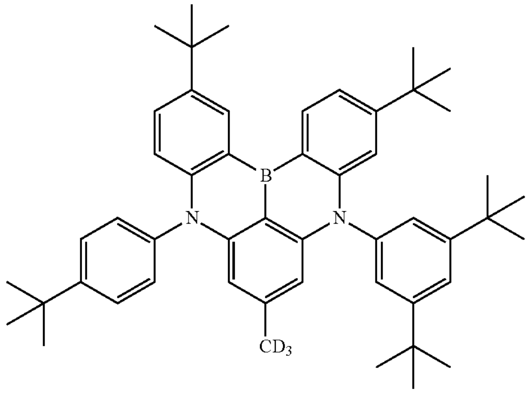
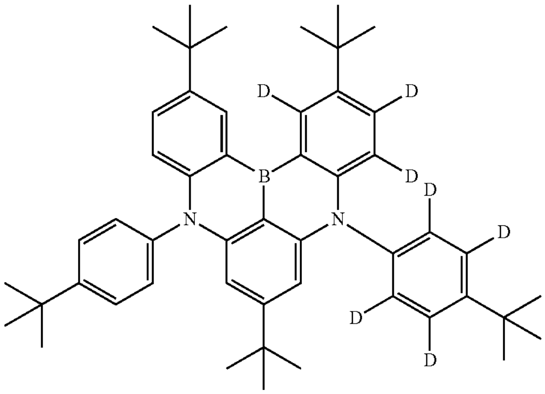
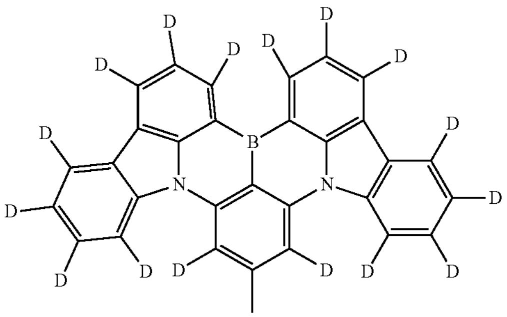
-continued
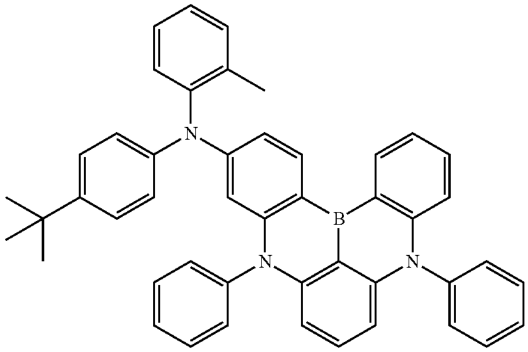
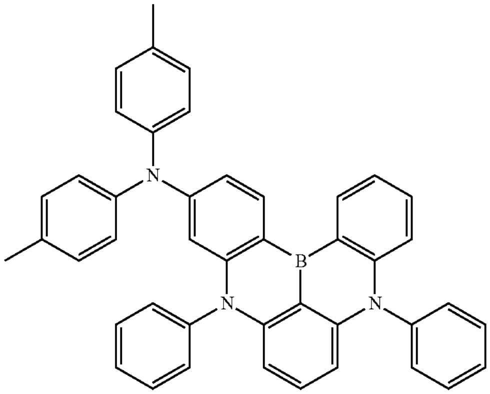
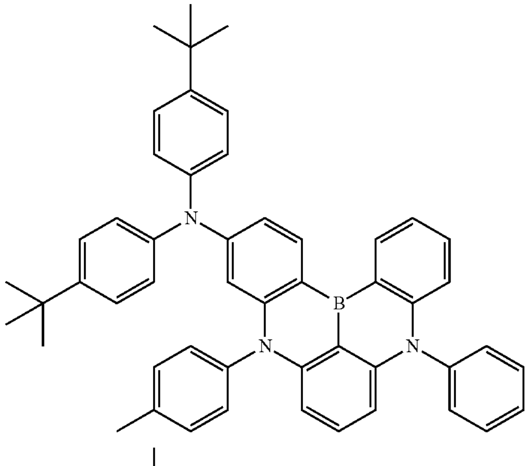
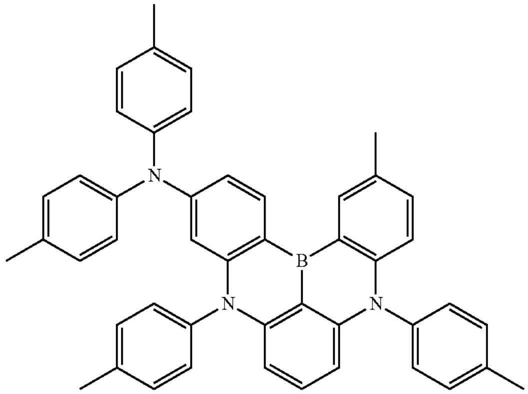

-continued
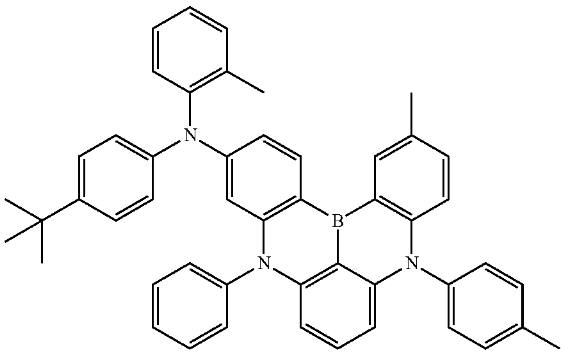
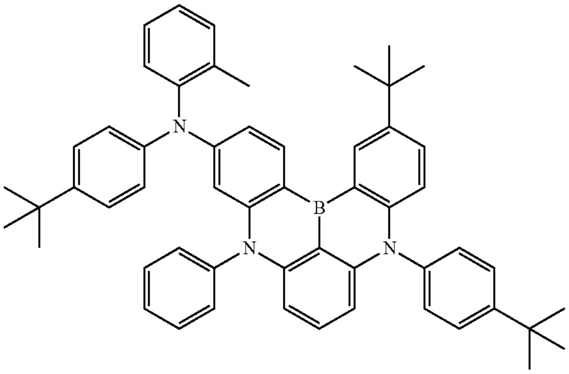
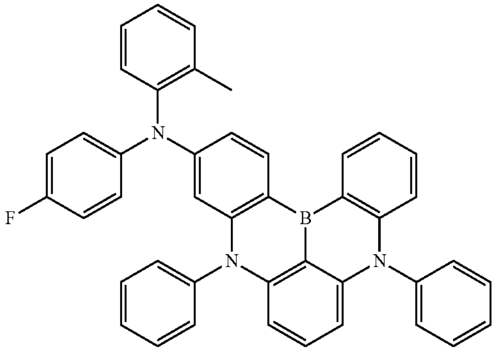
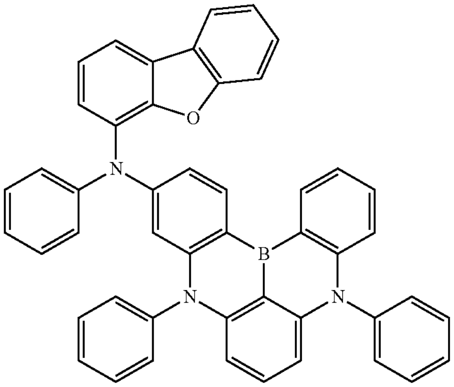
-continued
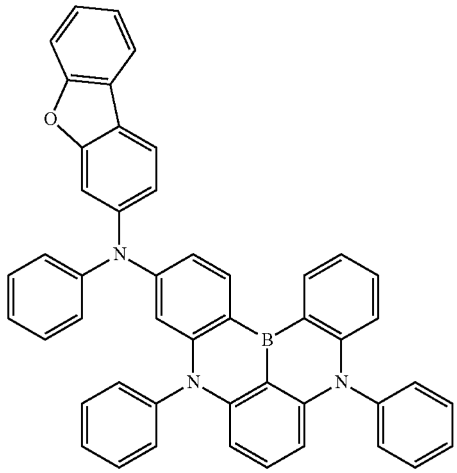
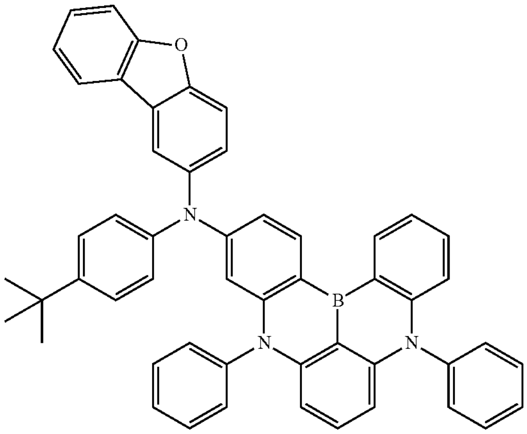
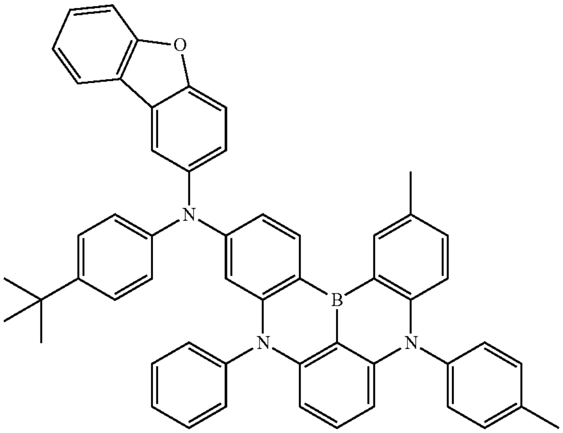

-continued
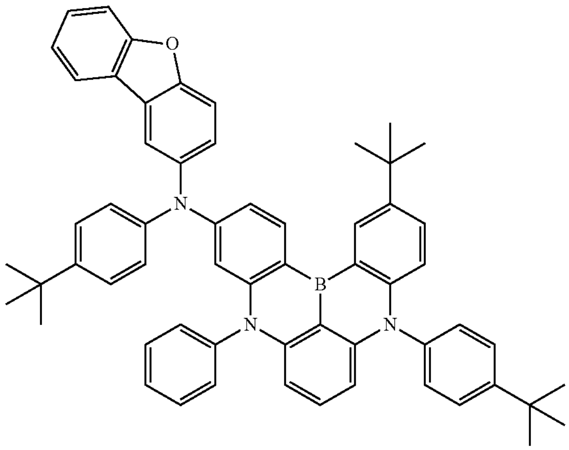
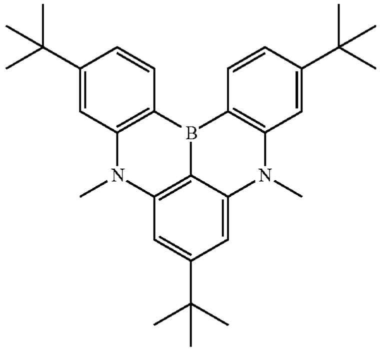
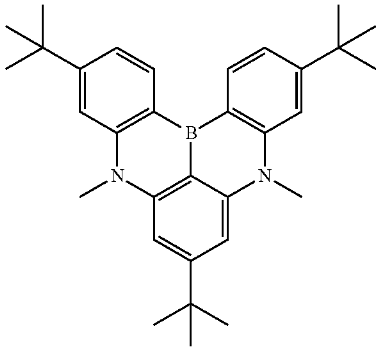
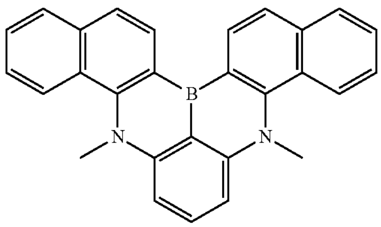
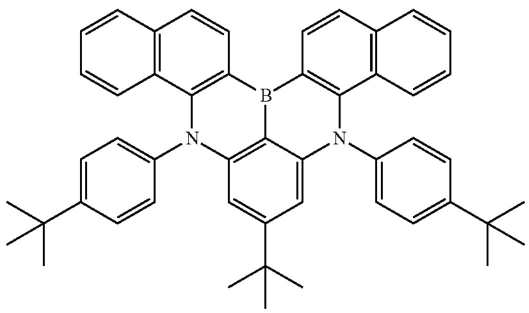
-continued
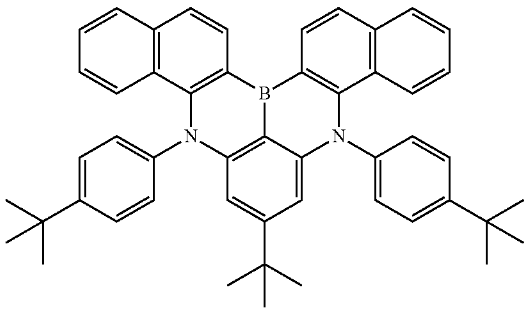
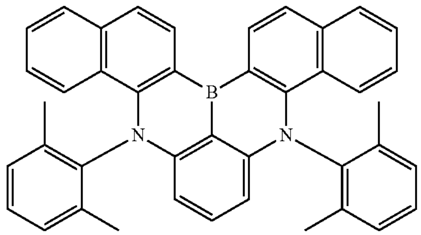
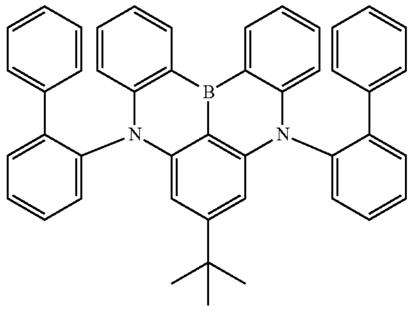
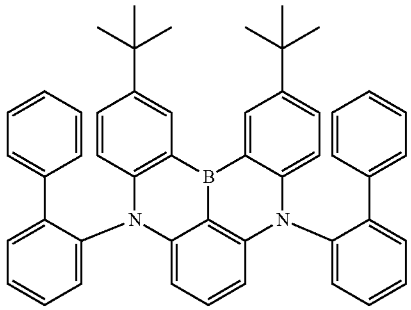
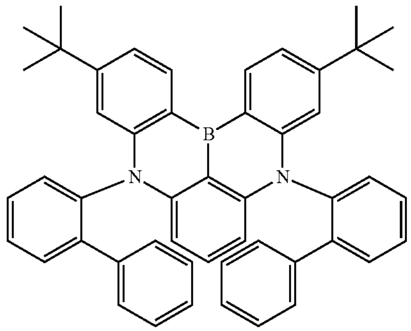

-continued
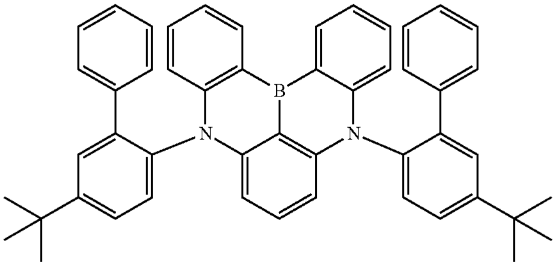
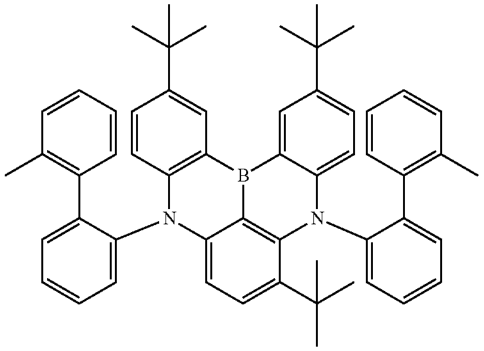
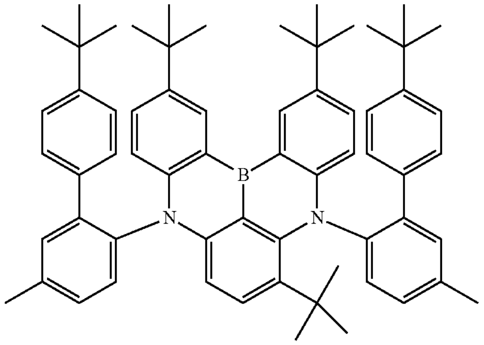
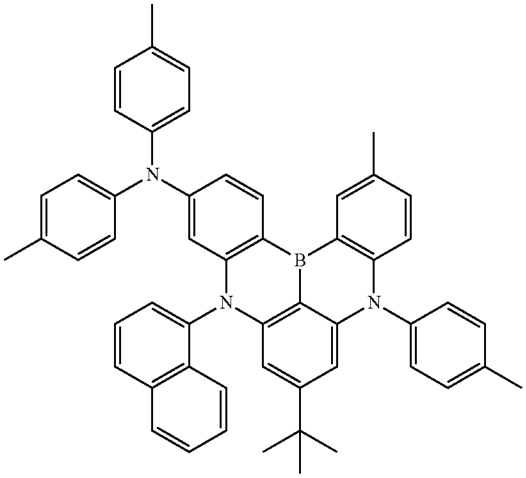
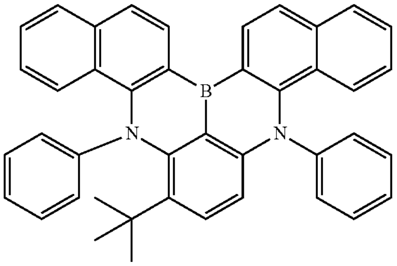
-continued
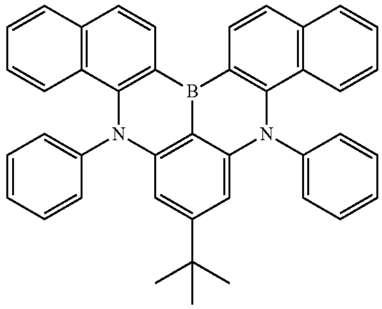
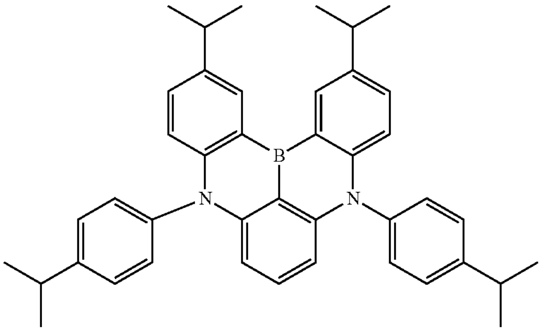
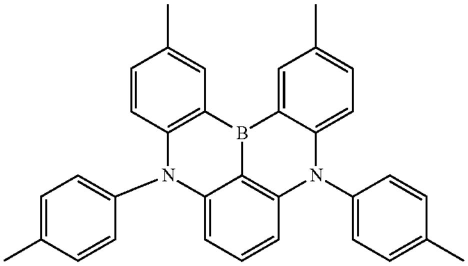
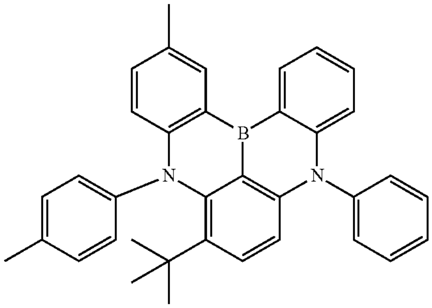
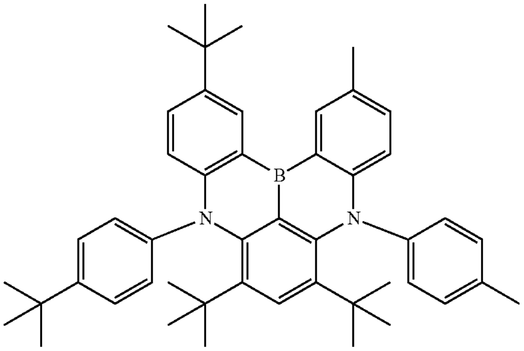

-continued
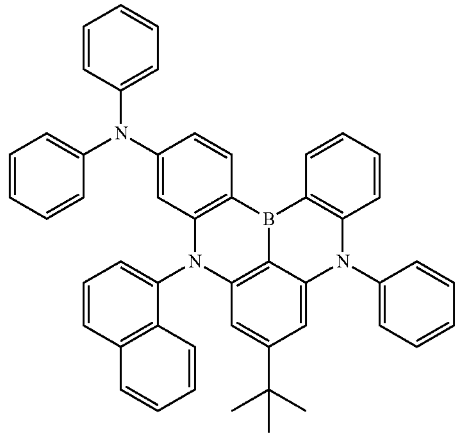
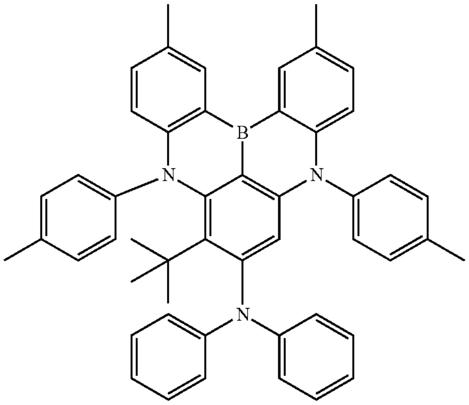
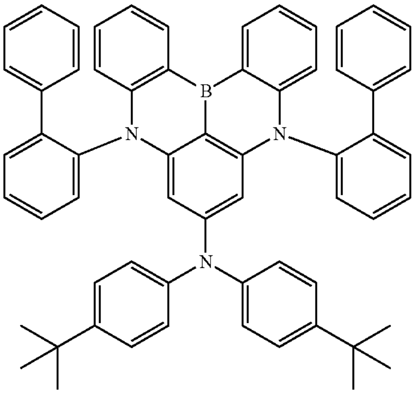
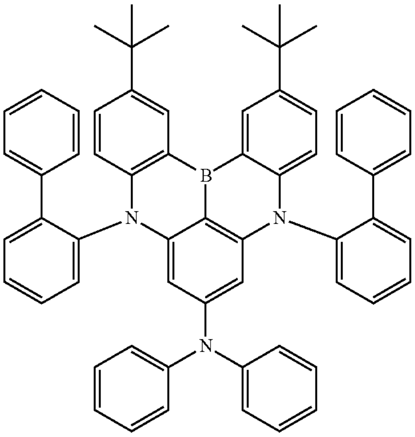
-continued
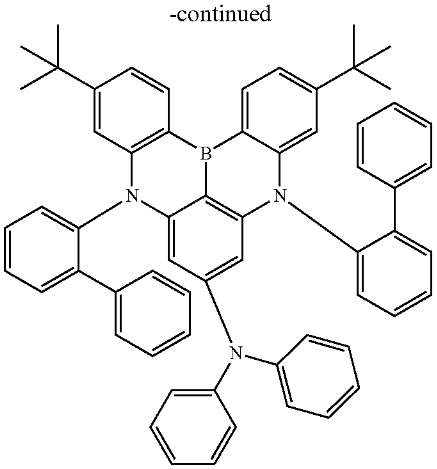
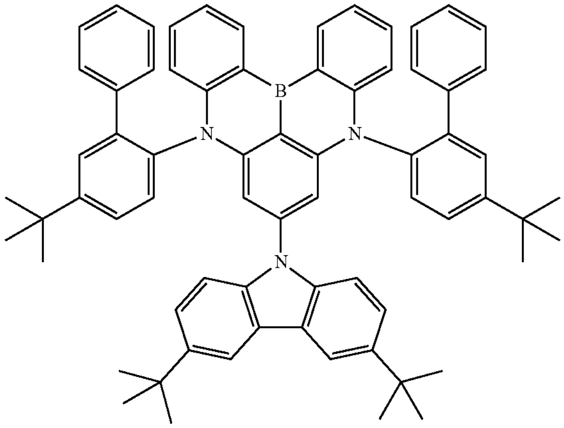
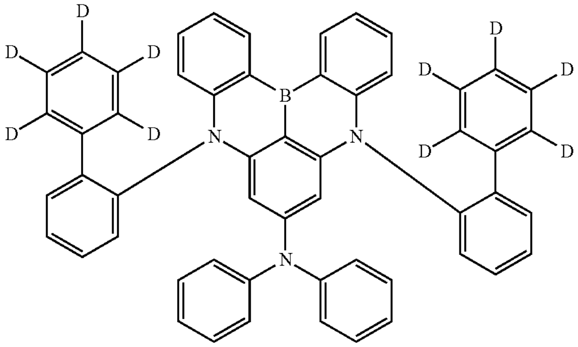
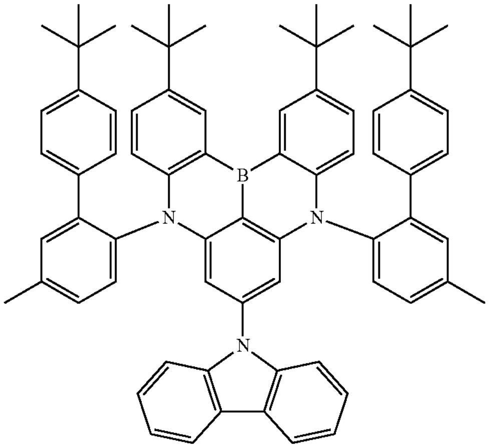
In the compound represented by Formula 1 according to an exemplary embodiment of the present invention, a core structure may be prepared as in the following Reaction Formula 1 or 2, and in the compound represented by Formula 2 according to an exemplary embodiment of the present invention, a core structure may be prepared as in the following Reaction Formula 3. The substituents of Formulae 1 and 2 prepared in the following Reaction Formulae 1 to 3 may be bonded by methods known in the art, and the type or position of the substituent, or the number of substituents may be changed according to the technology known in the art.

<Reaction Formula 1>

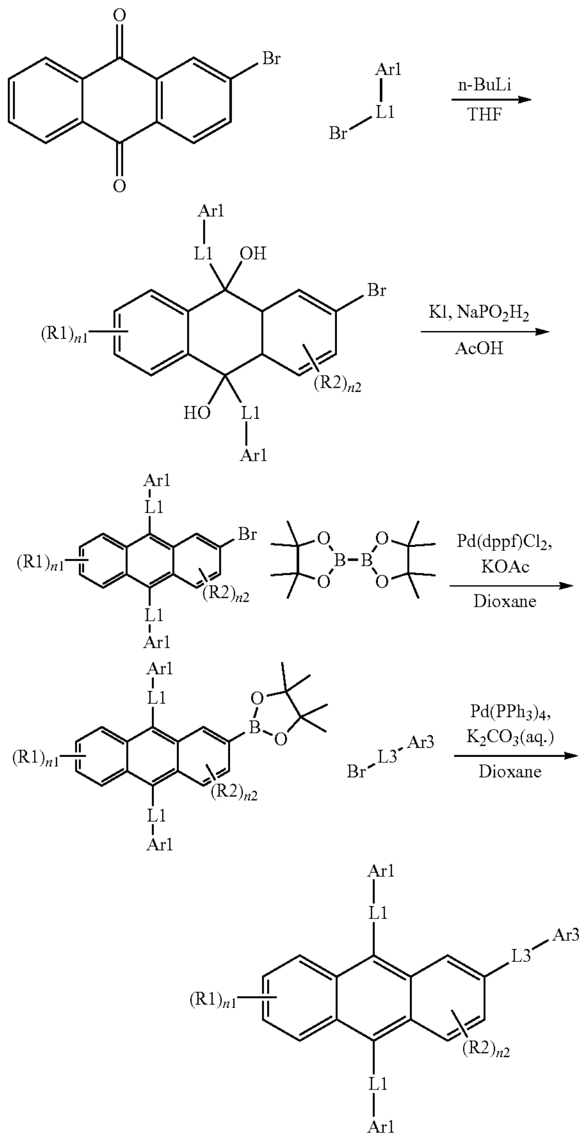

In Reaction Formula 1, definitions of L1, L3, Ar1, Ar3, R1, R2, n1, and n2 are the same as those defined in the above-described Formula 1.

<Reaction Formula 2>

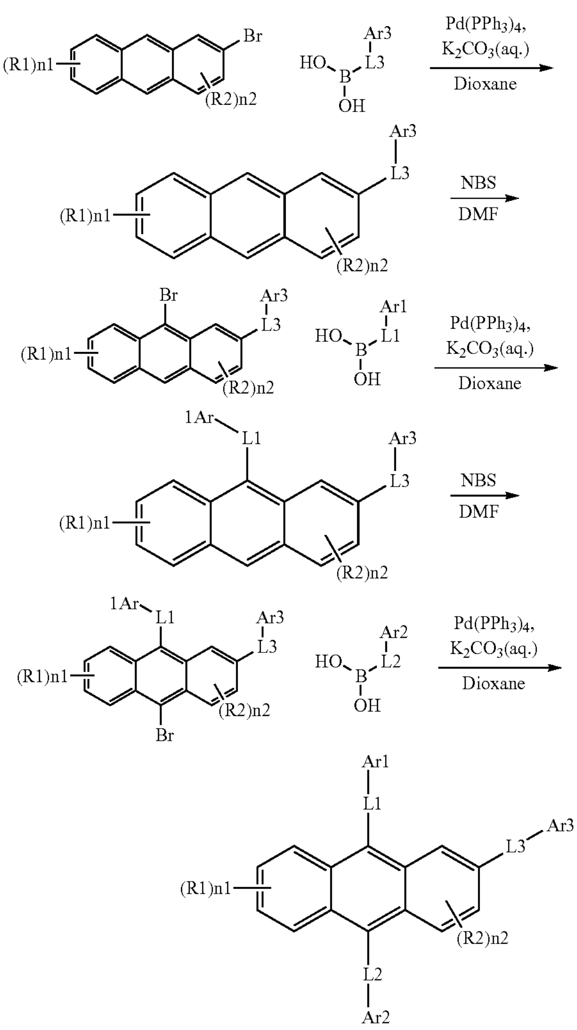

In Reaction Formula 2, definitions of L1 to L3, Ar1 to Ar3, R1, R2, n1, and n2 are the same as those defined in the above-described Formula 1.

<Reaction Formula 3>

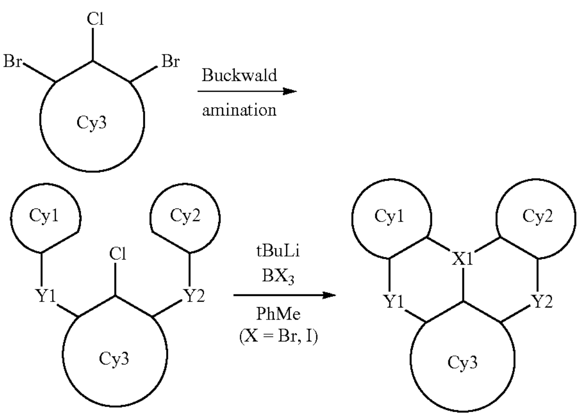

In Reaction Formula 3, definitions of Cy1 to Cy3, Y1, Y2, and X1 are the same as those defined in the above-described Formula 2.

In the present specification, compounds having various energy bandgaps may be synthesized by introducing various substituents into the core structures prepared in Reaction Formulae 1 to 3. Further, in the present specification, various substituents may be introduced into the core structures prepared in Reaction Formulae 1 to 3 to adjust the HOMO and LUMO energy levels of a compound.

The organic light emitting device of the present specification may be manufactured by typical manufacturing methods and materials of an organic light emitting device, except that a light emitting layer is formed using the above-described compounds represented by Formulae 1 and 2.

The compounds represented by Formulae 1 to 2 may be formed as an organic material layer by not only a vacuum deposition method, but also a solution application when an organic light emitting device is manufactured. Here, the solution application method means spin coating, dip coating, inkjet printing, screen printing, a spray method, roll coating, and the like, but is not limited thereto.

The organic material layer of the organic light emitting device of the present specification may be composed of a single-layered structure, but may also be composed of a multi-layered structure in which two or more organic material layers are stacked. For example, the organic light emitting device of the present specification may have a structure including one or more layers of a hole transport layer, a hole injection layer, an electron blocking layer, an electron transport and injection layer, an electron transport layer, an electron injection layer, a hole blocking layer, and an hole transport and injection layer, as organic material layers. However, the structure of the organic light emitting device is not limited thereto, and may include a fewer or greater number of organic material layers.

The organic light emitting device of the present specification includes an organic material layer including a light emitting layer, and the light emitting layer includes the compound represented by Formula 1 and the compound represented by Formula 2. The compound represented by Formula 2 may be included in an amount of 1 part by weight to 20 parts by weight based on 100 parts by weight of the compound represented by Formula 1, and according to an example, may be included in an amount of 1 part by weight to 10 parts by weight based on 100 parts by weight of the compound represented by Formula 1. When the content of the compound represented by Formula 2 satisfies the above-range, there is an advantage in that the manufactured organic light emitting device has a low driving voltage, high light emitting efficiency, and a long service life.

According to an exemplary embodiment of the present specification, the light emitting layer of the organic light emitting device includes the compound represented by Formula 1 as a host of the light emitting layer, and includes the compound represented by Formula 2 as a dopant of the light emitting layer.

In the organic light emitting device of the present invention, the organic material layer may include an electron blocking layer, and as the electron blocking layer, materials known in the art may be used.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device may have, for example, a stacking structure described below, but the stacking structure is not limited thereto.

(1) Positive electrode/Hole transport layer/Light emitting layer/Negative electrode (2) Positive electrode/Hole injection layer/Hole transport layer/Light emitting layer/Negative electrode (3) Positive electrode/Hole transport layer/Light emitting layer/Electron transport layer/Negative electrode (4) Positive electrode/Hole transport layer/Light emitting layer/Electron transport layer/Electron injection layer/Negative electrode (5) Positive electrode/Hole injection layer/Hole transport layer/Light emitting layer/Electron transport layer/Negative electrode (6) Positive electrode/Hole injection layer/Hole transport layer/Light emitting layer/Electron transport layer/Electron injection layer/Negative electrode (7) Positive electrode/Hole transport layer/Electron blocking layer/Light emitting layer/Electron transport layer/Negative electrode (8) Positive electrode/Hole transport layer/Electron blocking layer/Light emitting layer/Electron transport layer/Electron injection layer/Negative electrode (9) Positive electrode/Hole injection layer/Hole transport layer/Electron blocking layer/Light emitting layer/Electron transport layer/Negative electrode

(10) Positive electrode/Hole injection layer/Hole transport layer/Electron blocking layer/Light emitting layer/Electron transport layer/Electron injection layer/Negative electrode

(11) Positive electrode/Hole transport layer/Light emitting layer/Hole blocking layer/Electron transport layer/Negative electrode

(12) Positive electrode/Hole transport layer/Light emitting layer/Hole blocking layer/Electron transport layer/Electron injection layer/Negative electrode

(13) Positive electrode/Hole injection layer/Hole transport layer/Light emitting layer/Hole blocking layer/Electron transport layer/Negative electrode

(14) Positive electrode/Hole injection layer/Hole transport layer/Light emitting layer/Hole blocking layer/Electron transport layer/Electron injection layer/Negative electrode

(15) Positive electrode/Hole injection layer/First hole transport layer/Second hole transport layer/Light emitting layer/Electron transport layer/Electron injection layer/Negative electrode The structure of the organic light emitting device of the present invention may have structures illustrated in FIGS. 1 and 2, but is not limited thereto.

FIG. 1 exemplifies a structure of an organic light emitting device in which a positive electrode 2, a light emitting layer 3, and a negative electrode 4 are sequentially stacked on a substrate 1.

FIG. 2 exemplifies a structure of an organic light emitting device in which a positive electrode 2, a hole injection layer 5, a first hole transport layer 6, a second hole transport layer 7, a light emitting layer 8, an electron transport layer 9, an electron injection layer 10, and a negative electrode 4 are sequentially stacked on a substrate 1.

For example, the organic light emitting device according to the present invention may be manufactured by depositing a metal or a metal oxide having conductivity, or an alloy thereof on a substrate to form a positive electrode, forming an organic material layer including a hole injection layer, a hole transport layer, a light emitting layer, an electron blocking layer, an electron transport layer, and an electron injection layer thereon, and then depositing a material, which may be used as a negative electrode, thereon, by using a physical vapor deposition (PVD) method such as sputtering or e-beam evaporation. In addition to the method described above, an organic light emitting device may also be made by sequentially depositing a negative electrode material, an organic material layer, and a positive electrode material on a substrate.

The organic material layer may further include one or more layers of a hole transport layer, a hole injection layer, an electron blocking layer, an electron transport and injection layer, an electron transport layer, an electron injection layer, a hole blocking layer, and a hole transport and injection layer.

The organic material layer may have a multi-layered structure including a hole injection layer, a hole transport layer, a hole transport and injection layer, an electron blocking layer, a light emitting layer, an electron transport layer, an electron injection layer, an electron transport and injection layer, and the like, but is not limited thereto, and may also have a single-layered structure. Further, the organic material layer may be manufactured to include a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which may be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene](PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer, and a hole injection material is preferably a material which may proficiently accept holes from a positive electrode at a low voltage, and the highest occupied molecular orbital (HOMO) of the hole injection material is preferably a value between the work function of the positive electrode material and the HOMO of the peripheral organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer may have a thickness of 1 nm to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer may serve to smoothly transport holes. A hole transport material is suitably a material having high hole mobility which may accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The organic light emitting device may include an electron blocking layer provided between the hole transport layer and the light emitting layer. As the electron blocking layer, the above-described compound or a material known in the art may be used.

When the organic light emitting device includes an additional light emitting layer in addition to the light emitting layer including the above-described compounds represented by Formulae 1 and 2, the additional light emitting layer may emit red, green, or blue light, and may be composed of a phosphorescent material or fluorescent material. The light emitting material is a material which may accept holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, lubrene, and the like, but are not limited thereto.

Examples of a host material for the additional light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When the additional light emitting layer emits red light, it is possible to use a phosphorescent material such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)aluminum ($Alq_3$) as a light emitting dopant, but the light emitting dopant is not limited thereto. When the additional light emitting layer emits green light, it is possible to use a phosphorescent material such as fac tris(2-phenylpyridine)iridium ($Ir(ppy)_3$), or a fluorescent material such as tris(8-hydroxyquinolino)aluminum ($Alq_3$), as the light emitting dopant, but the light emitting dopant is not limited thereto. When the additional light emitting layer emits blue light, it is possible to use a phosphorescent material such as $(4,6\text{-}F2ppy)_2Irpic$, or a fluorescent material such as spiro-DPVBi, spiro-6P, distyryl benzene (DSB), distyryl arylene (DSA), a PFO-based polymer or a PPV-based polymer as the light emitting dopant, but the light emitting dopant is not limited thereto.

The electron transport layer may serve to smoothly transport electrons. An electron transport material is suitably a material having high electron mobility which may proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer may have a thickness of 1 nm to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer may serve to smoothly inject electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention may be a top emission type, a bottom emission type, or a dual emission type according to the material to be used.

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided to more completely explain the present specification to a person with ordinary skill in the art.

Preparation Examples

The compound according to an exemplary embodiment of the present specification may be prepared by a preparation method to be described below.

For example, the core structure of the compound having the structure of Formula 1 may be prepared by Reaction Formulae 1 to 3. The substituents may be bonded by a method known in the art, and the type or position of the substituent or the number of substituents may be changed according to the technology known in the art.

Synthesis Example 1. Preparation of Compound A

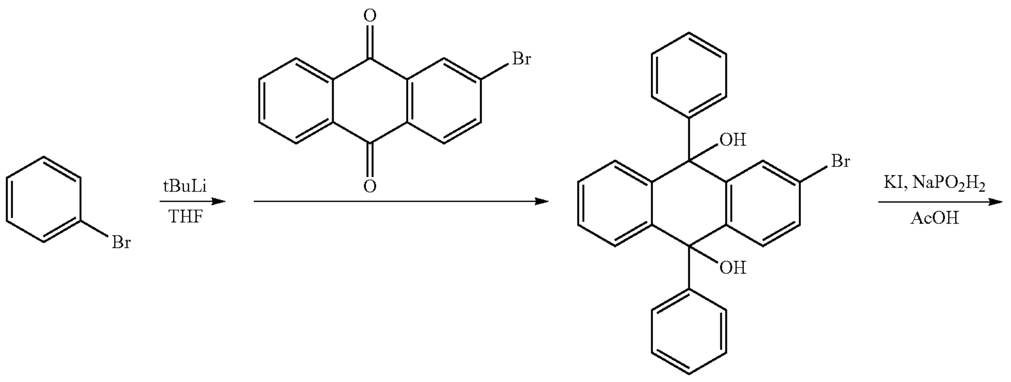

1-a

-continued

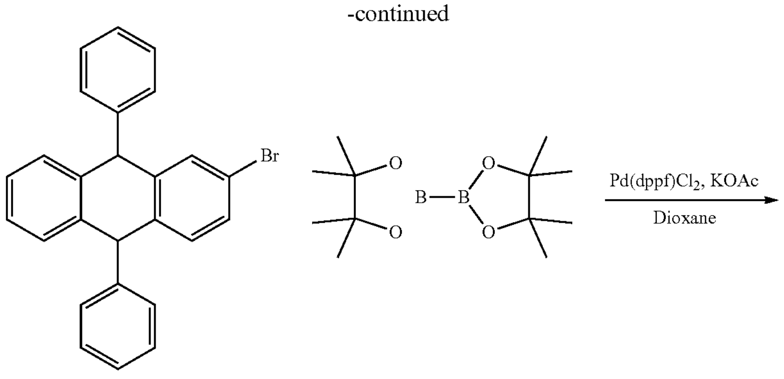

1-b

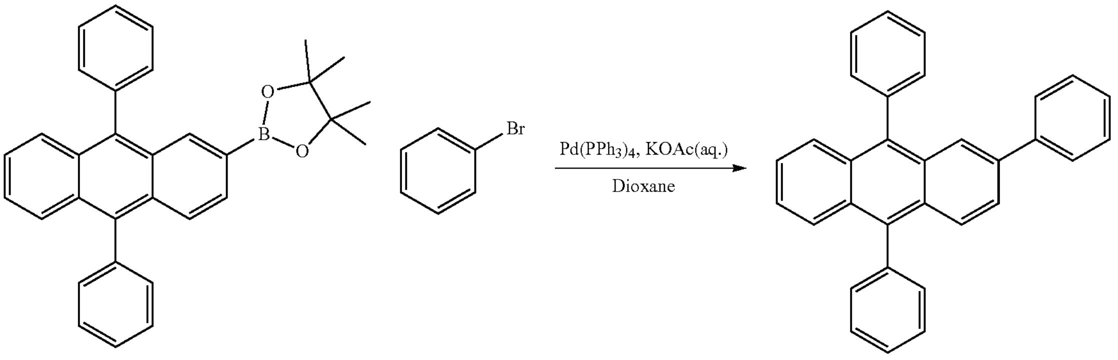

1-c A

<1-a>. Preparation of Compound 1-a

Bromobenzene (27.3 g, 174 mmol) was dissolved in THF (140 ml) dried under a nitrogen atmosphere, t-BuLi (140 ml, a 1.7 M pentane solution) was slowly added thereto at −78° C., and then the resulting solution was stirred at the same temperature for 1 hour. Here, after 2-bromoanthraquinone (20 g, 70 mmol) was added thereto, the resulting solution was warmed to room temperature and stirred for 3 hours. After an aqueous ammonium chloride solution was added to the reaction solution, an extraction with chloroform was performed. The organic layer was dried over anhydrous magnesium sulfate, and the solvent was removed. The obtained mixture was recrystallized with a small amount of diethyl ether to obtain Compound 1-a (25.2 g, yield 82%).

<1-b>. Preparation of Compound 1-b

After Compound 1-a (25.2 g, 57 mmol) was dispersed in acetic acid (380 ml) under a nitrogen atmosphere, KI (94.4 g, 568 mmol) and $NaPO_2H_2$ (100 g, 1136 mmol) were added thereto, and then the resulting solution was stirred under reflux for 3 hours. The solution was cooled at room temperature and then filtered, and washed with water and ethanol, and then dried under vacuum to obtain Compound 1-b (19.2 g, yield 82.5%). As a result of mass spectrum measurement, a peak was confirmed at [M+H+]=409.

<1-c> Preparation of Compound 1-c

After Compound 1-b (19.2 g, 47 mmol), bis(pinacolato) diboron (14.3 g, 56 mmol), potassium acetate (13.8 g, 141 mmol), and palladium(diphenylphosphitoferocene)chloride (1.24 g, 1.7 mmol) were mixed with dioxane (160 ml), the resulting mixture was refluxed for 6 hours. After the reaction solution was cooled, dioxane was removed under reduced pressure, and then the residue was dissolved in chloroform, water was added thereto, and an extraction was performed. (Performed three times) The organic layer was separated and dried over anhydrous magnesium sulfate, and the solvent was removed under reduced pressure. In this case, the obtained material was purified using column chromatography to obtain Compound 1-c (15.2 g, yield 71%). As a result of mass spectrum measurement, a peak was confirmed at [M+H+]=457.

<1-d> Synthesis of Compound A

After Compound 1-c (15.2 g, 33 mmol) and bromobenzene (5.2 g, 33.3 mmol) were dissolved in THF (100 ml), $Pd(PPh_3)_4$ (1.54 g, 1.3 mmol) and 30 ml of an aqueous 2M $K_2CO_3$ solution were added thereto, and the resulting solution was refluxed for 24 hours. The reaction solution was cooled, and the organic layer was extracted with ethyl acetate, and then dried over anhydrous magnesium sulfate. The organic solvent was removed under reduced pressure, and the residue was purified using column chromatography to obtain Compound A (10 g, yield 73.8%). As a result of mass spectrum measurement, a peak was confirmed at [M+H+]=407.

Synthesis Example 2. Preparation of Compound B

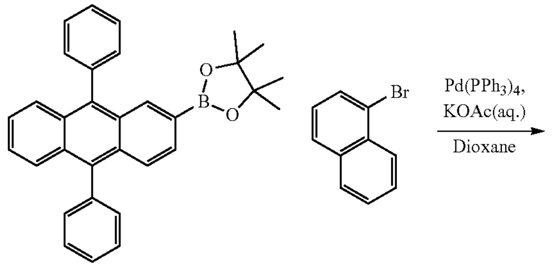

1-c

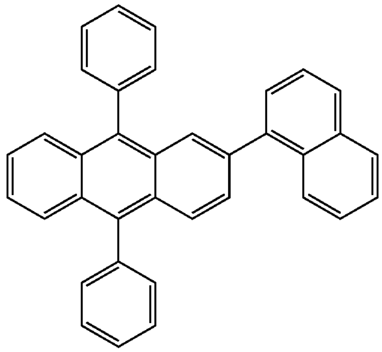

B

Compound B was obtained by performing synthesis and purification in the same manner as in Synthesis Example 1-d, except that bromobenzene was changed into 1-bromonaphthalene. As a result of mass spectrum measurement, a peak was confirmed at [M+H+]=457.

Compound C was obtained by performing synthesis and purification in the same manner as in Synthesis Example 1-d, except that bromobenzene was changed into 9-bromophenanthrene. As a result of mass spectrum measurement, a peak was confirmed at [M+H+]=507.

Synthesis Example 4. Preparation of Compound D

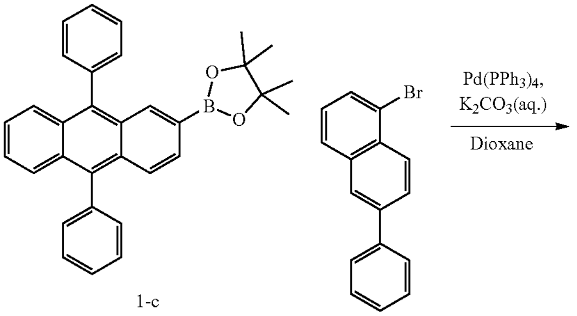

1-c

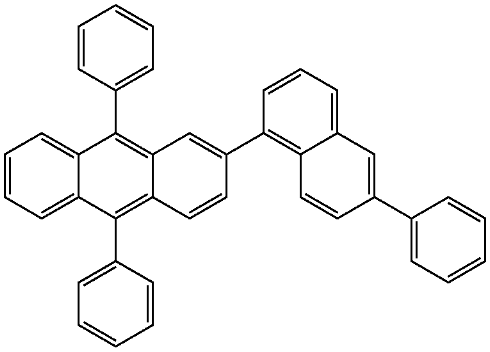

D

Compound D was obtained by performing synthesis and purification in the same manner as in Synthesis Example 1-d, except that bromobenzene was changed into 1-bromo-6-phenylnaphthalene. As a result of mass spectrum measurement, a peak was confirmed at [M+H+]=533.

Synthesis Example 3. Preparation of Compound C

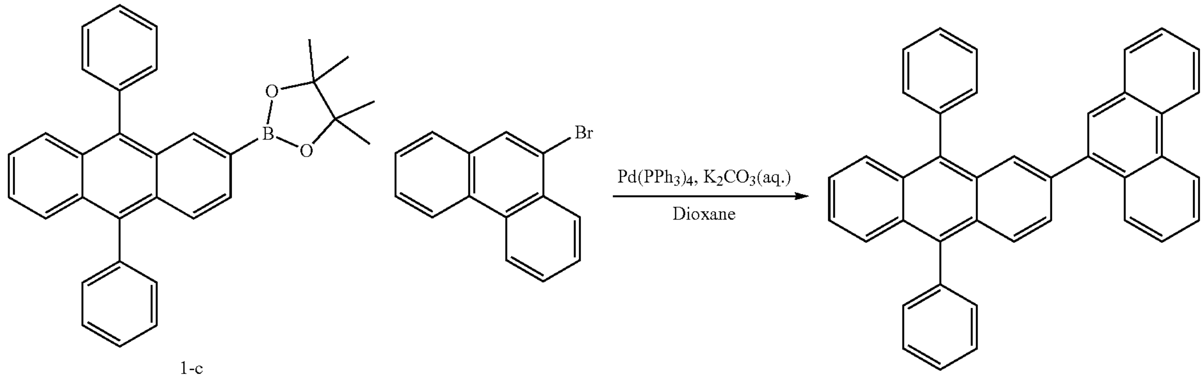

1-c

C

Synthesis Example 5. Preparation of Compound E

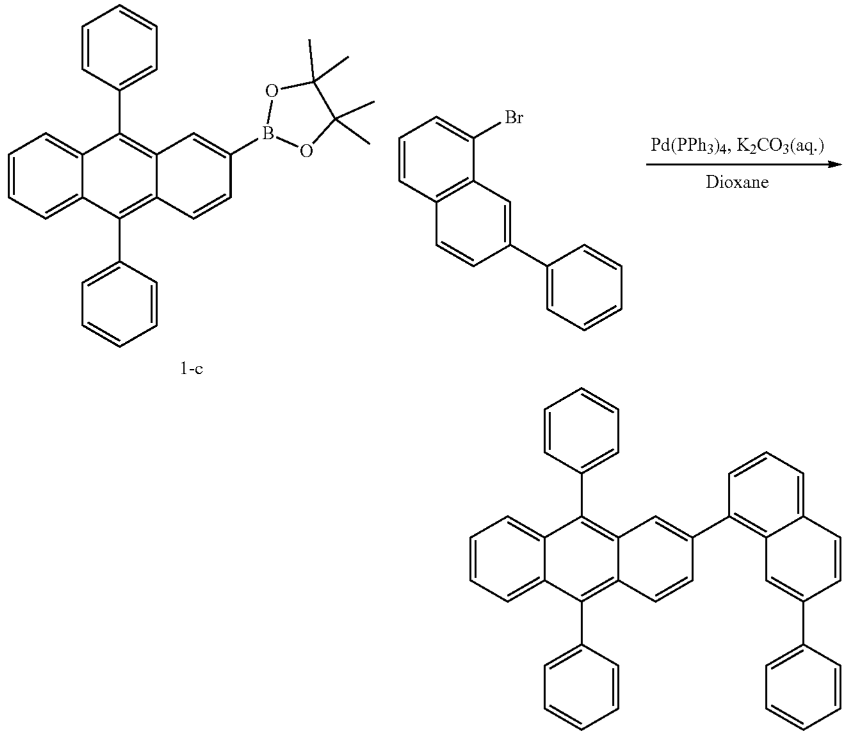

1-c

E

Compound E was obtained by performing synthesis and purification in the same manner as in Synthesis Example 1-d, except that bromobenzene was changed into 1-bromo-7-phenylnaphthalene. As a result of mass spectrum measurement, a peak was confirmed at [M+H+]=533.

Synthesis Example 6. Preparation of Compound F

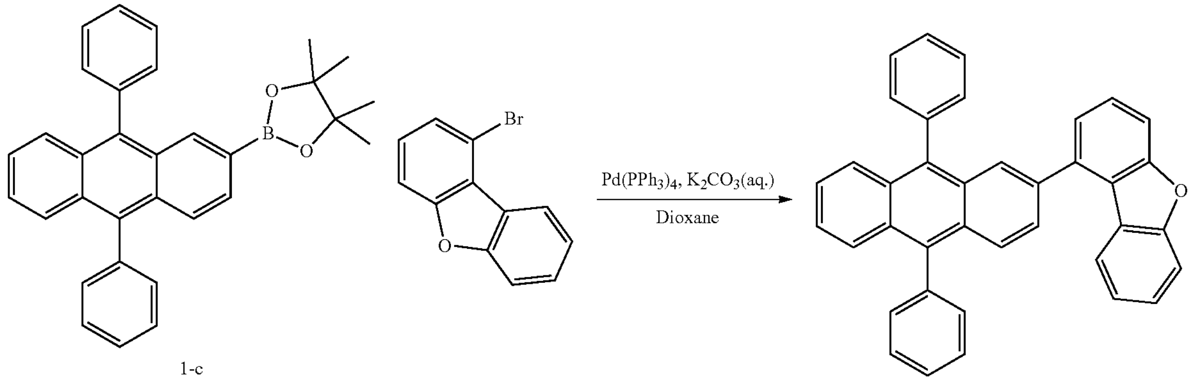

1-c

F

Compound F was obtained by performing synthesis and purification in the same manner as in Synthesis Example 1-d, except that bromobenzene was changed into 1-bromodibenzofuran. As a result of mass spectrum measurement, a peak was confirmed at [M+H+]=497.

Synthesis Example 7. Preparation of Compound G
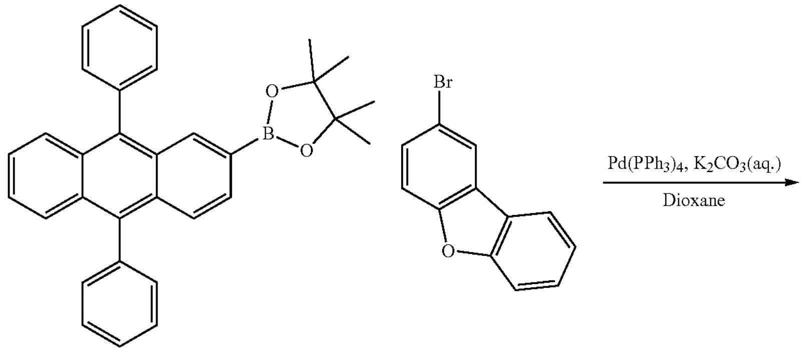
1-c
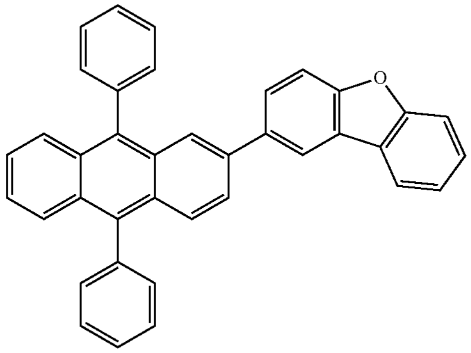
G
Compound G was obtained by performing synthesis and purification in the same manner as in Synthesis Example 1-d, except that bromobenzene was changed into 2-bromodibenzofuran. As a result of mass spectrum measurement, a peak was confirmed at [M+H+]=497.
Synthesis Example 8. Preparation of Compound H
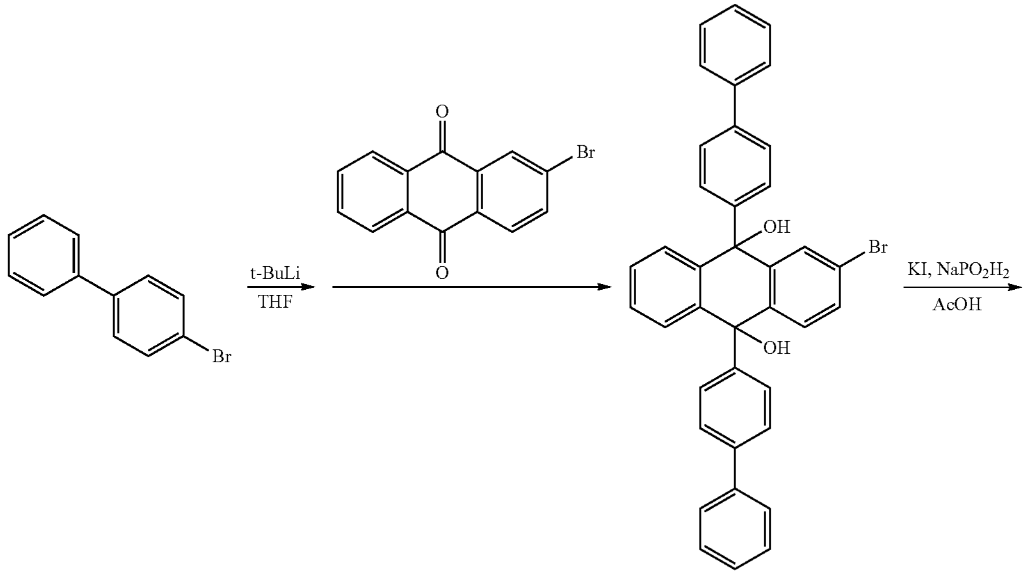
8-a -continued

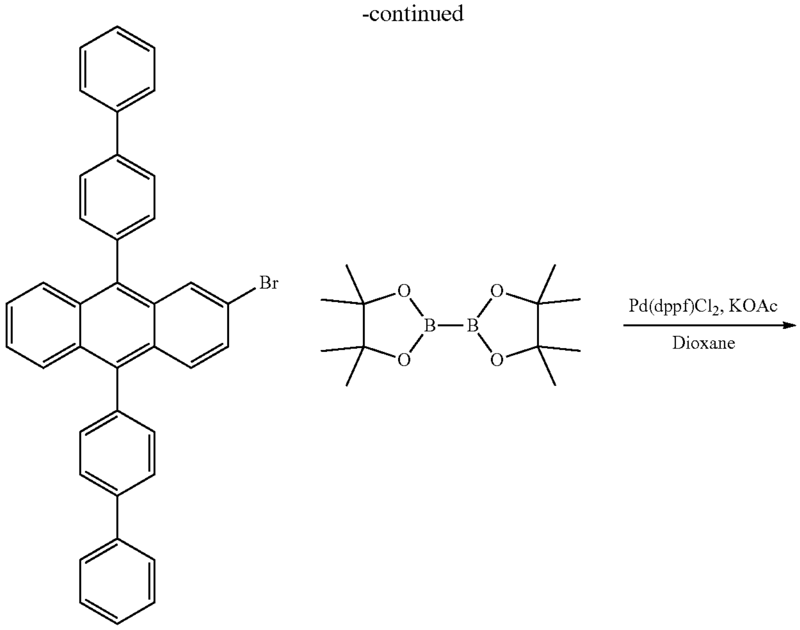

8-b

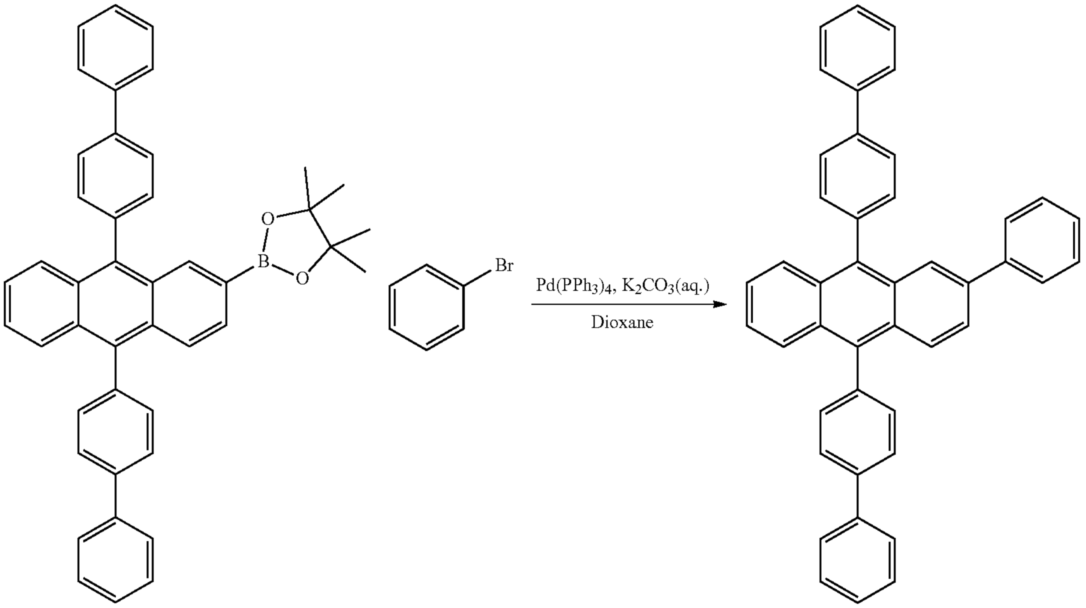

8-c

H

<8-a> Preparation of Compound 8-a

Compound 8-a was obtained by performing synthesis and purification in the same manner as in Synthesis Example 1-a, except that bromobenzene was changed into 4-bromo-1,1'-biphenyl.

<8-b> Preparation of Compound 8-b

Compound 8-b was obtained by performing synthesis and purification in the same manner as in Synthesis Example 1-b, except that Compound 1-a was changed into Compound 8-a.

<8-c> Preparation of Compound 8-c

Compound 8-c was obtained by performing synthesis and purification in the same manner as in Synthesis Example 1-c, except that Compound 1-b was changed into Compound 8-b.

<8-d> Preparation of Compound H

Compound H was obtained by performing synthesis and purification in the same manner as in Synthesis Example 1-d, except that Compound 1-c was changed into Compound 8-c. As a result of mass spectrum measurement, a peak was confirmed at [M+H+]=559.

Synthesis Example 9. Preparation of Compound I
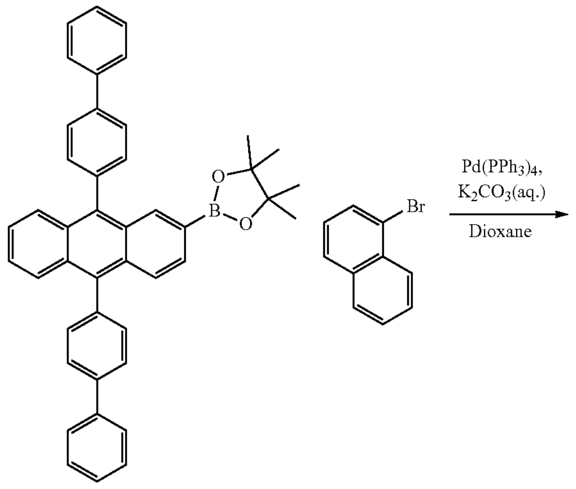
8-c
-continued
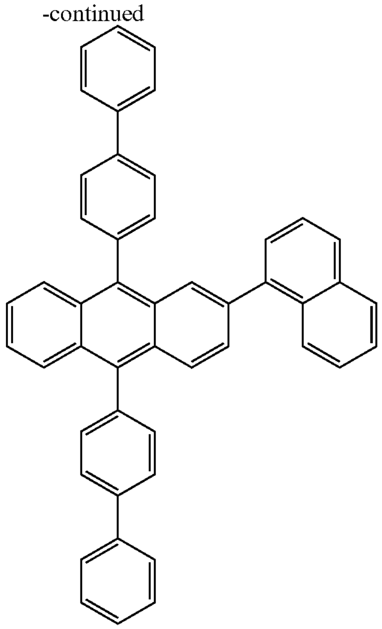
I
Compound I was obtained by performing synthesis and purification in the same manner as in Synthesis Example 8-d, except that bromobenzene was changed into 1-bromonaphthalene. As a result of mass spectrum measurement, a peak was confirmed at [M+H+]=609.
Synthesis Example 10. Preparation of Compound J
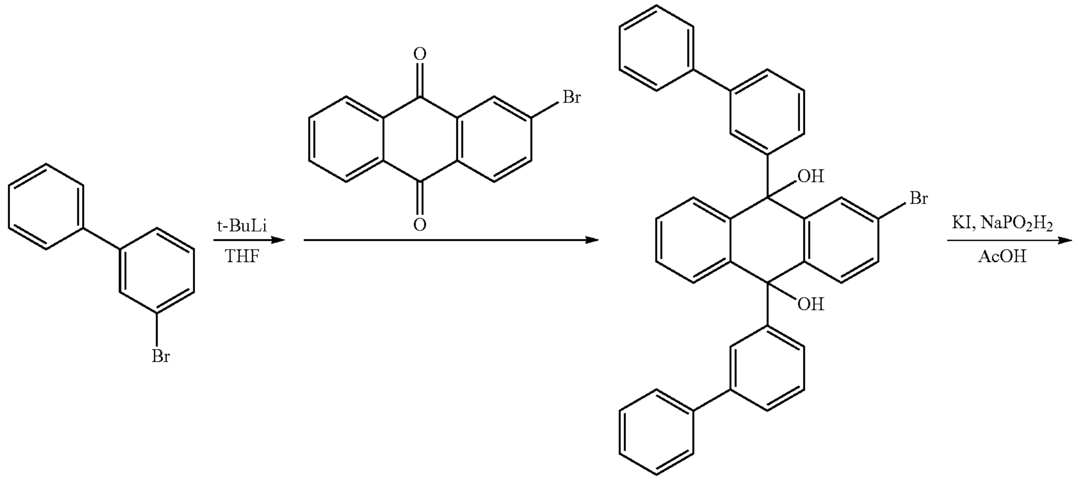
10-a -continued

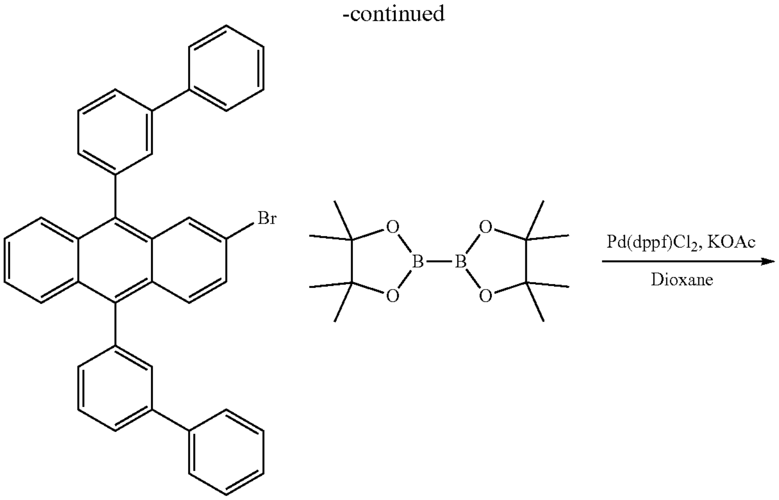

10-b

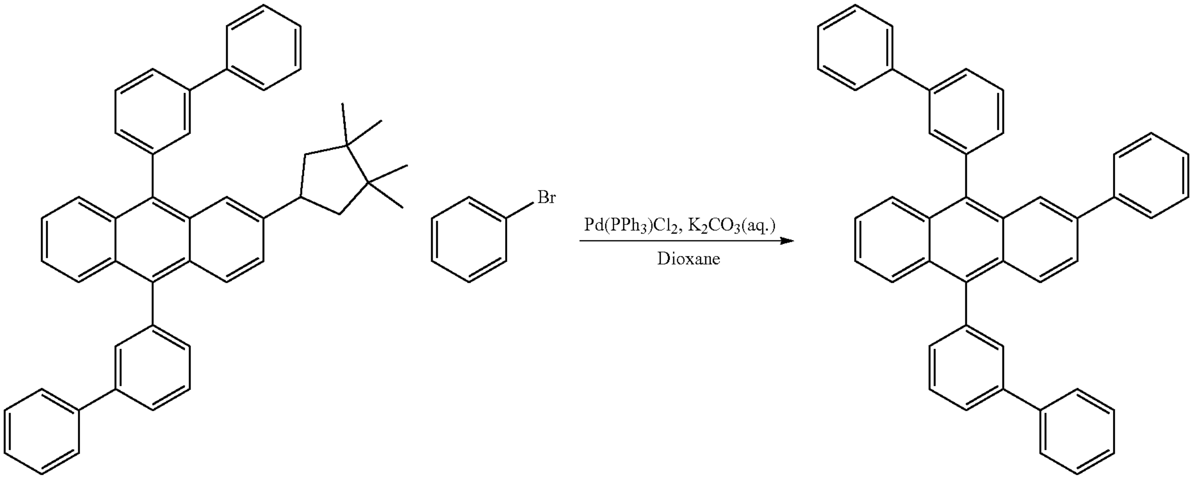

10-c

J

<10-a> Preparation of Compound 10-a

Compound 10-a was obtained by performing synthesis and purification in the same manner as in Synthesis Example 1-a, except that bromobenzene was changed into 3-bromo-1,1'-biphenyl.

<10-b> Preparation of Compound 10-b

Compound 10-b was obtained by performing synthesis and purification in the same manner as in Synthesis Example 1-b, except that Compound 1-a was changed into Compound 10-a.

<10-c> Preparation of Compound 10-c

Compound 10-c was obtained by performing synthesis and purification in the same manner as in Synthesis Example 1-c, except that Compound 1-b was changed into Compound 10-b.

<10-d> Preparation of Compound J

Compound J was obtained by performing synthesis and purification in the same manner as in Synthesis Example 1-d, except that Compound 1-c was changed into Compound 10-c. As a result of mass spectrum measurement, a peak was confirmed at [M+H+]=609.

Synthesis Example 11. Preparation of Compound K

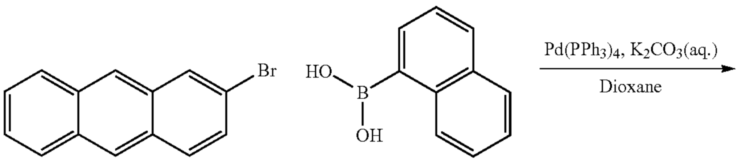

-continued

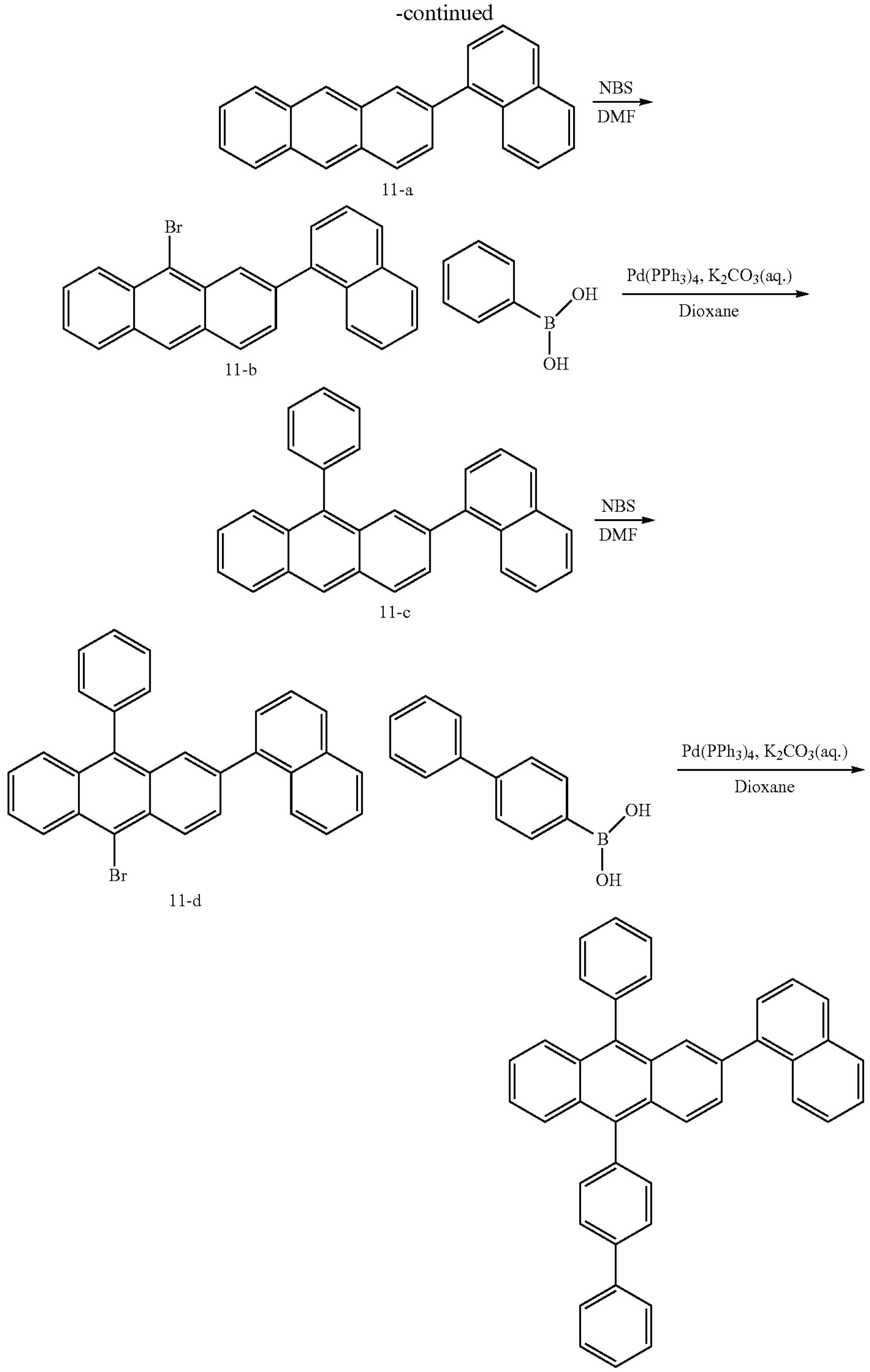

11-a 11-b 11-c 11-d

K

<11-a> Preparation of Compound 11-a 2-bromoanthracene (50 g, 194 mmol) and 1-naphthylboronic acid (33.4 g, 194 mmol) were dissolved in THF (600 ml), and then $Pd(PPh_3)_4$ (8.98 g, 7.8 mmol) and 120 ml of an aqueous 2M $K_2CO_3$ solution were added thereto, and the resulting solution was refluxed for 24 hours. The reaction solution was cooled, and the organic layer was extracted with ethyl acetate, and then dried over anhydrous magnesium sulfate. The organic solvent was removed under reduced pressure, and the residue was purified using column chromatography to obtain Compound 11-a (51 g, 86.1%).

<11-b> Preparation of Compound 11-b

After Compound 11-a (51 g, 168 mmol) was dispersed in 400 ml of dimethylformamide, a solution of n-bromosuccinimide (29.8 g, 168 mmol) dissolved in 50 ml of dimethylformamide was slowly added dropwise thereto. After reaction at room temperature for 2 hours, 1 L of water was added dropwise thereto. When a solid was produced, the solid was filtered, and then dissolved in ethyl acetate, and the resulting solution was put into a separatory funnel, and then washed several times with distilled water. The solution was recrystallized in EA to obtain Compound 11-b (45 g, 70%).

<11-c> Preparation of Compound 11-c

Compound 11-b (45 g, 117 mmol) and phenylboronic acid (14.3 g, 117 mmol) were dissolved in 400 ml of THF, and then $Pd(PPh_3)_4$ (5.4 g, 4.7 mmol) and 100 ml of an aqueous 2M $K_2CO_3$ solution were added thereto, and the resulting solution was stirred under reflux for 24 hours. The reaction solution was cooled and the produced solid was filtered. The solid was dissolved in ethyl acetate, and then recrystallized to obtain Compound 11-c (38 g, 85%).

<11-d> Preparation of Compound 11-d

After Compound 11-c (38 g, 100 mmol) was dispersed in 500 ml of dimethylformamide, a solution of n-bromosuccinimide (17.8 g, 100 mmol) dissolved in 50 ml of dimethylformamide was slowly added dropwise thereto. After reaction at room temperature for 2 hours, 1 L of water was added dropwise thereto. When a solid was produced, the solid was filtered, and then dissolved in ethyl acetate, and the resulting solution was put into a separatory funnel, and then washed several times with distilled water. The solution was recrystallized in EA to obtain Compound 11-d (35 g, 76%).

<11-e> Preparation of Compound K

Compound 11-b (35 g, 76 mmol) and 1-naphthylboronic acid (15.1 g, 76 mmol) were dissolved in 250 ml of THF, and then $Pd(PPh_3)_4$ (3.5 g, 3 mmol) and 50 ml of an aqueous 2M $K_2CO_3$ solution were added thereto, and the resulting solution was stirred under reflux for 24 hours. The reaction solution was cooled and the produced solid was filtered. The residue was purified with column chromatography to obtain Compound K (31 g, 76%). As a result of mass spectrum measurement, a peak was confirmed at [M+H+]=533.

Synthesis Example 12. Preparation of Compound L

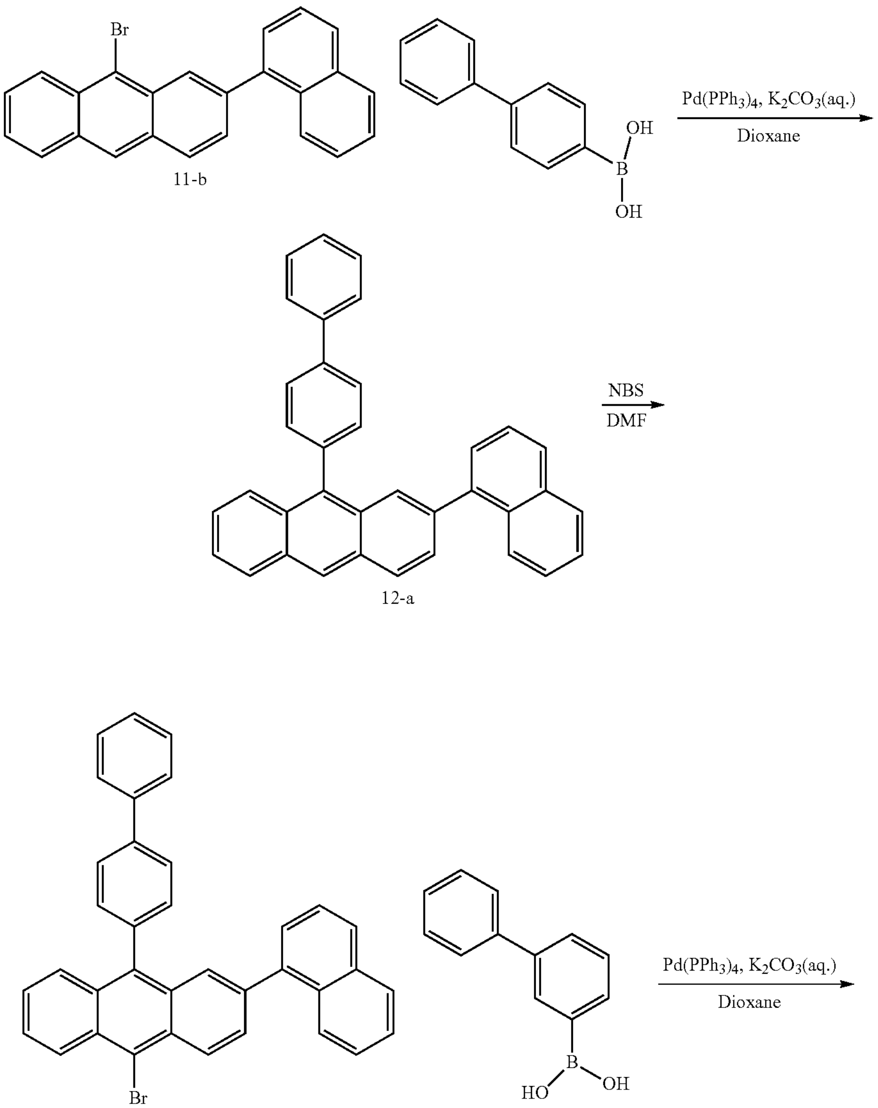

11-b 12-a 12-b

-continued

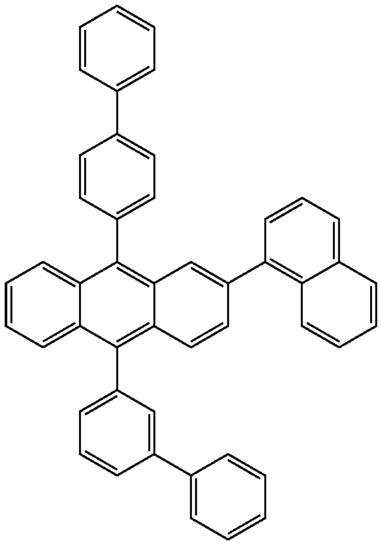

L

<12-a> Preparation of Compound 12-a

Compound 12-a was obtained by performing synthesis and purification in the same manner as in Synthesis Example 11-c, except that phenylboronic acid was changed into 4-bromo-1,1'-biphenylboronic acid.

<12-b> Preparation of Compound 12-b

Compound 12-b was obtained by performing synthesis and purification in the same manner as in Synthesis Example 11-d, except that Compound 11-c was changed into Compound 12-a.

<12-c> Preparation of Compound L

Compound L was obtained by performing synthesis and purification in the same manner as in Synthesis Example 11-e, except that Compound 11-d was changed into Compound 12-b. As a result of mass spectrum measurement, a peak was confirmed at [M+H+]=609.

Synthesis Example 13. Preparation of Compound M

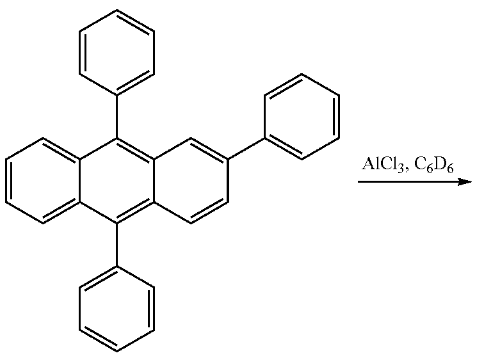

A

-continued

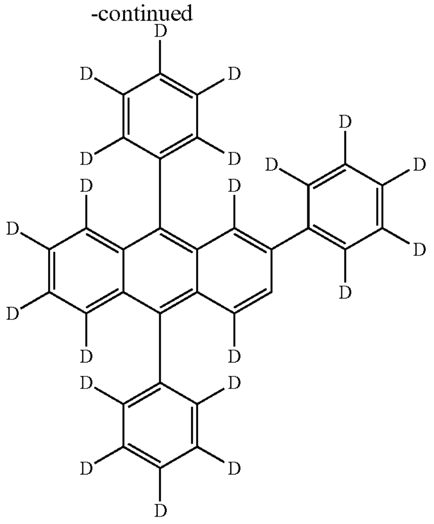

M

The synthesized Compound A (20 g) and $AlCl_3$ (4 g) were put into $C_6D_6$ (400 ml), and the resulting solution was stirred for 2 hours. After the reaction was completed, $D_2O$ (60 ml) was added thereto, the resulting solution was stirred for 30 minutes, and then trimethylamine (6 ml) was added dropwise thereto. The reaction solution was transferred to a separatory funnel, and an extraction with water and toluene was performed. The extract was dried over $MgSO_4$, and then the residue was recrystallized with ethyl acetate to obtain Compound M at a yield of 60%. As a result of mass spectrum measurement, a peak was confirmed at [M+H+]=429.

Synthesis Example 14. Preparation of Compound N
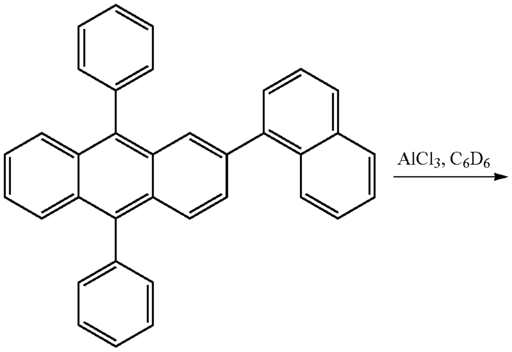
B
-continued
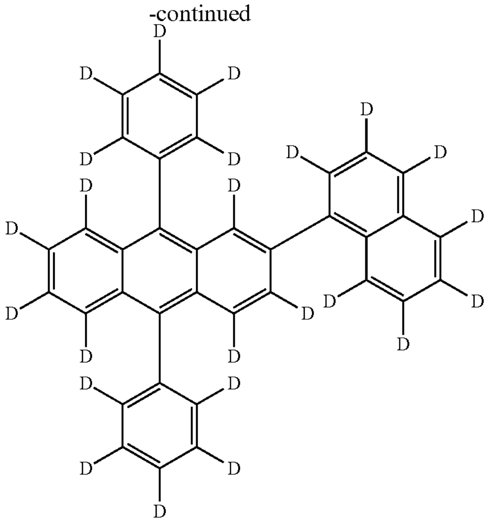
N
Compound N was obtained by performing synthesis and purification in the same manner as in Synthesis Example 13, except that Compound A was changed into Compound B. As a result of mass spectrum measurement, a peak was confirmed at [M+H+]=480.
Synthesis Example 15. Preparation of Compound BD-A
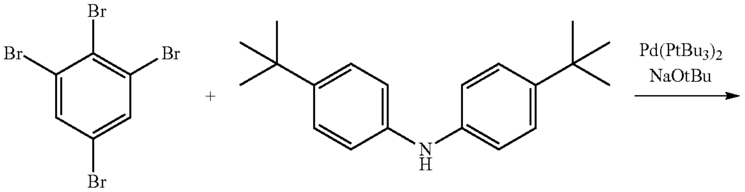
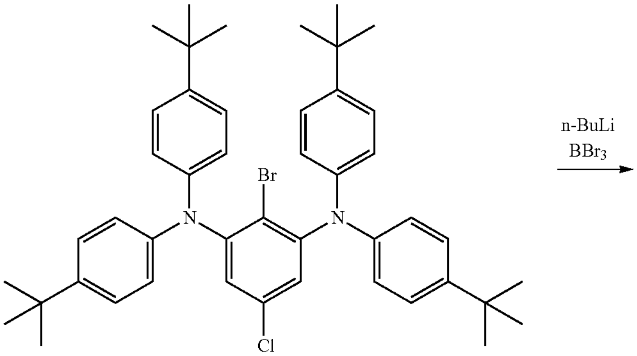
15-a -continued

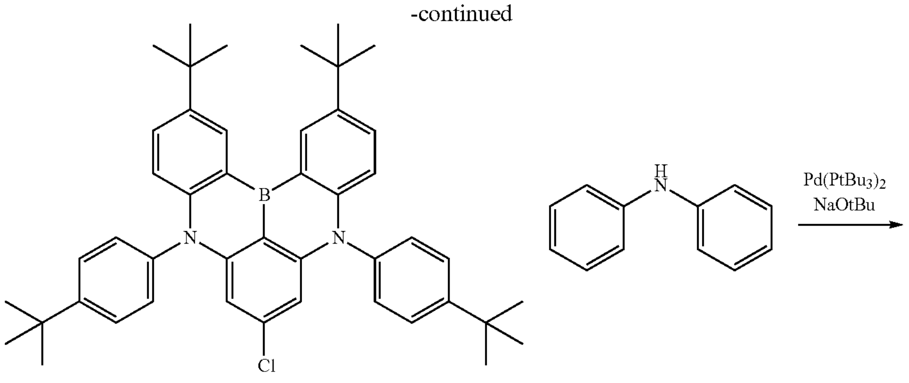

15-b

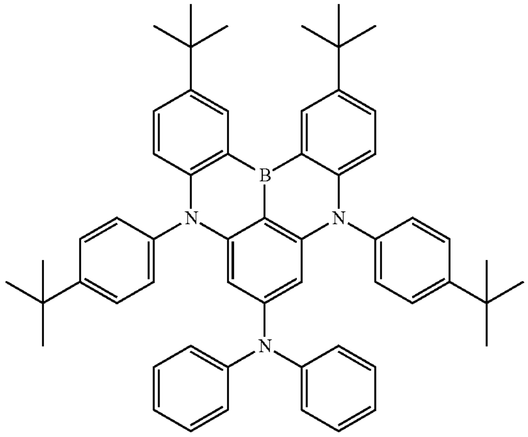

BD-A

<15-a> Preparation of Compound 15-a

A flask containing 1,2,3-tribromo-5-chlorobenzene (5 g), bis-(4-(tert-butyl)phenyl)amine (8 g), $Pd(PtBu_3)_2$ (0.15 g), NaOtBu (4.1 g), and xylene (50 ml) was heated at 130° C., and the resulting solution was stirred for 3 hours. The reaction solution was cooled to room temperature, the liquid was aliquoted by adding water and ethyl acetate thereto, and then the solvent was distilled off under reduced pressure. The resulting product was purified with recrystallization (ethyl acetate/hexane) to obtain Compound 15-a (7.5 g).

<15-b> Preparation of Compound 15-b

An n-butyllithium pentane solution (8 ml, 2.5 M in hexane) was added to a flask containing Compound 15-a (7.5 g) and xylene (100 ml) at 0° C. under an argon atmosphere. After the completion of dropwise addition, the resulting solution was warmed to 50° C. and stirred for 2 hours. The resulting solution was cooled to −40° C., boron tribromide (2.88 ml) was added thereto, and the resulting solution was stirred for 4 hours while being warmed to room temperature. Thereafter, the resulting solution was cooled again to 0° C., N,N-diisopropylethylamine (8 ml) was added thereto, and the reaction solution was further stirred at room temperature for 30 minutes. After the liquid was aliquoted by adding sat. aq. NaCl and ethyl acetate thereto, the solvent was distilled off under reduced pressure. The resulting product was purified with a silica gel column chromatography (eluent: hexane/ethyl acetate=1/30) to obtain Compound 15-b (1.6 g).

<15-c> Preparation of Compound BD-A

A flask containing Compound 15-b (1.6 g), diphenylamine (0.44 g), $Pd(PtBu_3)_2$ (24 mg), $CsCO_3$ (2.3 g), and xylene (20 ml) was heated at 130° C., and the resulting solution was stirred for 2 hours. The reaction solution was cooled to room temperature, the liquid was aliquoted by adding sat. aq. $NH_4Cl$ and toluene thereto, and then the solvent was distilled off under reduced pressure. The resulting product was purified with a silica gel column chromatography (eluent: hexane/ethyl acetate=1/30) to obtain Compound BD-A (1.3 g). As a result of mass spectrum measurement, a peak was confirmed at [M+H+]=812.

Synthesis Example 16. Preparation of Compound BD-B

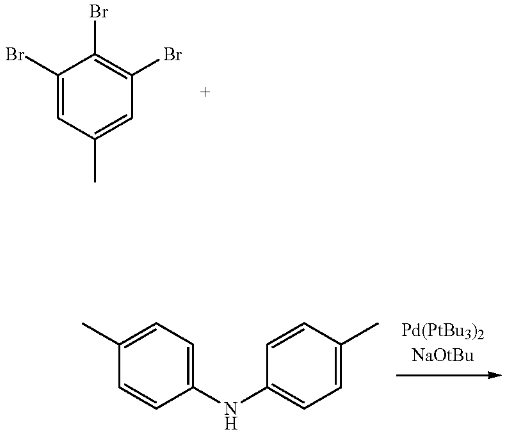

-continued

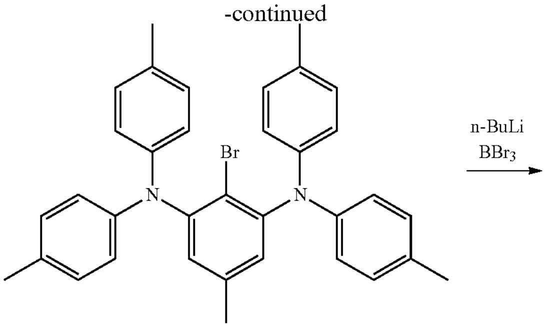

16-a

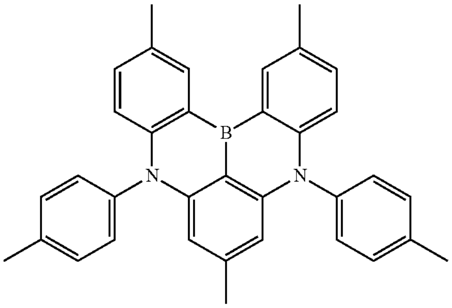

BD-B

<16-a> Preparation of Compound 16-a

Compound 16-a was obtained by performing synthesis and purification in the same manner as in Synthesis Example 15-a, except that 1,2,3-tribromo-5-methylbenzene was used instead of 1,2,3-tribromo-5-chlorobenzene, and di-p-tolylamine was used instead of bis-(4-(tert-butyl)phenyl) amine.

<16-b> Preparation of Compound BD-B

Compound BD-B was obtained by performing synthesis and purification in the same manner as in Synthesis Example 15-b, except that Compound 16-a was used instead of Compound 15-a. As a result of mass spectrum measurement, a peak was confirmed at [M+H+]=491.

MODE FOR INVENTION

Experimental Examples

The structures of the compounds used in the following Examples and Comparative Examples are as follows, and among the structures, the compounds corresponding to Formulae 1 to 2 of the present application were prepared by the procedures in the above-described Reaction Formulae 1 to 3.

-continued

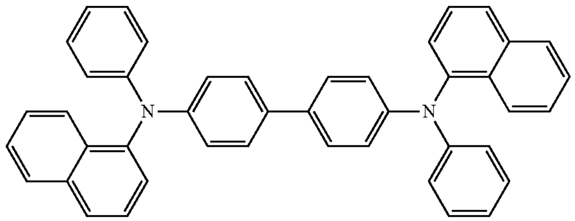

HTL1

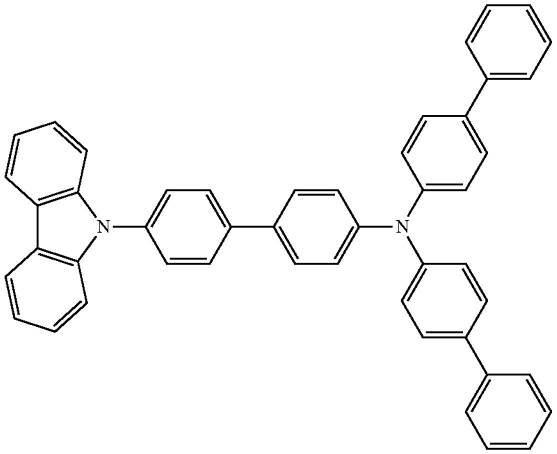

HTL2

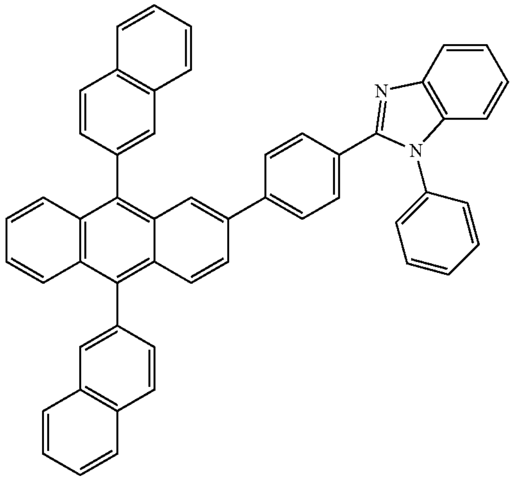

ETL

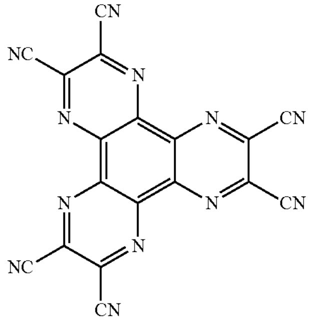

HAT-CN

A

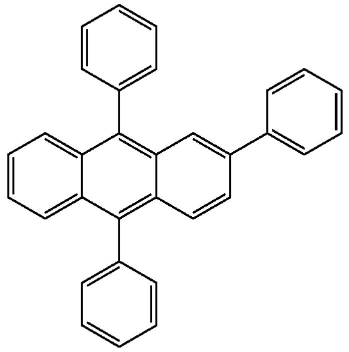

-continued
B
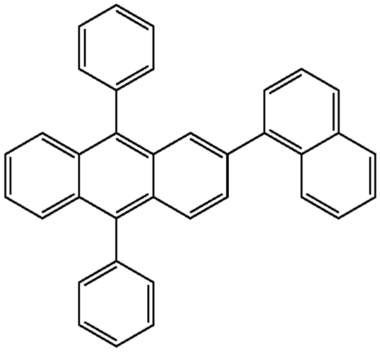
C
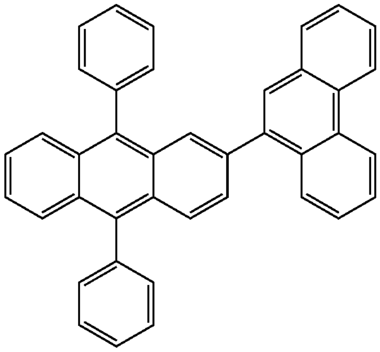
D
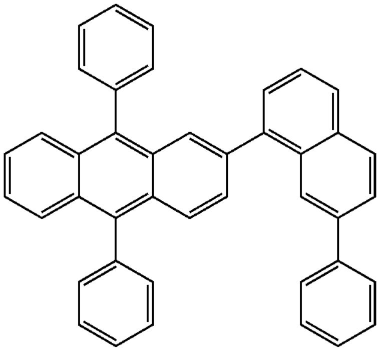
E
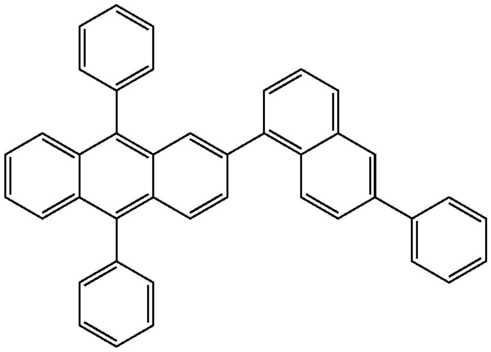
-continued
F
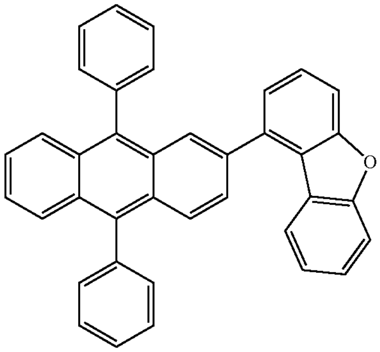
G
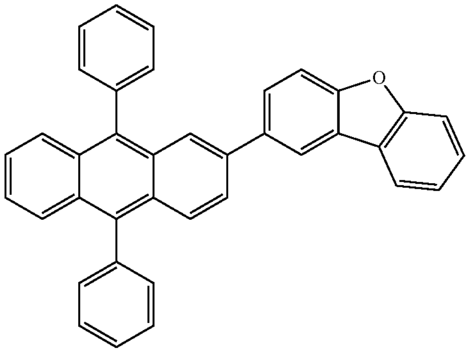
H
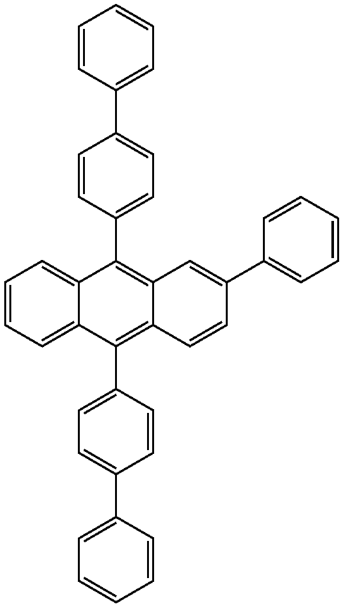

-continued
I
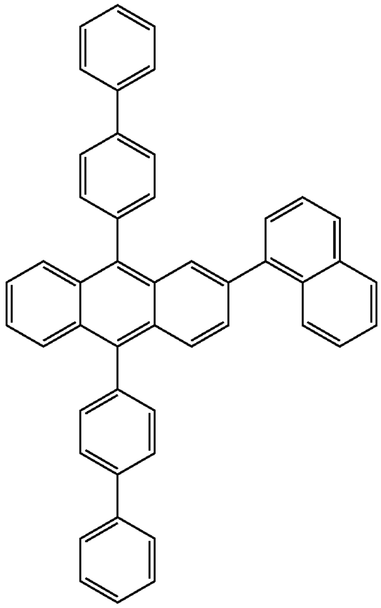
J
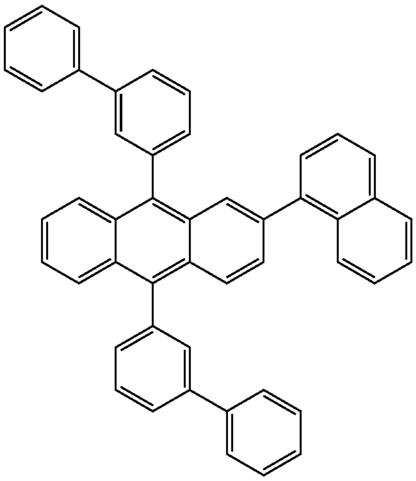
K
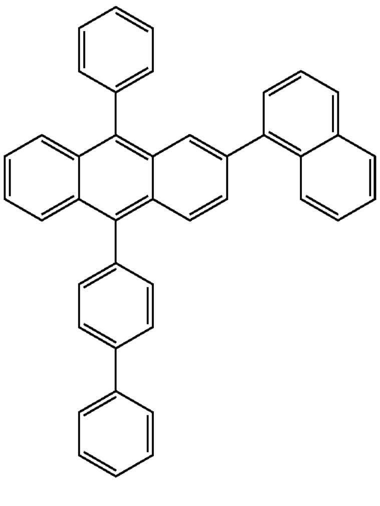
-continued
L
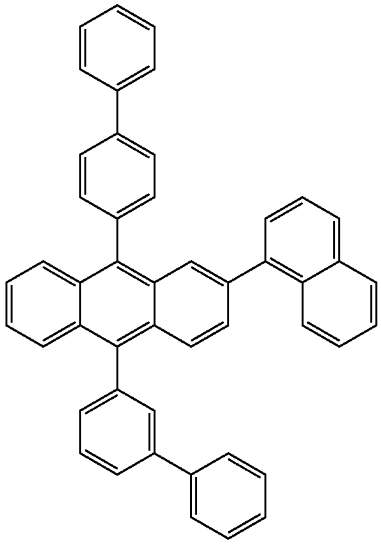
M
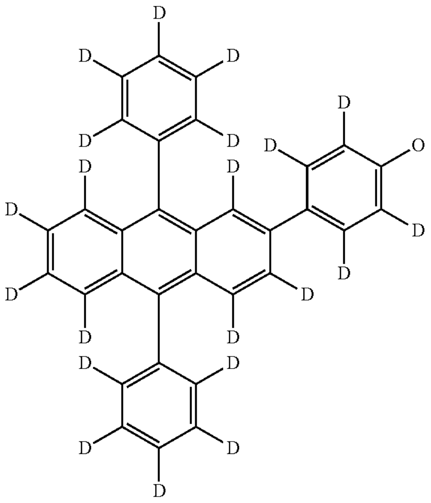
N
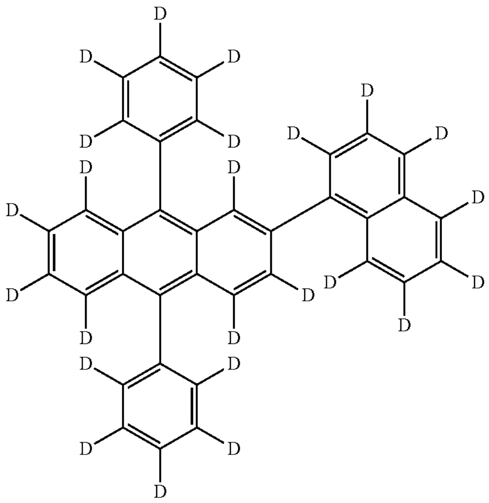

-continued
BH-A
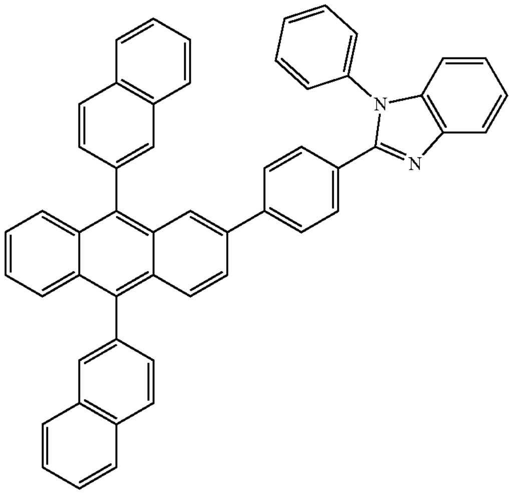
BH-B
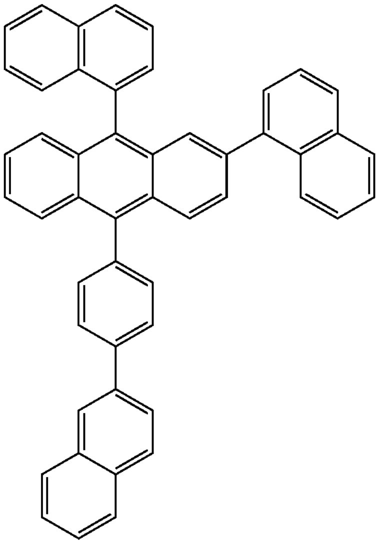
BH-C
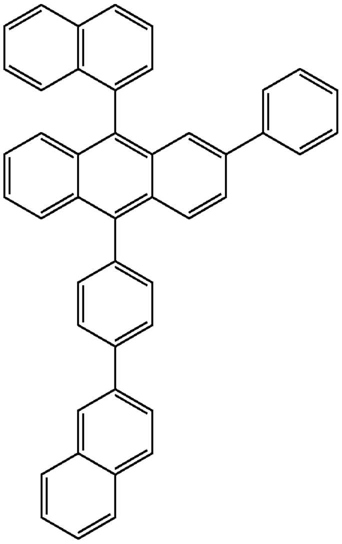
-continued
BH-D
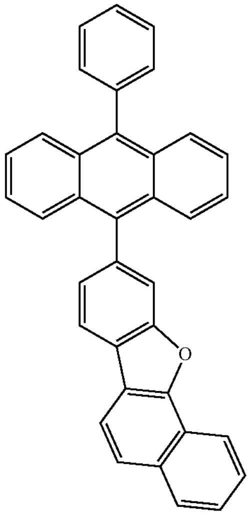
BH-E
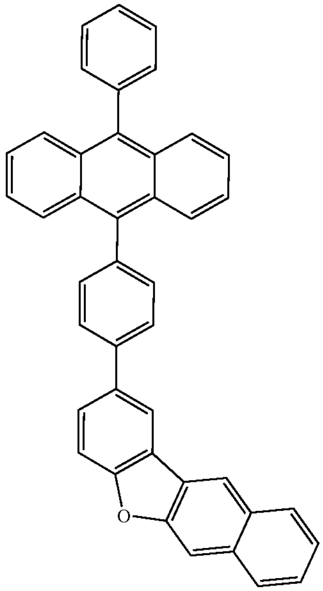
BH-F
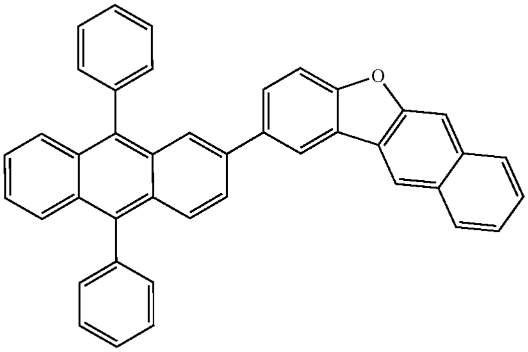

-continued

BD-A

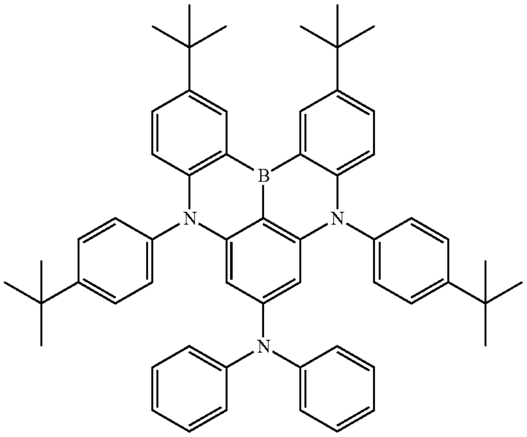

BD-B

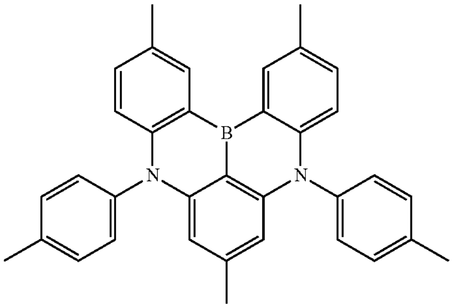

BD-C

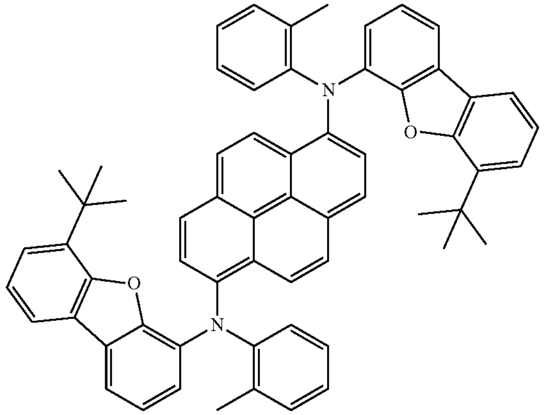

Example 1

A glass substrate thinly coated with indium tin oxide (ITO) to have a thickness of 150 nm was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. Furthermore, the substrate was washed using nitrogen plasma for 5 minutes, and then was transported to a vacuum deposition machine. The following HAT-CN compound was thermally vacuum-deposited to have a thickness of 5 nm on the ITO transparent electrode thus prepared, thereby forming a hole injection layer. Subsequently, HTL1 was thermally vacuum-deposited to have a thickness of 100 nm, and then HTL2 was thermally vacuum-deposited to have a thickness of 10 nm, thereby forming a hole transport layer. Subsequently, Compound A as a host and BD-A as a dopant (weight ratio 95:5) were simultaneously vacuum-deposited, thereby forming a light emitting layer having a thickness of 20 nm. Subsequently, ETL was vacuum-deposited to have a thickness of 20 nm, thereby forming an electron transport layer. Subsequently, LiF was vacuum-deposited to have a thickness of 0.5 nm, thereby forming an electron injection layer. Subsequently, aluminum was deposited to have a thickness of 100 nm to form a negative electrode, thereby manufacturing an organic light emitting device.

Examples 2 to 17 and Comparative Examples 1 to 9

Each of organic light emitting devices was manufactured by the same method as Example 1 and by using the materials as a host and a dopant at the content (parts by weight based on 1 which is the sum of the contents of the host and the dopant) in the following Table 1. For each of the organic light emitting devices manufactured in Examples 1 to 17 and Comparative Examples 1 to 9, the driving voltage and light emitting efficiency were measured at a current density of 10 $mA/cm^2$, and the time (LT) taken for the brightness to reach 97% as compared to the initial brightness was measured at a current density of 20 $mA/cm^2$, and the results thereof are shown in the following Table 2.

TABLE 1

| | Host | | Dopant | |
|---|---|---|---|---|
| | Material | Content | Material | Content |
| Example 1 | A | 0.950 | BD-A | 0.05 |
| Example 2 | B | 0.950 | BD-A | 0.05 |
| Example 3 | C | 0.950 | BD-A | 0.05 |
| Example 4 | D | 0.950 | BD-A | 0.05 |
| Example 5 | E | 0.950 | BD-A | 0.05 |
| Example 6 | F | 0.950 | BD-A | 0.05 |
| Example 7 | G | 0.950 | BD-A | 0.05 |
| Example 8 | H | 0.950 | BD-A | 0.05 |
| Example 9 | I | 0.950 | BD-A | 0.05 |
| Example 10 | J | 0.950 | BD-A | 0.05 |
| Example 11 | K | 0.950 | BD-A | 0.05 |
| Example 12 | L | 0.950 | BD-A | 0.05 |
| Example 13 | M | 0.950 | BD-A | 0.05 |
| Example 14 | N | 0.950 | BD-A | 0.05 |
| Example 15 | A | 0.950 | BD-B | 0.05 |
| Example 16 | B | 0.950 | BD-B | 0.05 |
| Example 17 | C | 0.950 | BD-B | 0.05 |
| Comparative Example 1 | BH-A | 0.950 | BD-A | 0.05 |
| Comparative Example 2 | BH-B | 0.950 | BD-A | 0.05 |
| Comparative Example 3 | BH-C | 0.950 | BD-A | 0.05 |
| Comparative Example 4 | BH-D | 0.950 | BD-A | 0.05 |
| Comparative Example 5 | BH-E | 0.950 | BD-A | 0.05 |
| Comparative Example 6 | BH-F | 0.950 | BD-A | 0.05 |
| Comparative Example 7 | A | 0.950 | BD-C | 0.05 |
| Comparative Example 8 | B | 0.950 | BD-C | 0.05 |
| Comparative Example 9 | C | 0.950 | BD-C | 0.05 |

TABLE 2

| | 10 mA/cm² measurement value | | |
|---|---|---|---|
| | Driving voltage (V) | Light emitting efficiency (Cd/A) | LT (T97%, hr) (@20 mA/cm²) |
| Example 1 | 4.56 | 6.90 | 132 |
| Example 2 | 4.68 | 6.92 | 149 |
| Example 3 | 4.51 | 6.85 | 143 |
| Example 4 | 4.43 | 7.01 | 142 |
| Example 5 | 4.53 | 7.12 | 132 |
| Example 6 | 4.61 | 6.95 | 140 |
| Example 7 | 4.63 | 6.81 | 139 |
| Example 8 | 4.71 | 6.71 | 138 |
| Example 9 | 4.52 | 6.65 | 133 |
| Example 10 | 4.61 | 6.82 | 141 |
| Example 11 | 4.63 | 6.81 | 139 |
| Example 12 | 4.71 | 6.71 | 138 |
| Example 13 | 4.52 | 6.65 | 202 |
| Example 14 | 4.61 | 6.82 | 210 |
| Example 15 | 4.76 | 6.72 | 138 |
| Example 16 | 4.50 | 6.96 | 140 |
| Example 17 | 4.73 | 6.88 | 142 |
| Comparative Example 1 | 4.82 | 6.12 | 52 |
| Comparative Example 2 | 4.63 | 6.50 | 62 |
| Comparative Example 3 | 4.79 | 6.68 | 40 |
| Comparative Example 4 | 4.89 | 6.25 | 55 |
| Comparative Example 5 | 4.82 | 4.20 | 71 |
| Comparative Example 6 | 4.63 | 4.68 | 80 |
| Comparative Example 7 | 4.79 | 4.52 | 84 |
| Comparative Example 8 | 4.89 | 4.12 | 89 |
| Comparative Example 9 | 4.91 | 4.12 | 75 |

From Table 2, it can be confirmed that the organic light emitting devices of Examples 1 to 17, in which Ar1 and Ar2 of Formula 1 have a substituted or unsubstituted phenyl group; or a substituted or unsubstituted biphenyl group have better device characteristics than the organic light emitting devices of Comparative Examples 1 to 6 which do not include the compound represented by Formula 1 according to the present application, and the organic light emitting devices of Comparative Examples 7 and 9, which do not include the compound represented by Formula 2 according to the present application.

In particular, it can be confirmed that in the case of Comparative Examples 1 to 3 in which a naphthyl group is substituted with any one of Ar1 and Ar2, Comparative Example 5 in which hydrogen is substituted with Ar3, and Comparative Example 6 in which a naphthobenzofuranyl group is substituted with Ar3, the time (LT) taken for the brightness to reach 97% as compared to the initial brightness at a current density of 20 mA/cm², which indicates the service life of the organic light emitting device, is remarkably shorter than those of the organic light emitting devices of Examples 1 to 17 satisfying Formula 1 according to the present invention.

The invention claimed is:

1. An organic light emitting device comprising:

a first electrode;

a second electrode provided to face the first electrode; and an organic material layer comprising a light emitting layer provided between the first electrode and the second electrode, wherein the light emitting layer comprises a host consisting of a compound represented by the following Formula 1 and a dopant consisting of a compound represented by the following Formula 2:

[Formula 1]

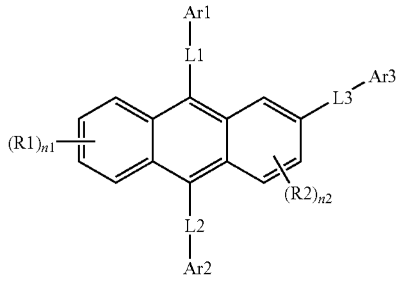

wherein in Formula 1,

Ar1 and Ar2 are the same as or different from each other, and are each independently a phenyl group unsubstituted or substituted with deuterium; or a biphenyl group unsubstituted or substituted with deuterium, Ar3 is a phenyl group unsubstituted or substituted with deuterium; a naphthyl group unsubstituted or substituted with deuterium: a phenanthrenyl group unsubstituted or substituted with deuterium; a dibenzofuranyl group unsubstituted or substituted with deuterium; or a dibenzothiophenyl group unsubstituted or substituted with deuterium, one or more of Ar1, Ar2, or Ar3 is substituted with deuterium, L1 to L3 are a direct bond, R1 and R2 are deuterium, and n1 is 4, n2 is 3,

[Formula 2]

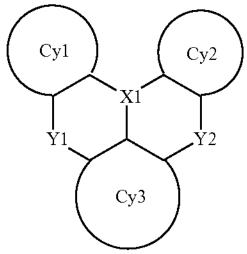

wherein in Formula 2,

X1 is B or P(=O),

Y1 is O, S, or NRa,

Y2 is O, S, or NRb,

Cy1 to Cy3 are the same as or different from each other, and are each independently a substituted or unsubstituted aromatic hydrocarbon ring; or a substituted or unsubstituted aromatic hetero ring, and Cy1 and Cy2 are optionally bonded to each other to form a substituted or unsubstituted ring, Ra is a substituted or unsubstituted alkyl group; a substituted or unsubstituted aryl group; or a substituted or unsubstituted heterocyclic group, or is bonded to Cy1 or Cy3 to form a substituted or unsubstituted ring, and Rb is a substituted or unsubstituted alkyl group; a substituted or unsubstituted aryl group; or a substituted or unsubstituted heterocyclic group, or is bonded to Cy2 or Cy3 to form a substituted or unsubstituted ring.

2. The organic light emitting device of claim 1, wherein the compound represented by Formula 1 is represented by the following Formula 1-1 or 1-2:

[Formula 1-1]

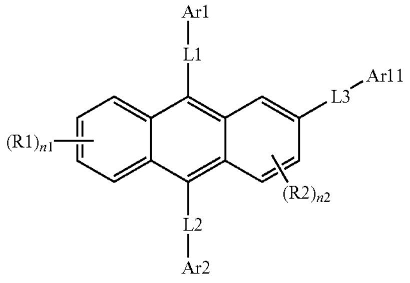

[Formula 1-2]

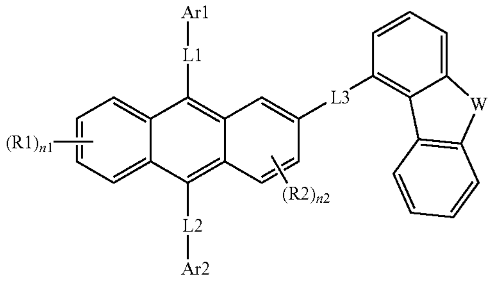

wherein in Formulae 1-1 and 1-2, definitions of L1 to L3, Ar1, Ar2, R1, R2, n1, and n2 are the same as defined in Formula 1, Ar11 is a phenyl group unsubstituted or substituted with deuterium; a naphthyl group unsubstituted or substituted with deuterium; a phenanthrenyl group unsubstituted or substituted with deuterium, and W is O or S.

3. The organic light emitting device of claim 1, wherein the compound represented by Formula 1 is any one of the following compounds:

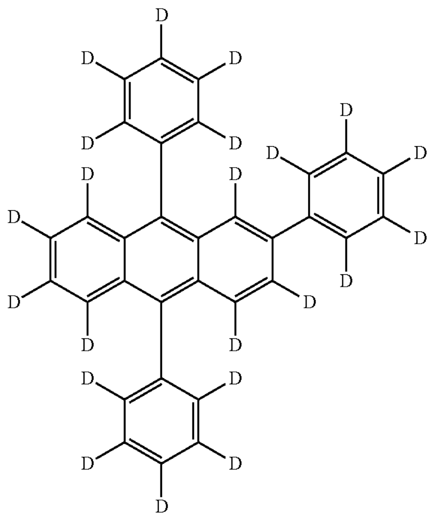

-continued

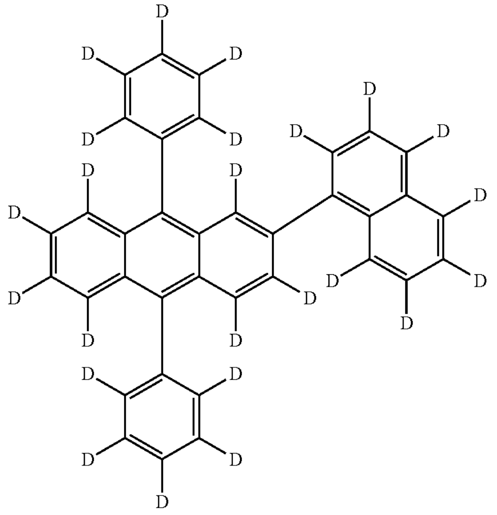

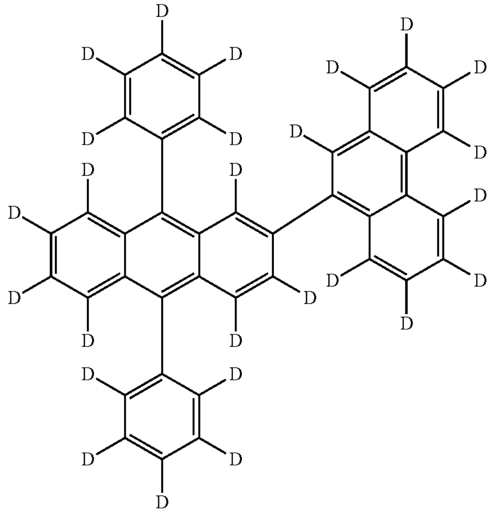

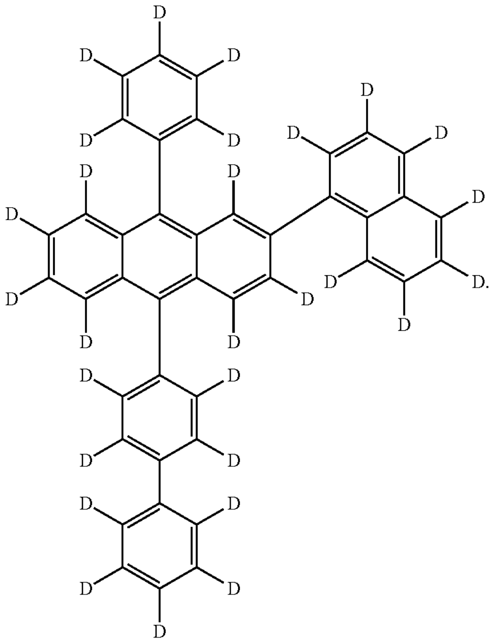

4. The organic light emitting device of claim 1, wherein the compound represented by Formula 2 is represented by the following Formula 2-1:

[Formula 2-1]

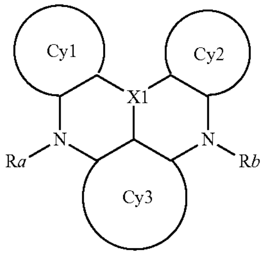

wherein in Formula 2-1, definitions of Cy1 to Cy3, X1, Ra, and Rb are the same as defined in Formula 2.

5. The organic light emitting device of claim 1, wherein the compound represented by Formula 2 is any one of the following compounds:

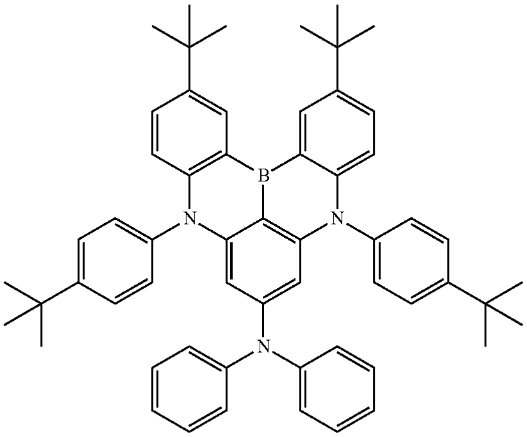

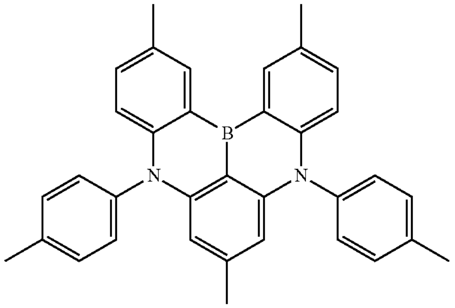

-continued

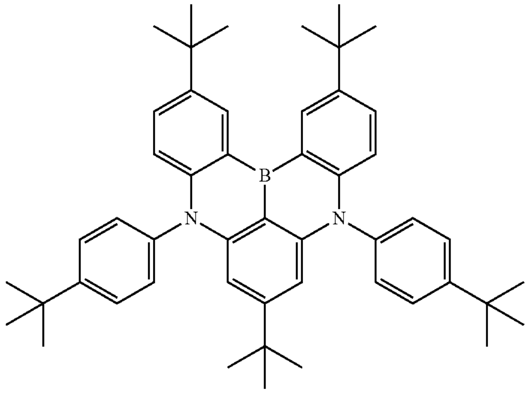

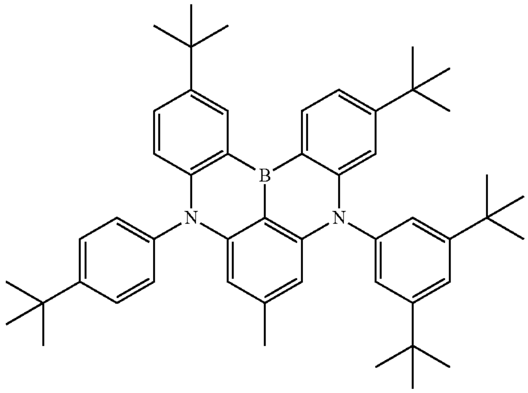

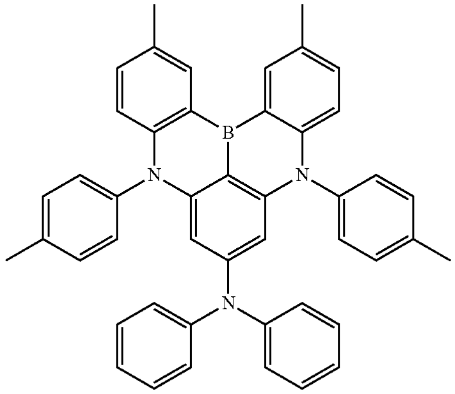

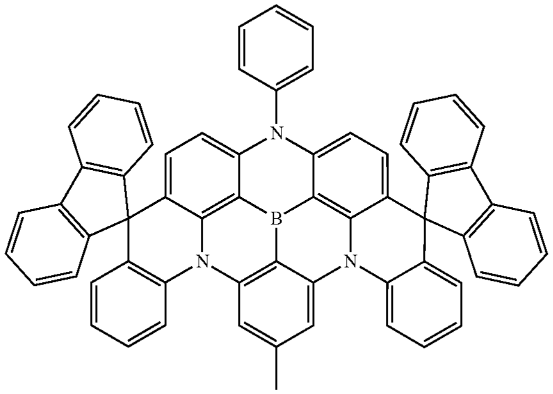

-continued
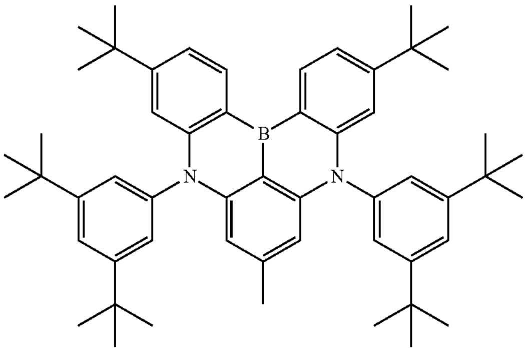
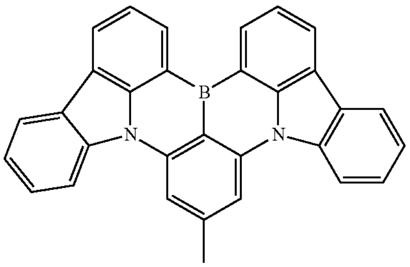
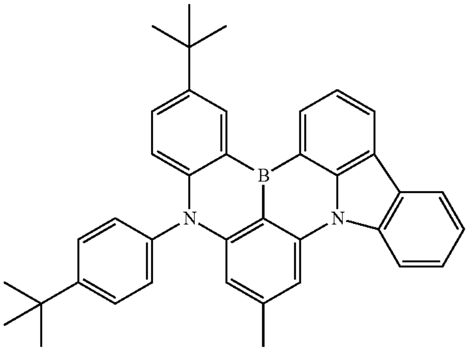
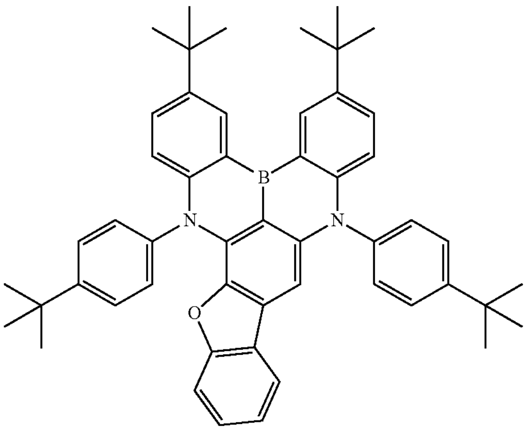
-continued
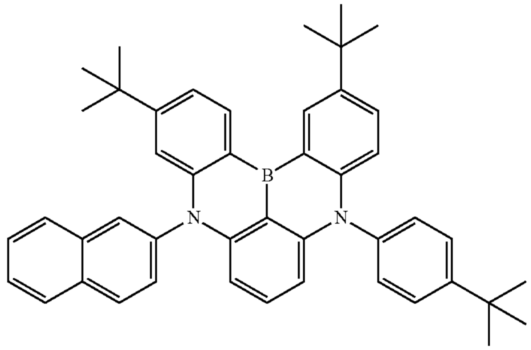
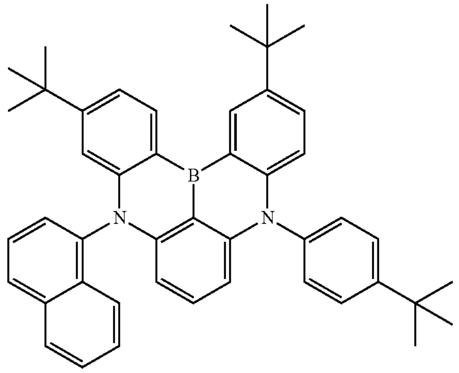
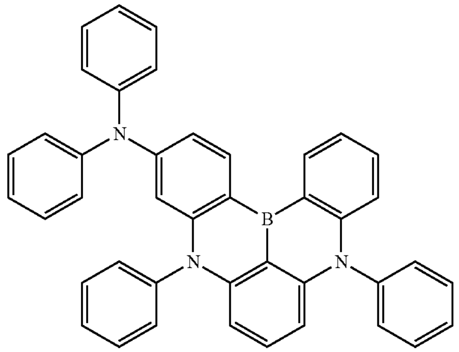
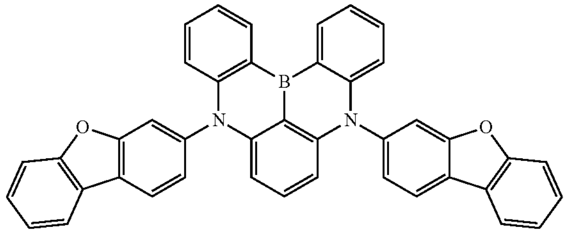
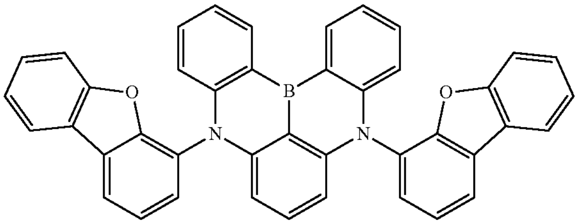

-continued
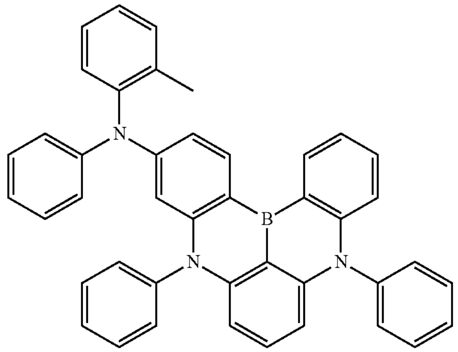
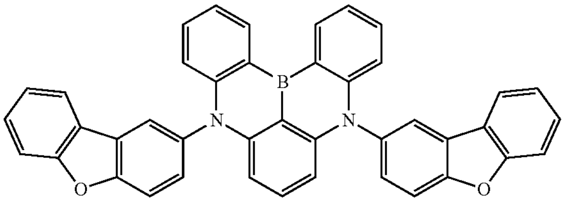
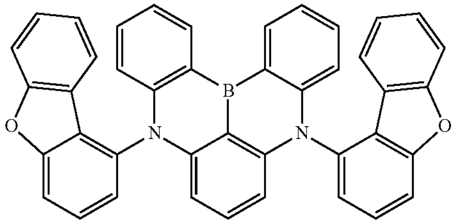
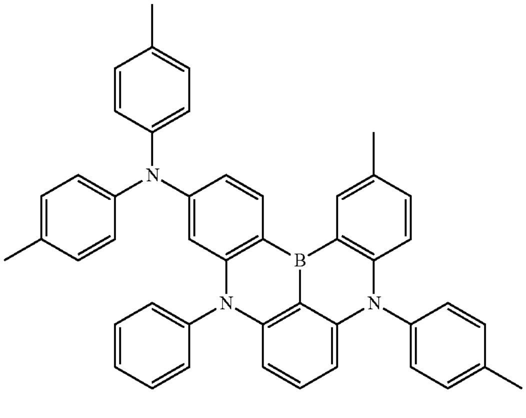
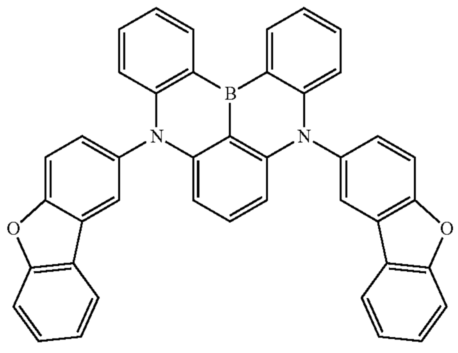
-continued
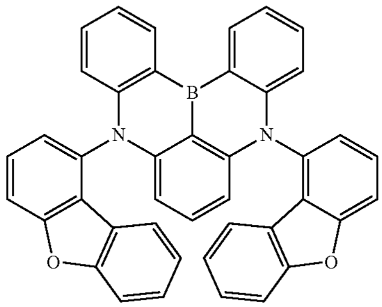
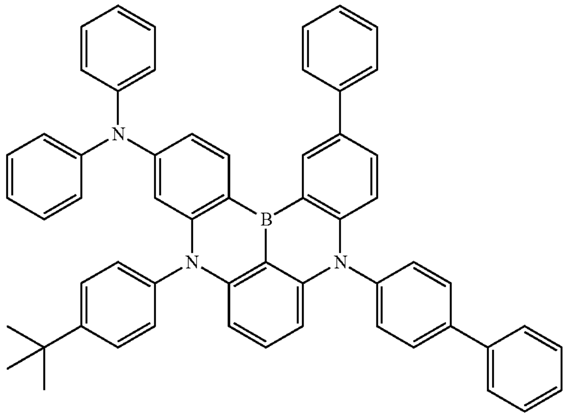
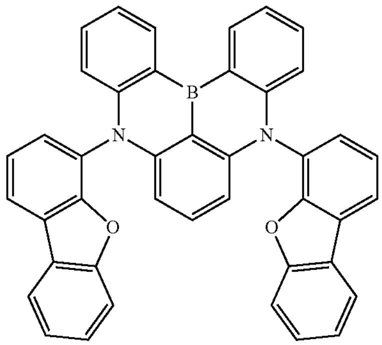
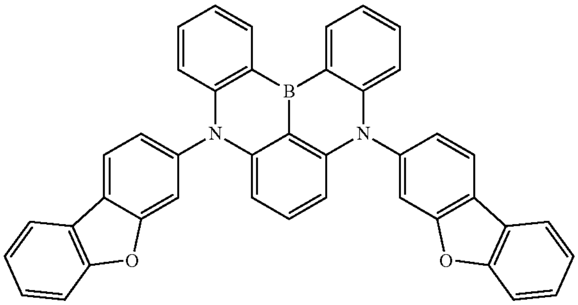
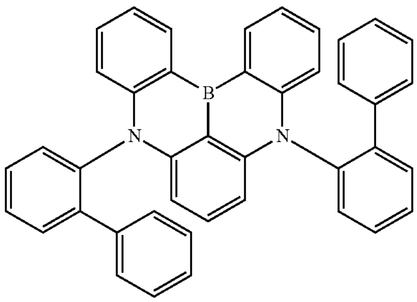

-continued
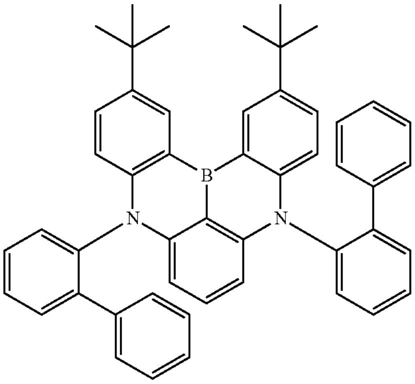
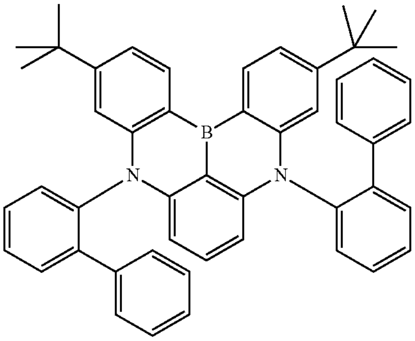
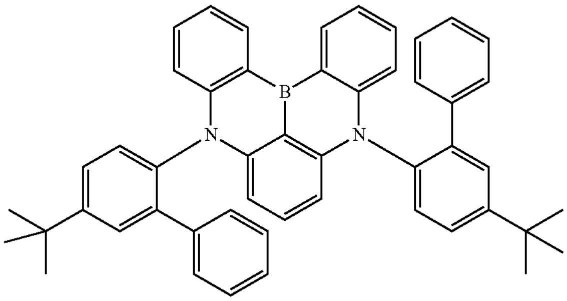
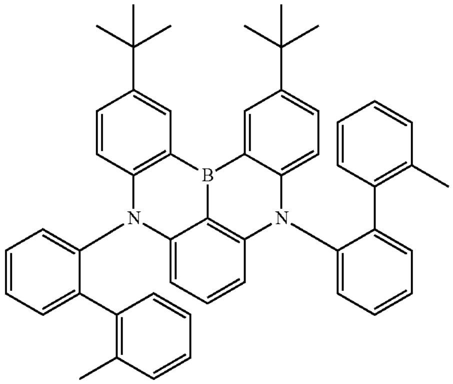
-continued
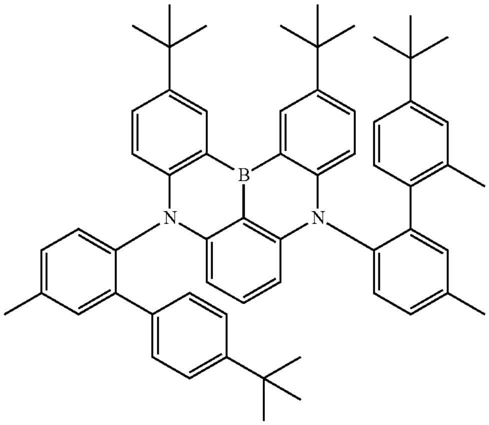
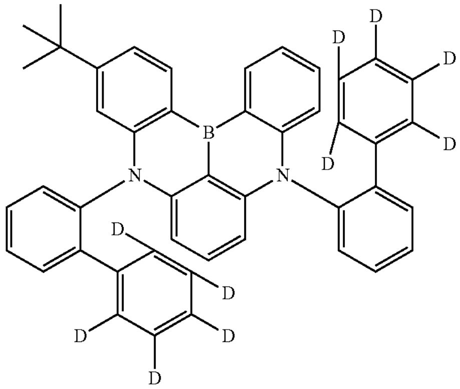
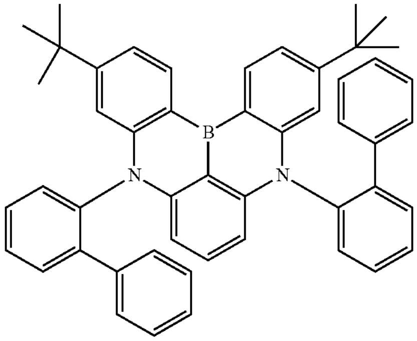
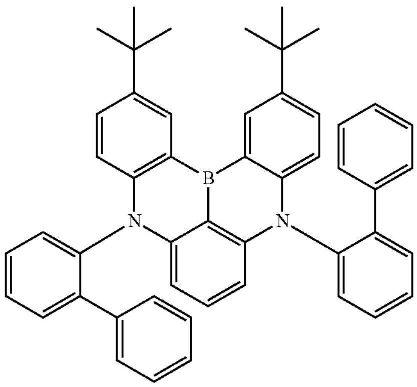

-continued
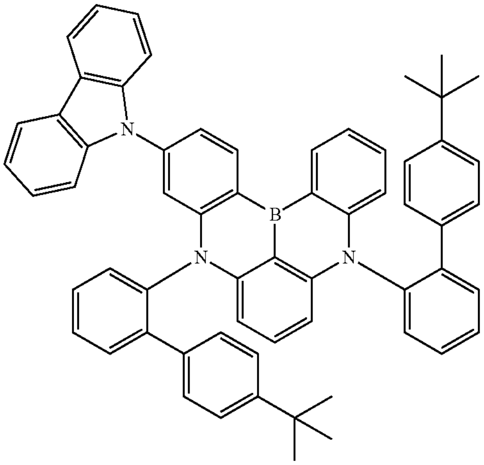
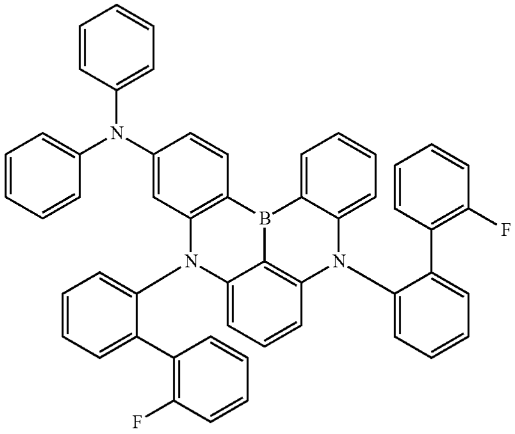
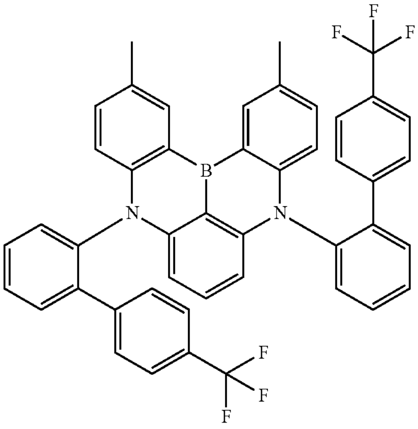
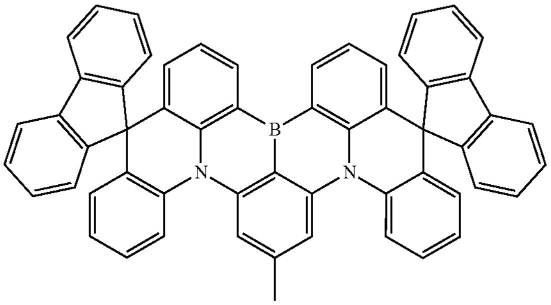
-continued
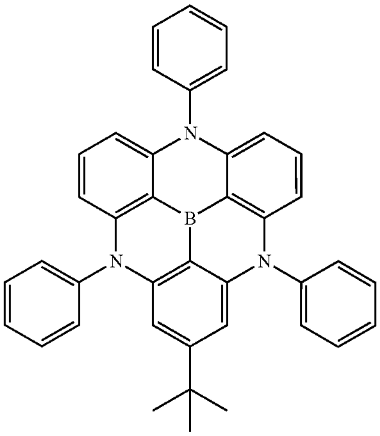
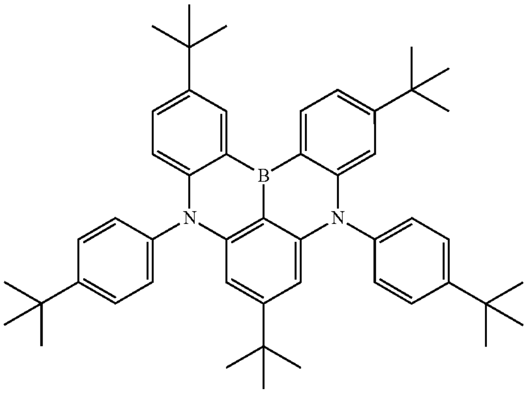
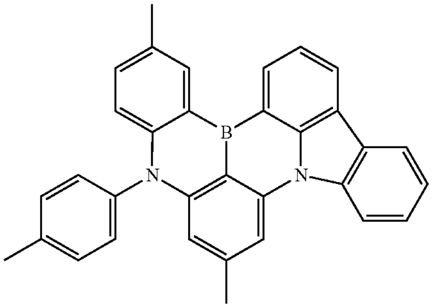
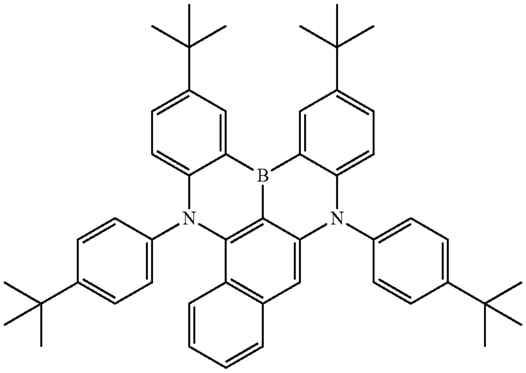

-continued
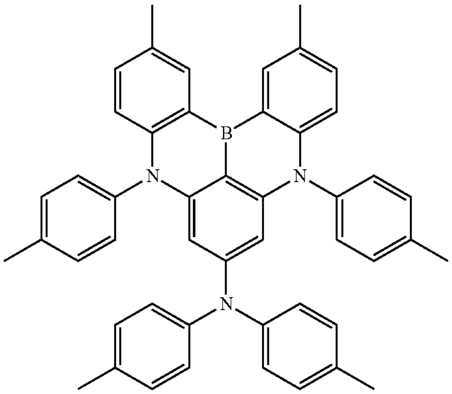
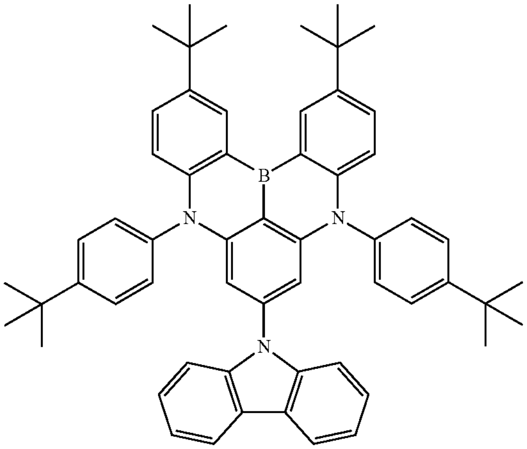
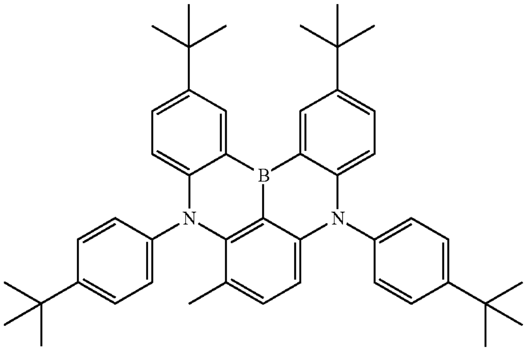
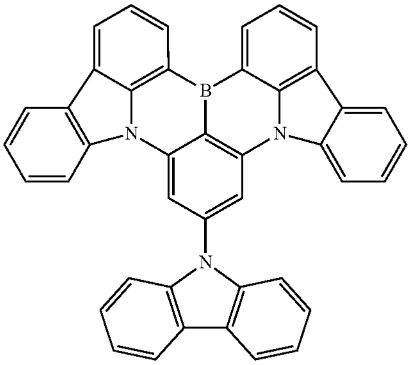
-continued
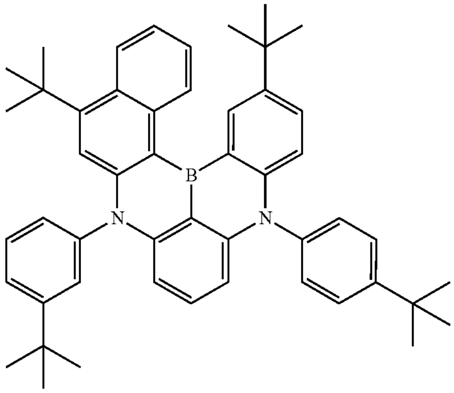
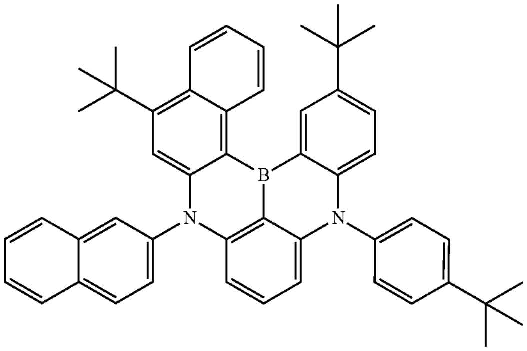
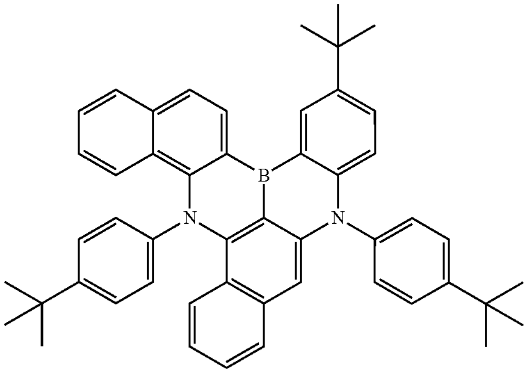
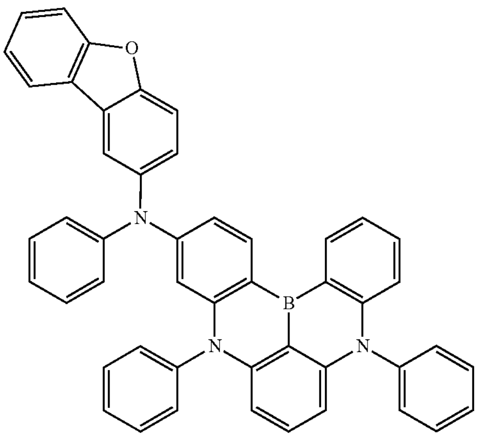

-continued
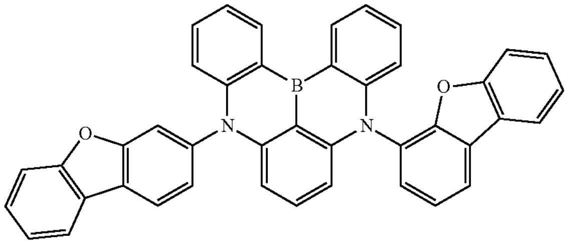
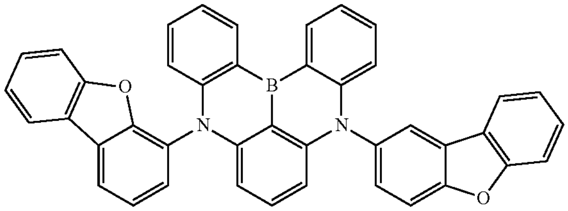
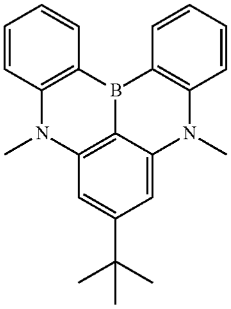
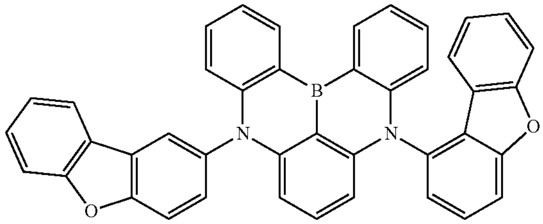
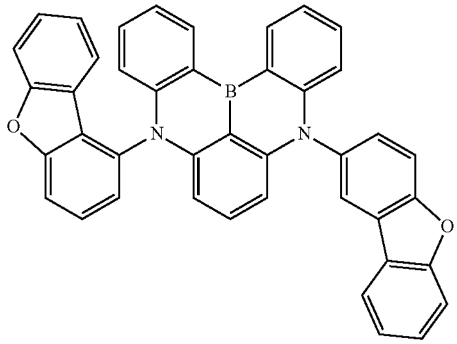
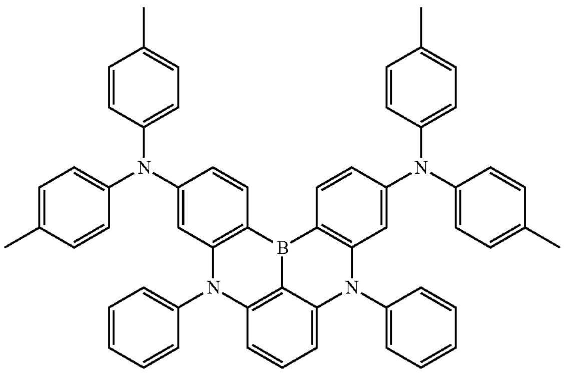
-continued
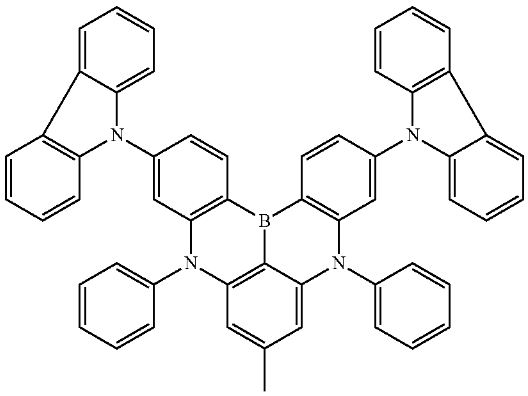
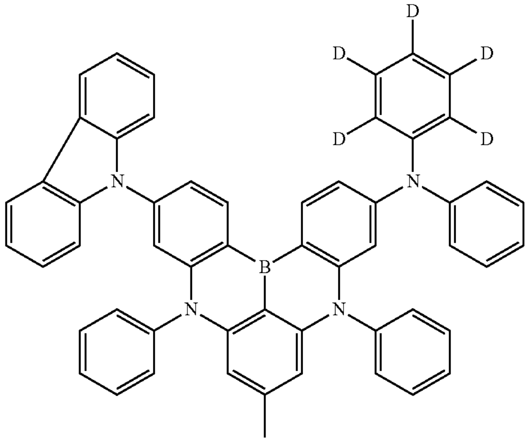
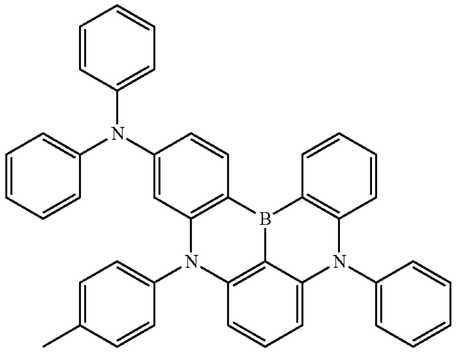
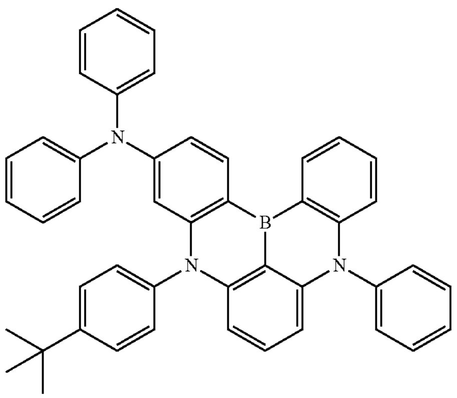

-continued
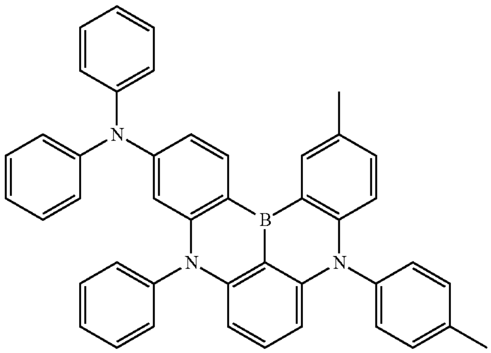
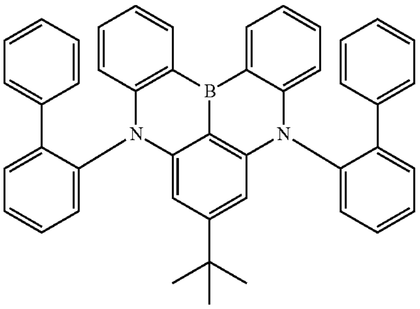
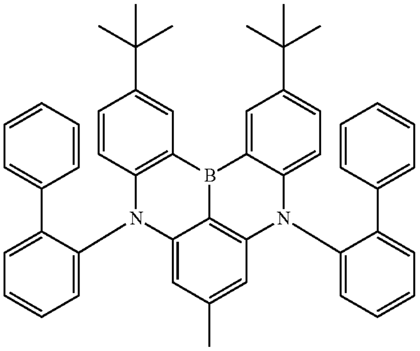
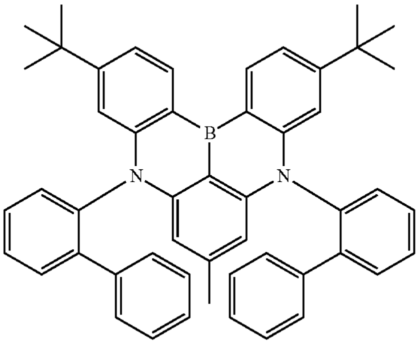
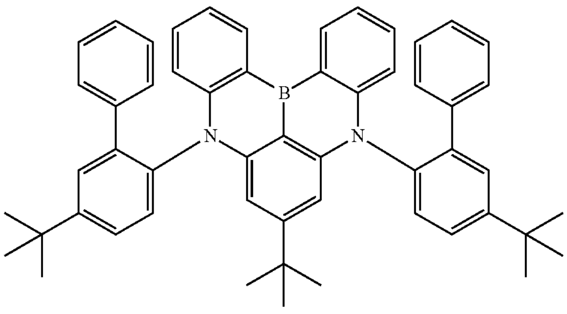
-continued
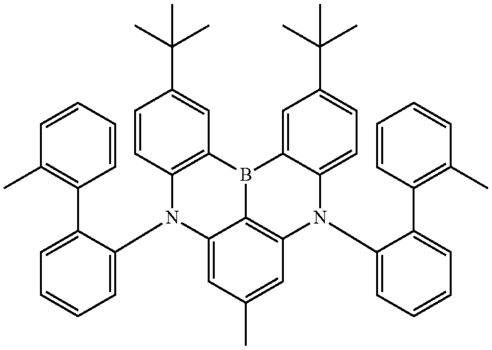
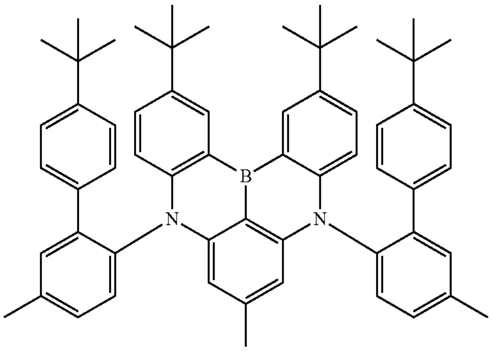
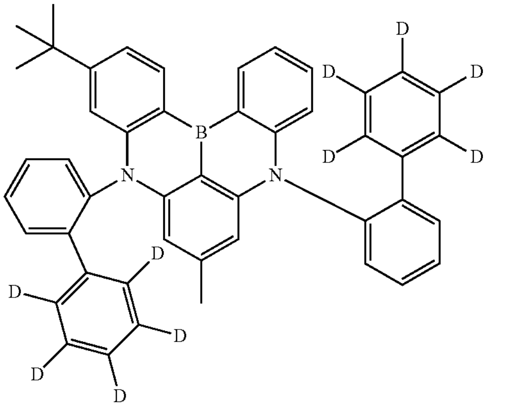
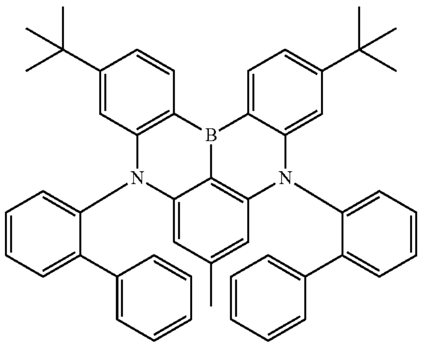

-continued
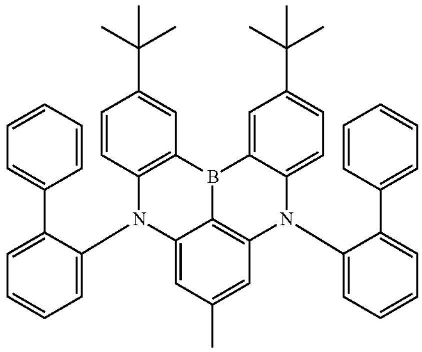
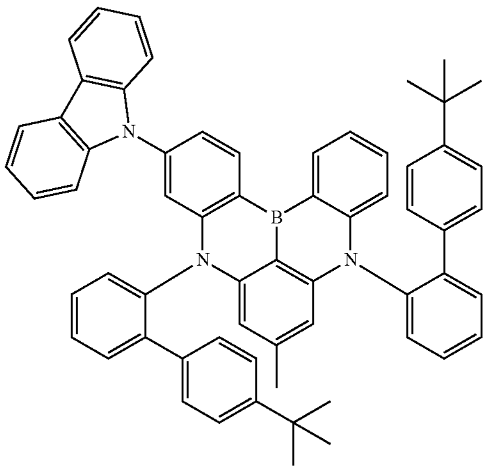
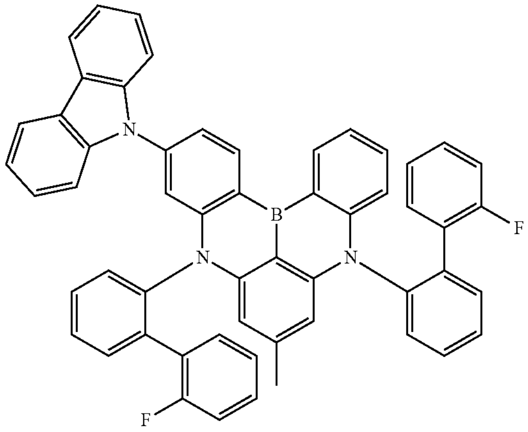
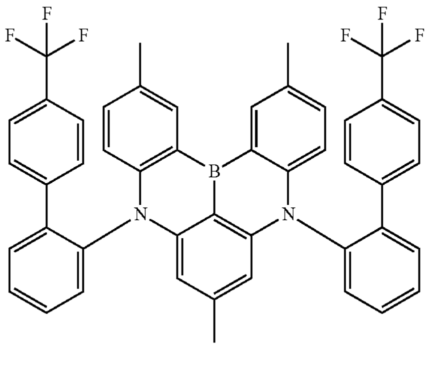
-continued
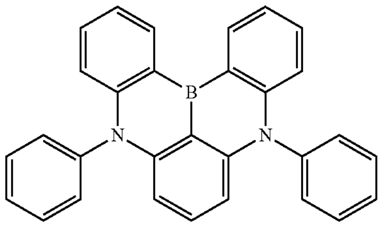
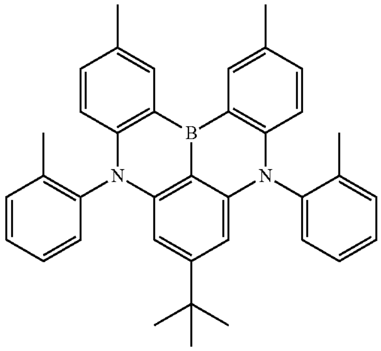
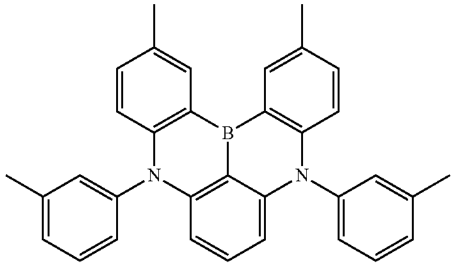
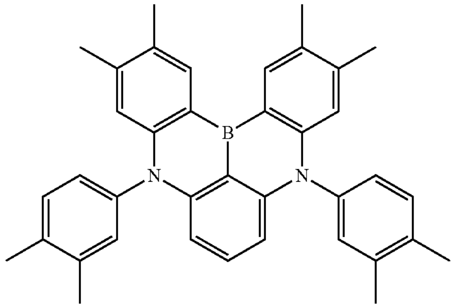
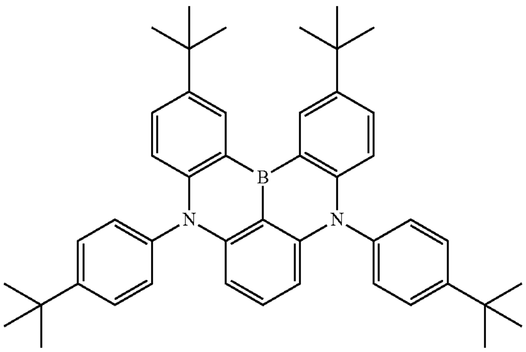

-continued
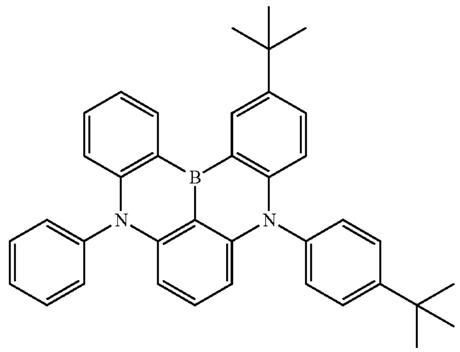
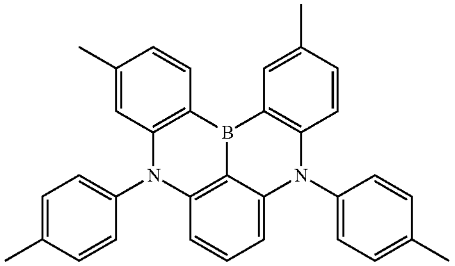
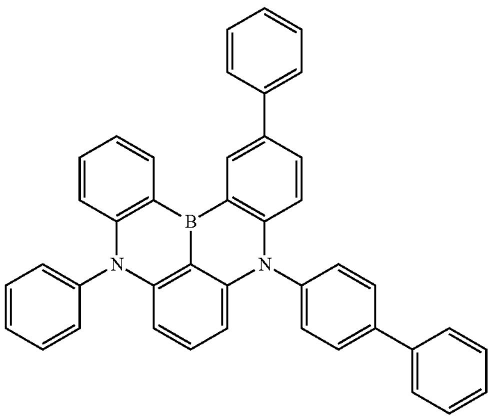
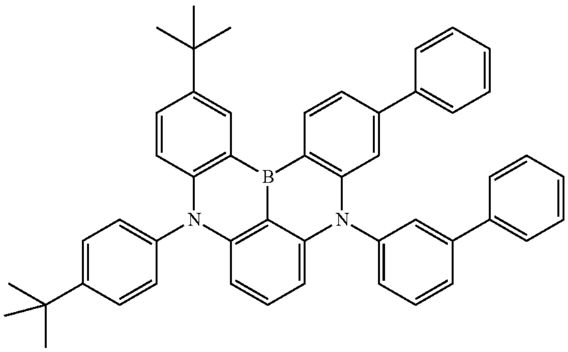
-continued
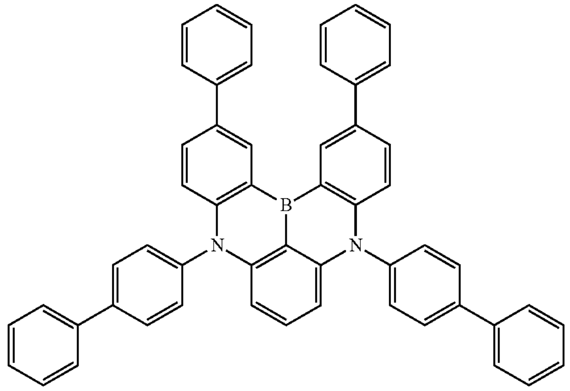
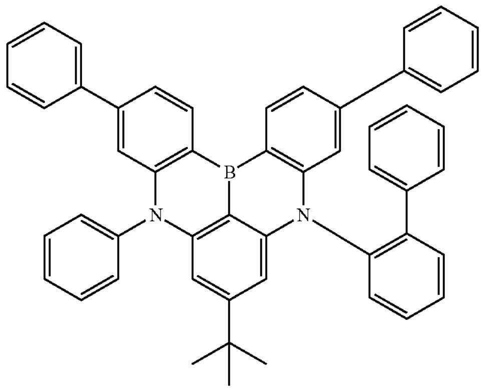
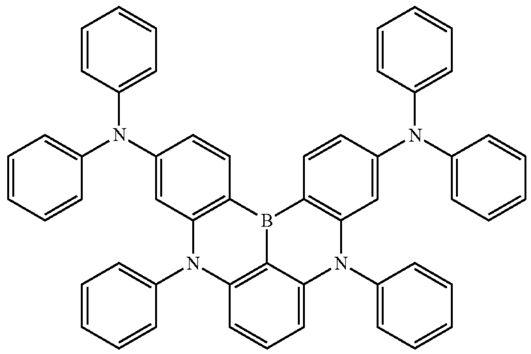
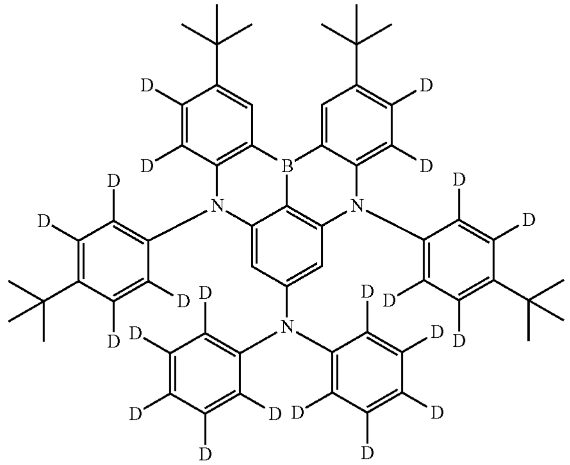

-continued
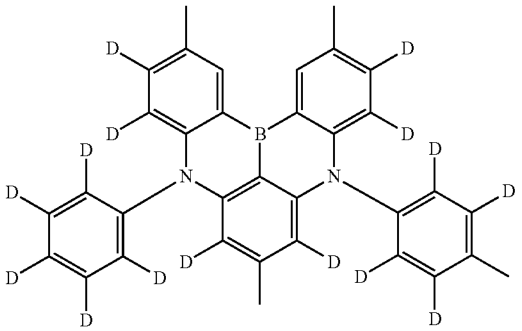
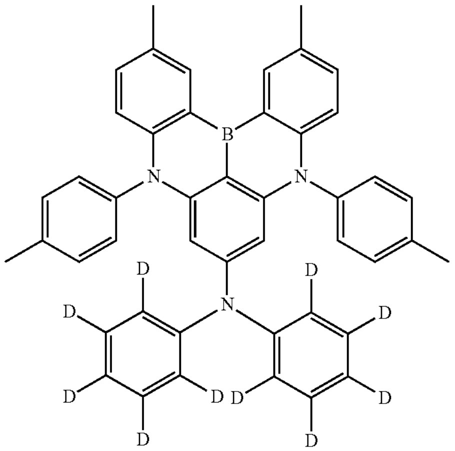
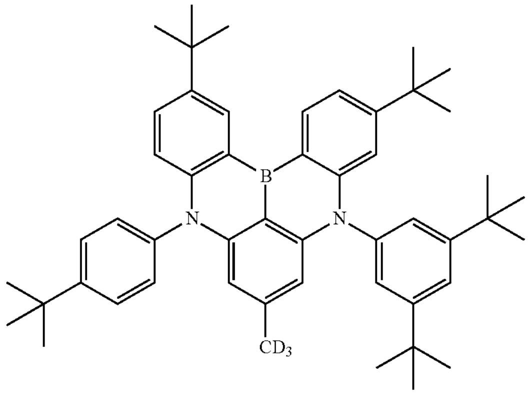
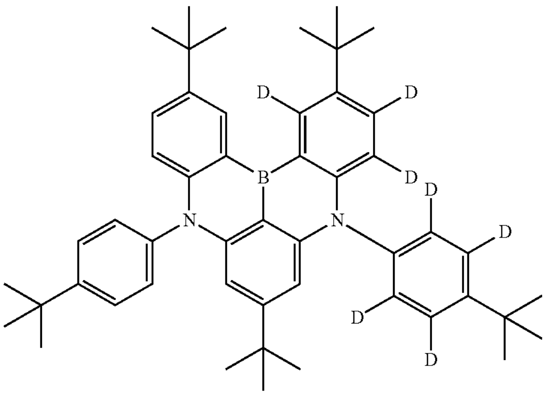
-continued
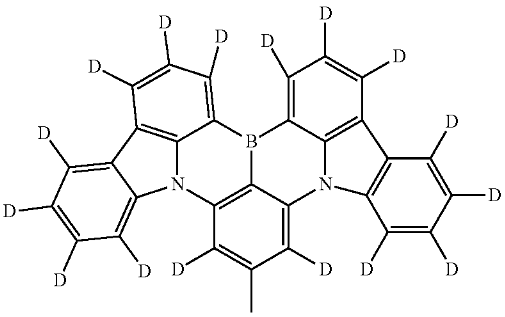
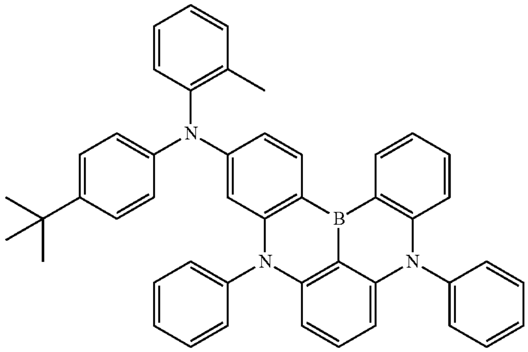
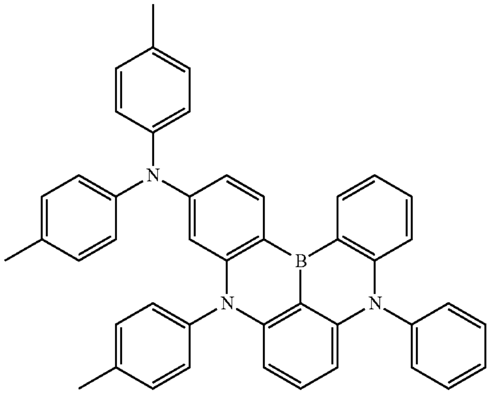
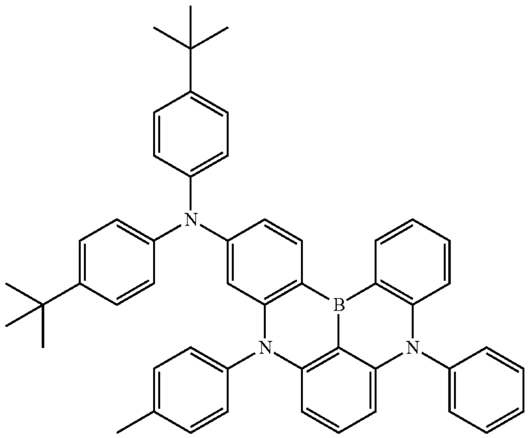

-continued
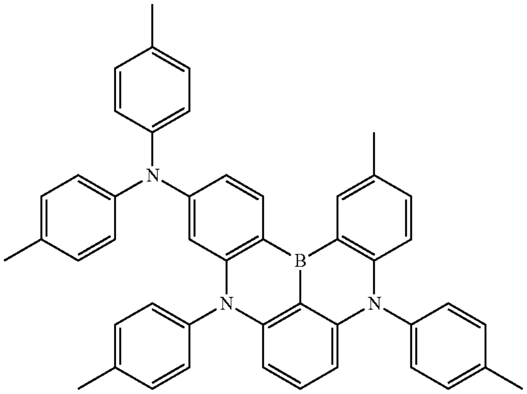
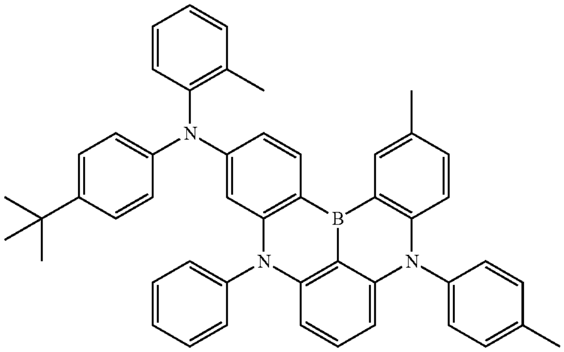
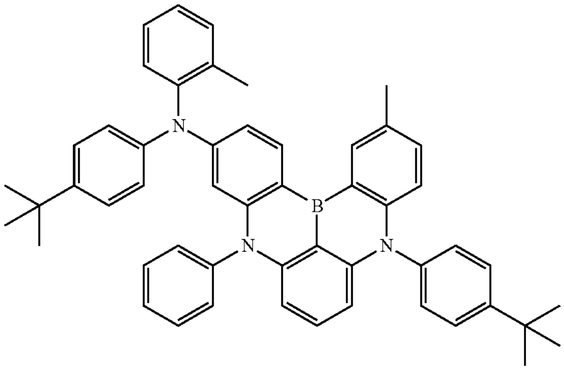
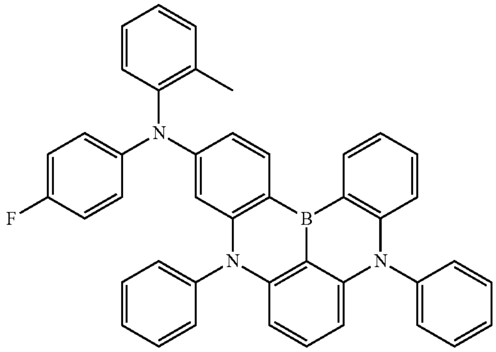
-continued
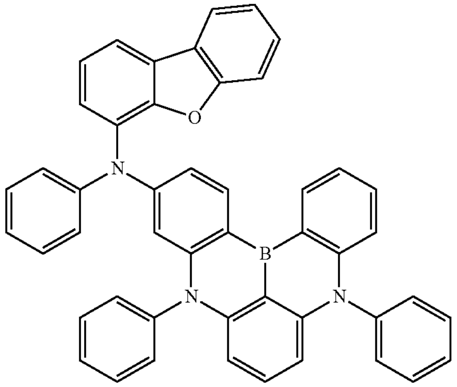
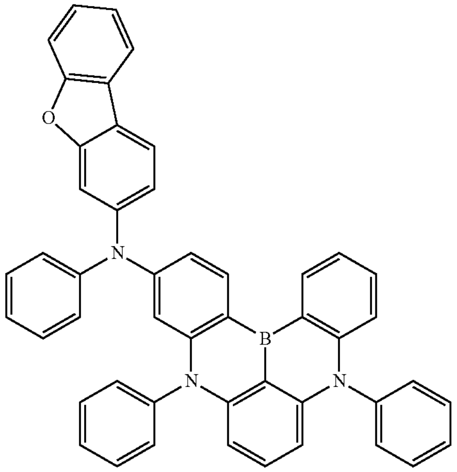
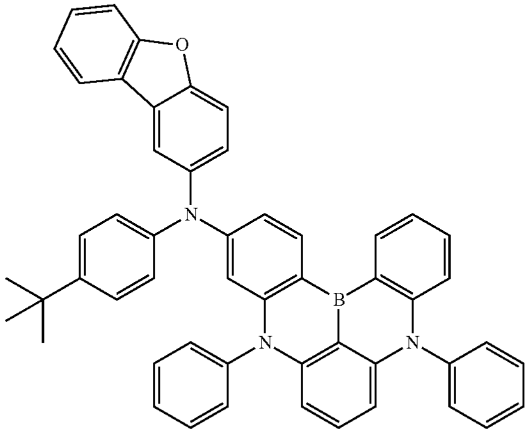
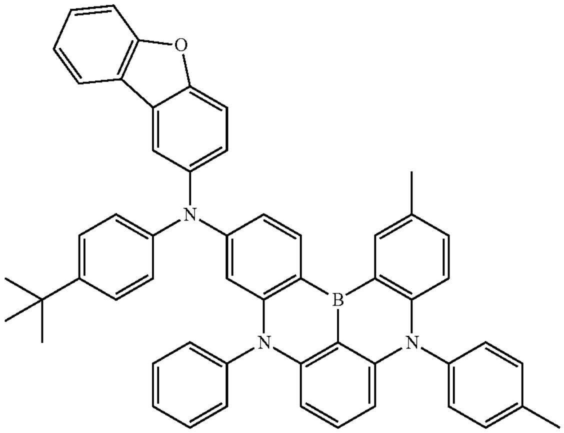

-continued
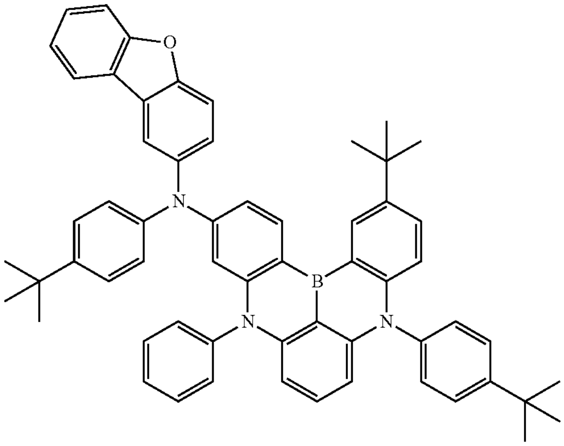
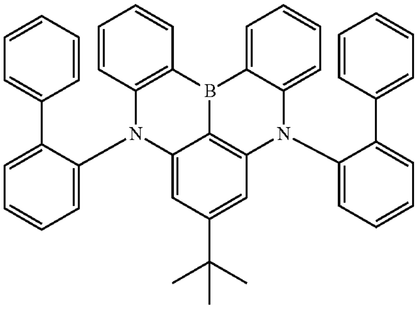
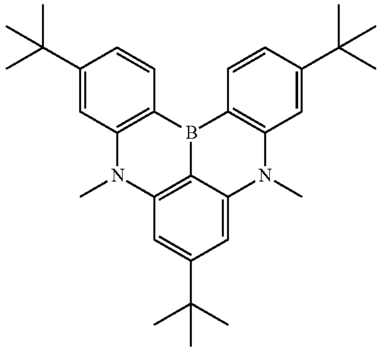
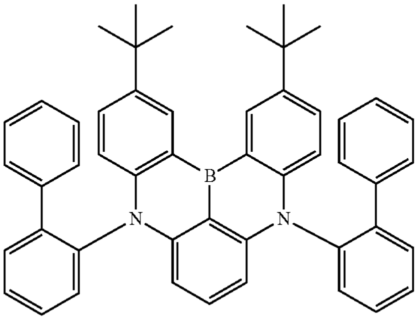
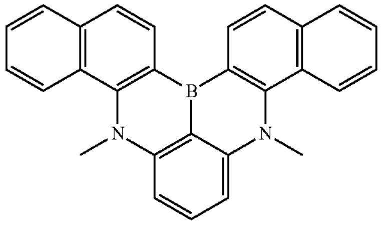
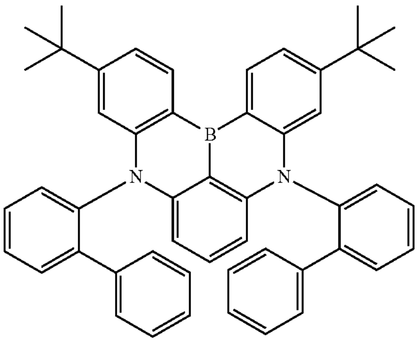
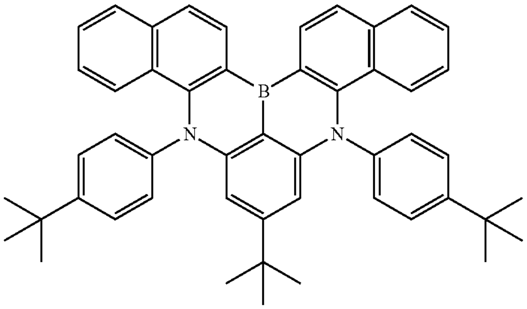
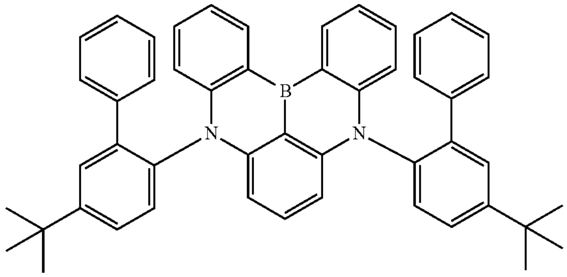
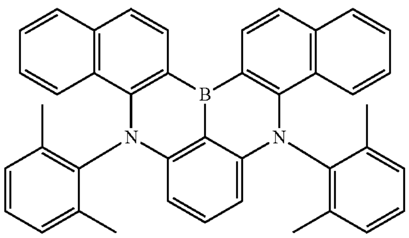
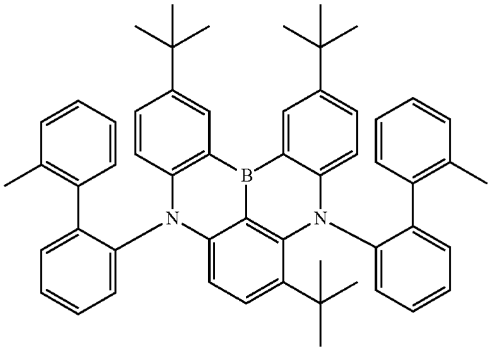

-continued
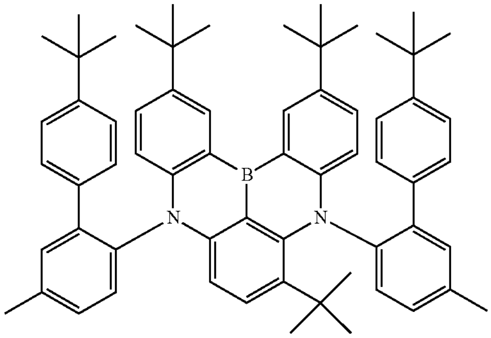
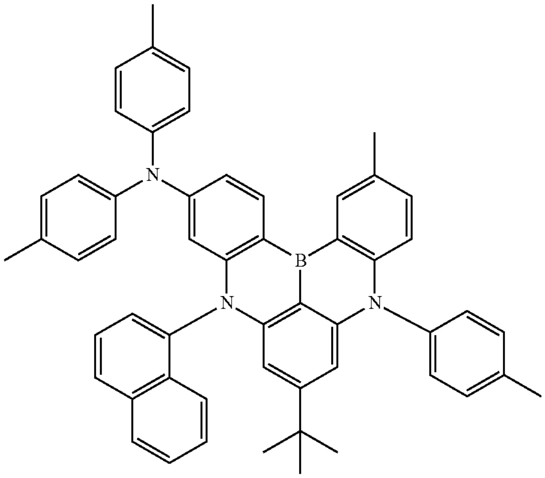
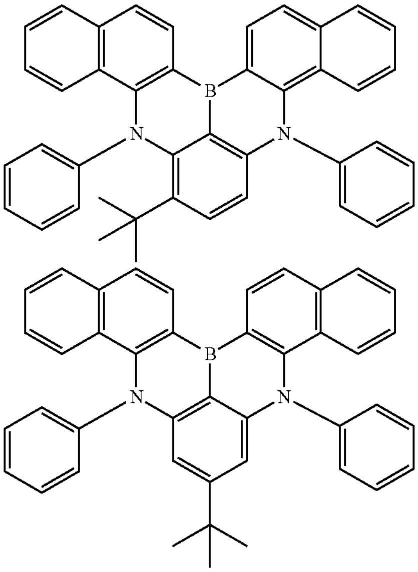
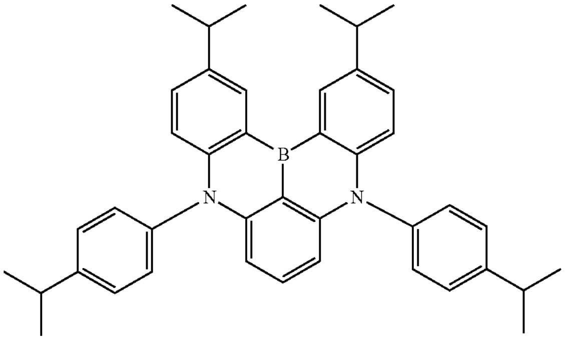
-continued
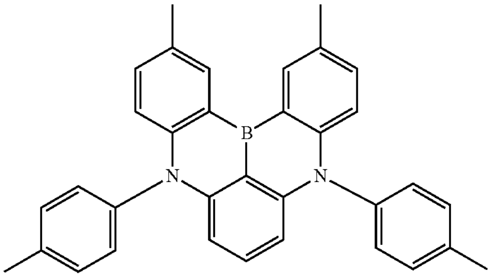
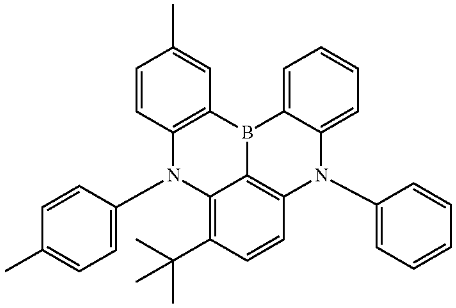
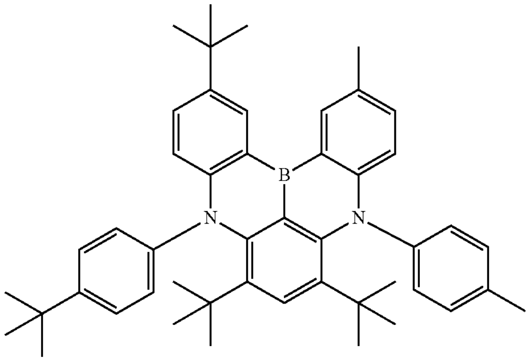
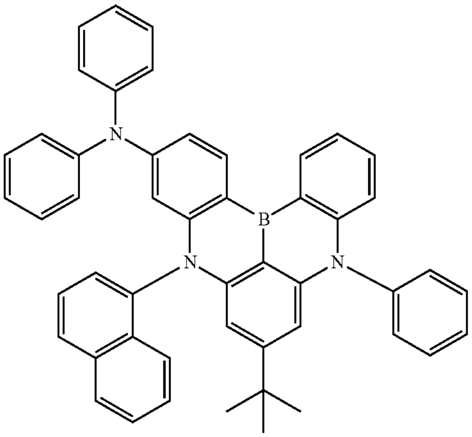

-continued

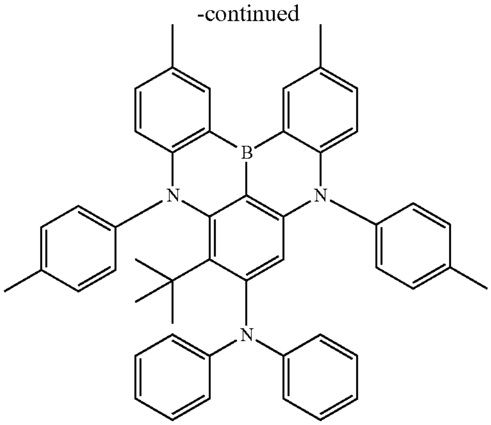

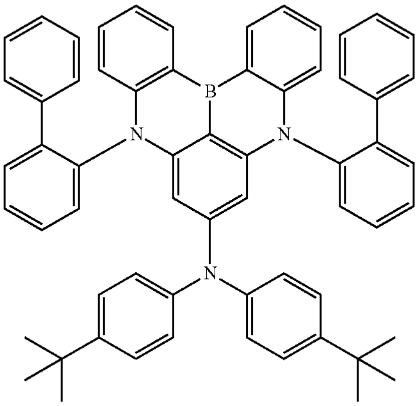

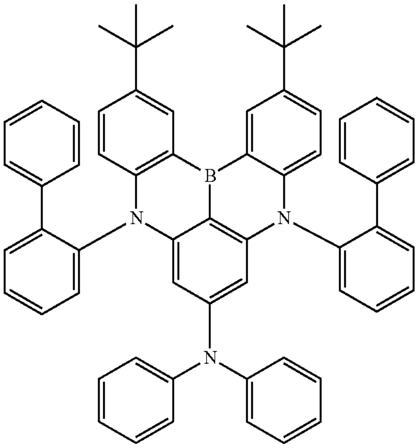

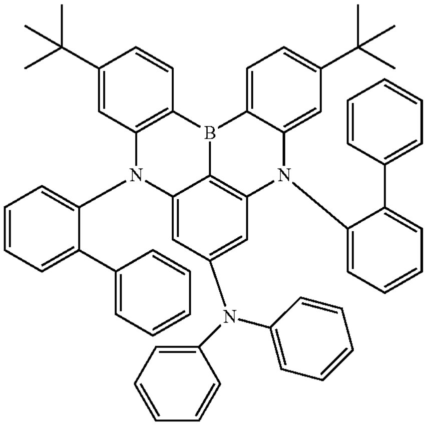

-continued

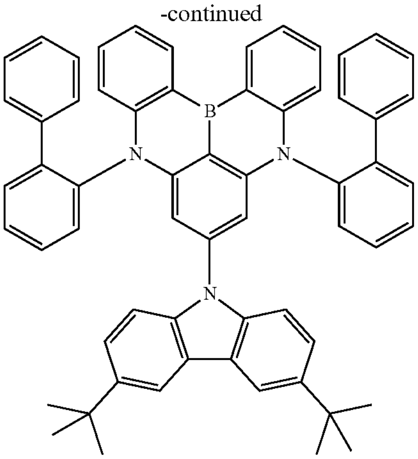

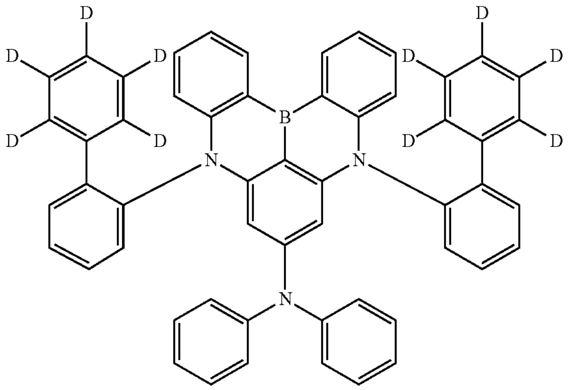

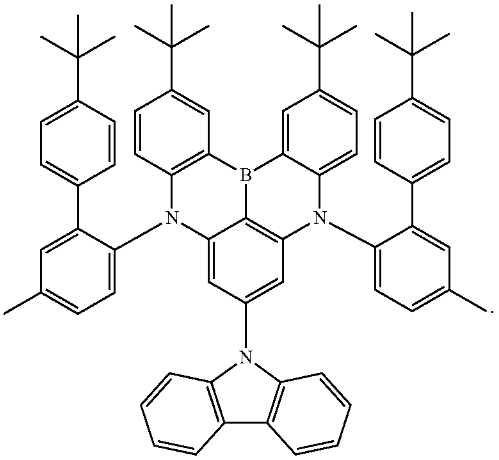

6. The organic light emitting device of claim 1, wherein the compound represented by Formula 2 is comprised in an amount of 1 part by weight to 20 parts by weight based on 100 parts by weight of the compound represented by Formula 1.

7. The organic light emitting device of claim 1, wherein the organic material layer further comprises one or more layers of a hole transport layer, a hole injection layer, an electron blocking layer, an electron transport and injection layer, an electron transport layer, an electron injection layer, a hole blocking layer, and a hole transport and injection layer.

* * * * *